US009940957B2

(12) United States Patent
Yamauchi et al.

(10) Patent No.: US 9,940,957 B2
(45) Date of Patent: Apr. 10, 2018

(54) PRINTED CIRCUIT BOARD AND METHOD OF MANUFACTURING THE SAME

(71) Applicant: Nitto Denko Corporation, Ibaraki-shi, Osaka (JP)

(72) Inventors: Daisuke Yamauchi, Ibaraki (JP); Hiroyuki Tanabe, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 0 days.

(21) Appl. No.: 15/223,241

(22) Filed: Jul. 29, 2016

(65) Prior Publication Data
US 2017/0034909 A1   Feb. 2, 2017

(30) Foreign Application Priority Data

Jul. 31, 2015   (JP) .................................. 2015-152613
Jul. 15, 2016   (JP) .................................. 2016-139880

(51) Int. Cl.
*H05K 1/09*    (2006.01)
*H05K 1/05*    (2006.01)
(Continued)

(52) U.S. Cl.
CPC ............ *G11B 5/4833* (2013.01); *G11B 5/484* (2013.01); *H05K 1/09* (2013.01); *H05K 1/111* (2013.01);
(Continued)

(58) Field of Classification Search
CPC .. H05K 1/0298; H05K 3/4644; H05K 1/0346; H05K 1/09; H05K 1/0237; H05K 2201/0154; G11B 5/4833
See application file for complete search history.

(56) References Cited

U.S. PATENT DOCUMENTS

2008/0136033 A1*  6/2008  Nagamatsu ........... H01L 23/295
                                                   257/758
2008/0185177 A1*  8/2008  Chou ..................... H05K 3/242
                                                   174/262

(Continued)

FOREIGN PATENT DOCUMENTS

JP    2011096721 A    5/2011
JP    2012235013 A    11/2012
(Continued)

*Primary Examiner* — Ishwarbhai B Patel
(74) *Attorney, Agent, or Firm* — Panitch Schwarze Belisario & Nadel LLP

(57) ABSTRACT

A conductor trace is formed on a base insulating layer. The conductor trace includes two terminal portions and one wiring portion. The wiring portion is formed to connect the two terminal portions to each other and extend from each terminal portion. A metal cover layer is formed to cover the terminal portion and the wiring portion of the conductor trace and continuously extend from a surface of the terminal portion to a surface of the wiring portion. The metal cover layer is made of metal having magnetism lower than magnetism of nickel, and is made of gold, for example. A cover insulating layer is formed on the base insulating layer to cover a portion, of the metal cover layer formed on the conductor trace, covering the wiring portion and not to cover a portion of the metal cover layer covering the terminal portion.

11 Claims, 39 Drawing Sheets

(51) Int. Cl.
  *G11B 5/48* (2006.01)
  *H05K 1/11* (2006.01)
  *H05K 3/24* (2006.01)
  *H05K 3/38* (2006.01)
(52) U.S. Cl.
  CPC ............ *H05K 3/244* (2013.01); *H05K 1/056* (2013.01); *H05K 3/388* (2013.01); *H05K 2201/0341* (2013.01); *H05K 2201/0347* (2013.01); *H05K 2201/05* (2013.01); *Y02P 70/611* (2015.11)

(56) References Cited

U.S. PATENT DOCUMENTS

| | | |
|---|---|---|
| 2012/0279757 A1 | 11/2012 | Ishii et al. |
| 2014/0126169 A1 | 5/2014 | Ihara et al. |
| 2014/0345920 A1* | 11/2014 | Ihara .................... H05K 3/3405 174/257 |
| 2015/0027752 A1* | 1/2015 | Takakura ............... H05K 1/118 174/251 |
| 2015/0181695 A1 | 6/2015 | Ichinose et al. |
| 2015/0382451 A1 | 12/2015 | Tanabe et al. |

FOREIGN PATENT DOCUMENTS

| | | |
|---|---|---|
| JP | 2014-096423 A | 5/2014 |
| JP | 2015026662 A | 2/2015 |
| JP | 2015118721 A | 6/2015 |
| JP | 2016012706 A | 1/2016 |

\* cited by examiner

F I G. 17A
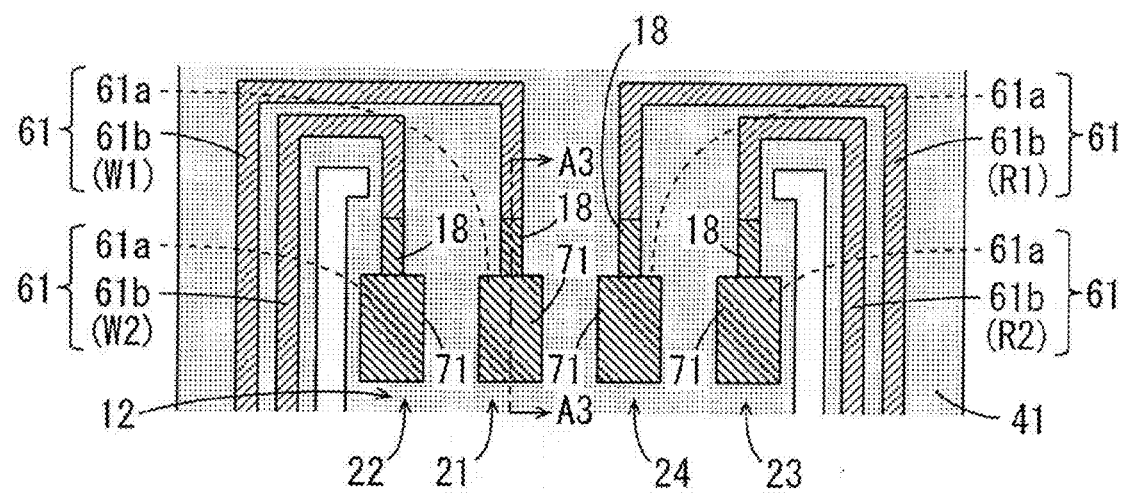
F I G. 17B
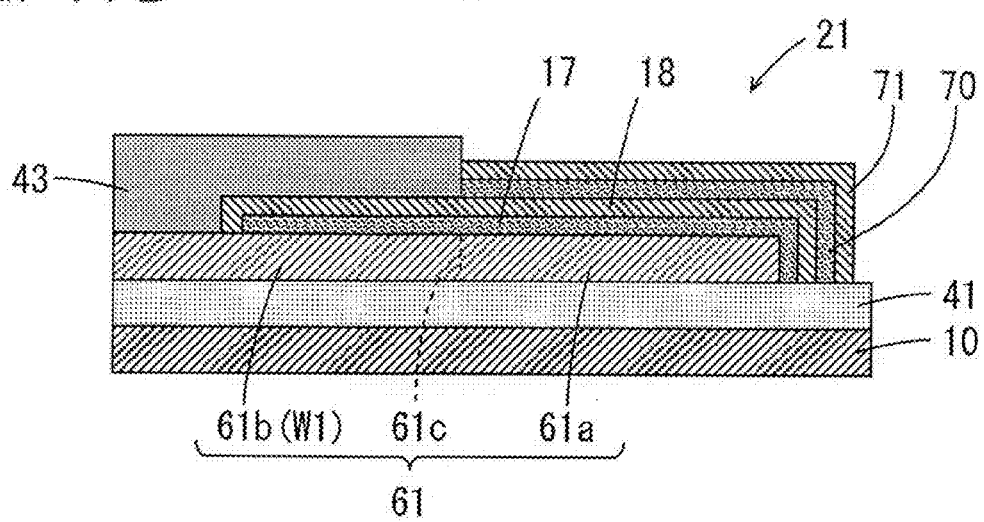

F I G. 2 0 A
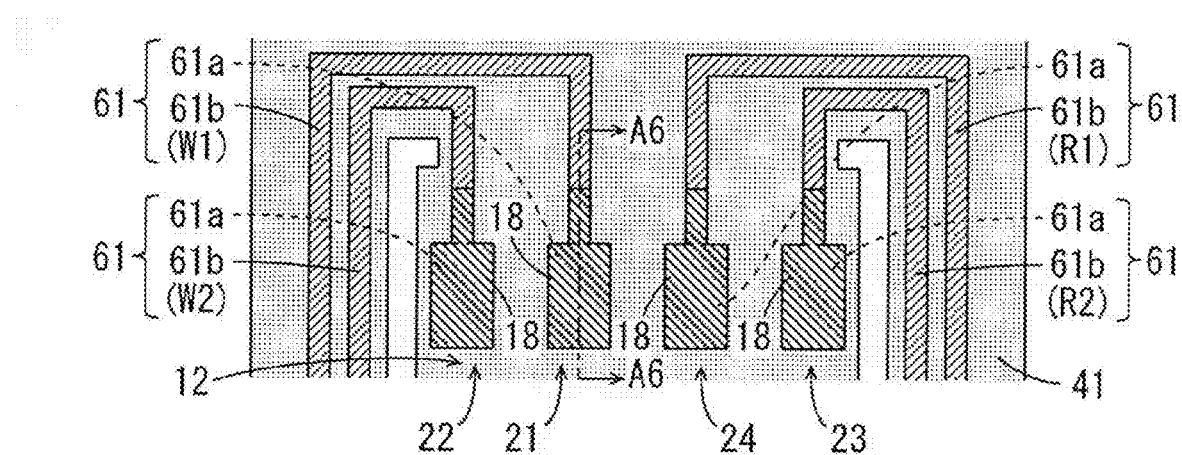
F I G. 2 0 B
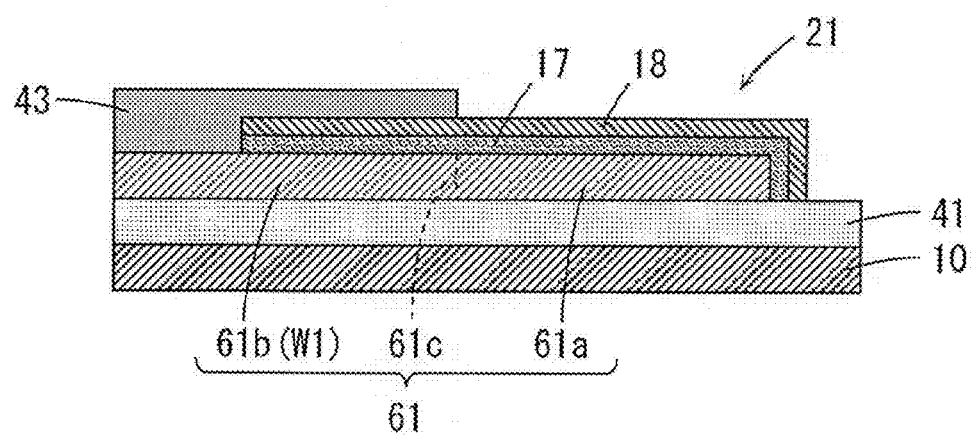

F I G. 2 4 A
F I G. 2 4 B
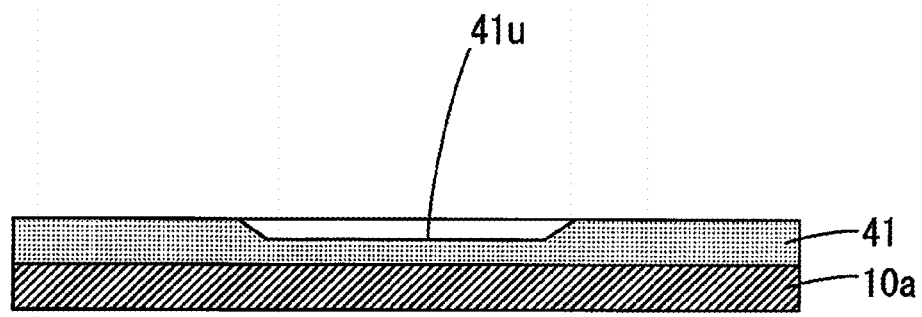
F I G. 2 4 C
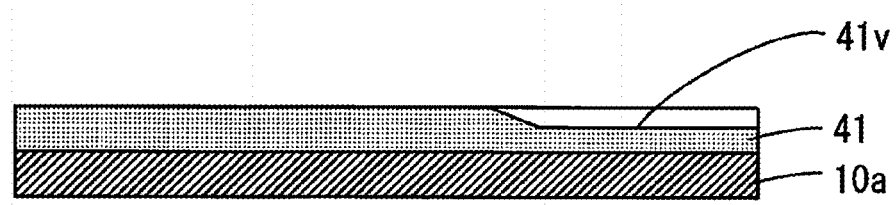

F I G. 2 5 A
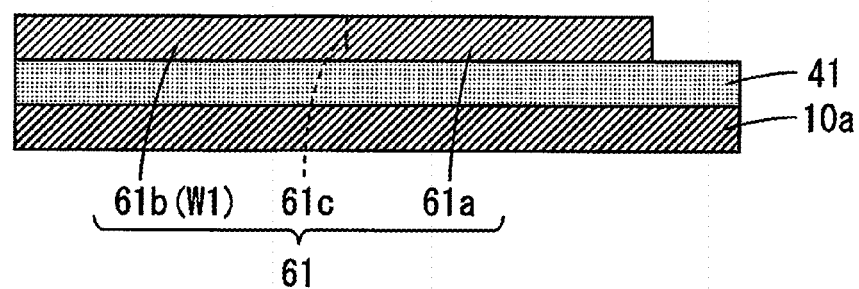
F I G. 2 5 B
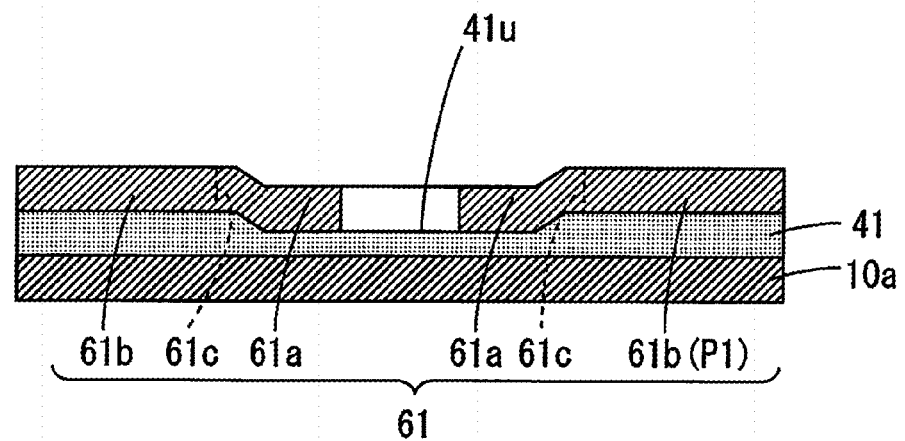
F I G. 2 5 C
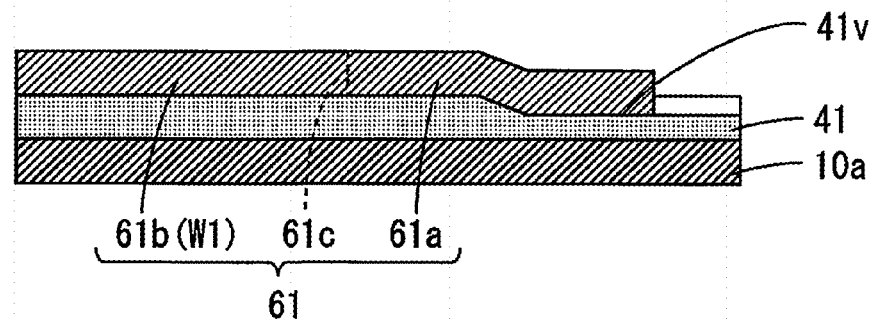

PRINTED CIRCUIT BOARD AND METHOD OF MANUFACTURING THE SAME

BACKGROUND OF THE INVENTION

Field of the Invention

The present invention relates to a printed circuit board and a method of manufacturing the printed circuit board.

Description of Related Art

Conventionally, printed circuit boards have been used for various types of electric appliances or electronic appliances. In JP 2012-235013 A, a suspension board having a circuit is shown as a printed circuit board used for positioning a magnetic head in a magnetic disc device.

In the printed circuit board described in JP 2012-235013 A, an insulative base layer is formed on a conductive support substrate. A conductor trace is formed on the base layer. A metal film is formed on a surface of the conductor trace by electroless nickel plating. A cover layer is formed to cover the conductor trace on which the metal film is formed. A connection terminal is formed at an end portion of the conductor circuit trace to be exposed from the cover layer.

BRIEF SUMMARY OF THE INVENTION

In the above-mentioned printed circuit board, adhesion between the conductor trace and the cover layer is improved by formation of the metal film on the surface of the conductor trace. Thus, corrosion of the conductor trace is prevented. However, in the printed circuit board described in JP 2012-235013 A, a transmission loss of an electrical signal in a high frequency band is high.

An object of the present invention is to provide a printed circuit board in which a transmission loss of an electrical signal is reduced in a high frequency band while corrosion of a conductor trace is prevented, and a method of manufacturing the printed circuit board.

As a result of various experiments and consideration, the inventors of the present application have discovered that a transmission loss of an electrical signal could be reduced in a high frequency band by absence of a metal layer having magnetism as high as or higher than magnetism of nickel between a portion of the conductor trace constituting a wire (hereinafter referred to as a wiring portion) and an insulating layer covering the wiring portion, and hit upon the below-mentioned invention.

Further, the inventors of present application discovered that, even in the case where the metal layer having the magnetism as high as or higher than the magnetism of nickel was present between the wiring portion and the insulating layer covering the wiring portion, a transmission loss of an electrical signal could be reduced in a high frequency band by setting of a ratio of the length of the metal layer to a total length of the wiring portion to 40% or less, and hit upon the below-mentioned invention.

(1) A printed circuit board according to one aspect of the present invention includes a first insulating layer, a conductor trace that is formed on the first insulating layer and has a terminal portion and a wiring portion extending from the terminal portion, a first metal cover layer provided to cover the wiring portion and the terminal portion and continuously extend from a surface of the terminal portion to a surface of the wiring portion, and a second insulating layer provided on the first insulating layer to cover a portion of the first metal cover layer covering the wiring portion and not to cover a portion of the first metal cover layer covering the terminal portion, wherein the first metal cover layer comes into contact with the wiring portion, the second insulating layer comes into contact with the portion of the first metal cover layer covering the wiring portion, and the first metal cover layer has magnetism lower than magnetism of nickel.

In the printed circuit board, the first metal cover layer is provided to cover the wiring portion, and the second insulating layer is provided to cover the portion of the first metal cover layer covering the wiring portion. The first metal cover layer comes into contact with the wiring portion, and the second insulating layer comes into contact with the portion of the first metal cover layer covering the wiring portion. In this case, a layer having the magnetism as high as or higher than the magnetism of nickel is not present between the wiring portion and the second insulating layer. Thus, a transmission loss of an electrical signal can be reduced in a high frequency band.

Further, the second insulating layer comes into contact with the portion of the first metal cover layer covering the wiring portion, whereby adhesion between the second insulating layer and the wiring portion is improved. Further, the first metal cover layer is formed to continuously extend from the surface of the terminal portion to the surface of the wiring portion. Thus, entry of fluid such as air, water or a chemical liquid to the inside the first metal cover layer from outside of the second insulating layer is prevented. Therefore, an occurrence of corrosion at a boundary between the terminal portion and the wiring portion of the conductor trace, and its vicinity is prevented.

(2) A printed circuit board according to another aspect of the present invention includes a first insulating layer, a conductor trace that is formed on the first insulating layer and has a terminal portion and a wiring portion extending from the terminal portion, a first metal cover layer provided to cover the terminal portion and part of the wiring portion and continuously extend from a surface of the terminal portion to a surface of the wiring portion, a second insulating layer provided on the first insulating layer to cover a portion of the first metal cover layer covering the part of the wiring portion and another portion of the wiring portion not covered by the first metal cover layer, and not to cover a portion of the first metal cover layer covering the terminal portion, wherein the first metal cover layer comes into contact with the part of the wiring portion and extends on the surface of the wiring portion to a position at a distance of 3 μm or more from a position over a boundary between the terminal portion and the wiring portion, the second insulating layer comes into contact with the portion of the first metal cover layer covering the wiring portion, and comes into contact with the other portion of the wiring portion, and the first metal cover layer has magnetism lower than magnetism of nickel.

In the printed circuit board, the first metal cover layer is provided to cover the terminal portion and the part of the wiring portion, and the second insulating layer is provided to cover the portion of the first metal cover layer covering the part of the wiring portion and the other portion of the wiring portion not covered by the first metal cover layer. The first metal cover layer comes into contact with the part of the wiring portion, and the second insulating layer comes into contact with the portion of the first metal cover layer covering the wiring portion and comes into contact with the other portion of the wiring portion. In this case, a layer having the magnetism as high as or higher than the magnetism of nickel is not present between the wiring portion and the second insulating layer. Thus, a transmission loss of an electrical signal can be reduced in a high frequency band.

Further, the second insulating layer comes into contact with the portion of the first metal cover layer covering the wiring portion, and the first metal cover layer extends on the surface of the wiring portion to the position at the distance of 3 μm or more from the position over the boundary between the terminal portion and the wiring portion. Thus, adhesion between the second insulating layer and the wiring portion is improved in the vicinity of the boundary between the terminal portion and the wiring portion of the conductor trace. Further, the first metal cover layer is formed to continuously extend from the surface of the terminal portion to the surface of the wiring portion. Thus, entry of fluid such as air, water or a chemical liquid to the inside of the first metal cover layer from outside of the second insulating layer is prevented. Therefore, an occurrence of corrosion at the boundary between the terminal portion and the wiring portion of the conductor trace, and its vicinity is prevented.

(3) A printed circuit board according to yet another aspect of the present invention includes a first insulating layer, a conductor trace that is formed on the first insulating layer and has a terminal portion and a wiring portion extending from the terminal portion, a first metal cover layer provided to cover the terminal portion and part of the wiring portion and continuously extend from a surface of the terminal portion to a surface of the wiring portion; and a second insulating layer provided on the first insulating layer to cover a portion of the first metal cover layer covering the part of the wiring portion and another portion of the wiring portion not covered by the first metal cover layer, and not to cover a portion of the first metal cover layer covering the terminal portion, wherein the first metal cover layer comes into contact with the part of the wiring portion and extends on the surface of the wiring portion to a position at a distance of 3 μm or more from a position over a boundary between the terminal portion and the wiring portion, the second insulating layer comes into contact with the portion of the first metal cover layer covering the wiring portion, and comes into contact with the other portion of the wiring portion, and a ratio of a length of the first metal cover layer covering the part of the wiring portion to a total length of the wiring portion is 40% or less.

In the printed circuit board, the first metal cover layer is provided to cover the terminal portion and the part of the wiring portion, and the second insulating layer is provided to cover the portion of the first metal cover layer covering the part of the wiring portion and the other portion of the wiring portion not covered by the first metal cover layer. The first metal cover layer comes into contact with the part of the wiring portion, and the second insulating layer comes into contact with the portion of the first metal cover layer covering the wiring portion, and comes into contact with the other portion of the wiring portion.

The ratio of the length of the first metal cover layer covering the part of the wiring portion to the total length of the wiring portion is 40% or less. In this case, in a range of the length of 60% or more of the total length of the wiring portion, a layer having the magnetism as high as or higher than the magnetism of nickel is not present between the wiring portion and the second insulating layer. Thus, a transmission loss of an electrical signal can be reduced in a high frequency band.

Further, the second insulating layer comes into contact with the portion of the first metal cover layer covering the wiring portion, and the first metal cover layer extends on the surface of the wiring portion to the position at the distance of 3 μm or more from the position over the boundary between the terminal portion and the wiring portion. Thus, in the vicinity of the boundary between the terminal portion and wiring portion of the conductor trace, adhesion between the second insulating layer and the wiring portion is improved. Further, the first metal cover layer is formed to continuously extend from the surface of the terminal portion to the surface of the wiring portion. Thus, entry of fluid such as air, water or a chemical liquid to the inside of the first metal cover layer from outside of the second insulating layer is prevented. Therefore, an occurrence of corrosion at the boundary between the terminal portion and the wiring portion of the conductor trace, and its vicinity is prevented.

(4) The first metal cover layer may extend on the surface of the wiring portion to a position at a distance of 5 μm or more from the position over the boundary between the terminal portion and the wiring portion.

In this case, adhesion between the second insulating layer and the wiring portion is improved more sufficiently in the vicinity of the boundary between the terminal portion and the wiring portion of the conductor trace.

(5) The first metal cover layer may include at least one type of metal of gold, silver, chromium, tin and platinum.

In this case, depending on the use of the printed circuit board, more appropriate metal can be used as the first metal cover layer.

(6) The first metal cover layer may include at least one type of metal of nickel, gold, silver, chromium, tin and platinum.

In this case, depending on the use of the printed circuit board, more appropriate metal can be used as the first metal cover layer.

(7) The printed circuit board may further include a second metal cover layer covering the portion of the first metal cover layer covering the terminal portion.

In this case, each connection terminal can be formed of the terminal portion of the conductor trace, the first metal cover layer and the second metal cover layer. Thus, the surface condition of the connection terminal can be smoothed by the second metal cover layer.

(8) At least part of the first metal cover layer may be constituted by first and second metal layers laminated on each other.

In this case, a degree of flexibility of the configuration of the first metal cover layer in the printed circuit board is improved.

(9) The printed circuit board may further include a terminal barrier layer that covers the portion of the first metal cover layer covering the terminal portion, and a terminal surface layer that covers the terminal barrier layer, wherein the conductor trace may include copper, the terminal surface layer includes gold, and the terminal barrier layer may include nickel or palladium.

In this case, diffusion of a copper component from the conductor trace to the terminal surface layer is inhibited by the terminal barrier layer. Thus, reductions in corrosion resistance and wettability of the terminal surface layer due to the diffusion of the copper component to the gold in the terminal surface layer is inhibited.

(10) The printed circuit board may further include a terminal surface layer formed to cover the portion of the first metal cover layer covering the terminal portion and not to come into contact with the conductor trace, wherein the conductor trace may include copper, the terminal surface layer includes gold, and the first metal cover layer may include nickel.

In this case, the diffusion of the copper component from the conductor trace to the terminal surface layer is inhibited by the first metal cover layer. Thus, reductions in corrosion resistance and wettability of the terminal surface layer due to the diffusion of the copper component to the gold in the terminal surface layer is inhibited.

(11) The printed circuit board may further include an upper conductor trace formed on the second insulating layer, wherein at least part of the upper conductor trace may overlap with the conductor trace. Thus, the conductor trace and at least part of the upper conductor trace are vertically stacked, so that a reduction in size of the printed circuit board is realized, and a degree of flexibility of design of the printed circuit board is improved.

(12) The printed circuit board may further include an upper conductor trace that is formed on the second insulating layer and has an upper terminal portion and an upper wiring portion extending from the upper terminal portion, an upper metal cover layer provided to cover the upper terminal portion and part of the upper wiring portion, and continuously extend from a surface of the upper terminal portion to a surface of the upper wiring portion and a third insulating layer provided on the second insulating layer to cover a portion of the upper metal cover layer covering the part of the upper wiring portion and another portion of the upper wiring portion not covered by the upper metal cover layer, and not to cover a portion of the upper metal cover layer covering the upper terminal portion, wherein at least part of the upper conductor trace may overlap with the conductor trace, the upper metal cover layer may come into contact with the part of the upper wiring portion, and may extend on the surface of the upper wiring portion to a position at a distance of 3 µm or more from a position over a boundary between the upper terminal portion and the upper wiring portion, the third insulating layer may come into contact with the portion of the upper metal cover layer covering the upper wiring portion, and may come into contact with the other portion of the upper wiring portion, and a ratio of a length of the upper metal cover layer covering the part of the upper wiring portion to a total length of the upper wiring portion may be 40% or less.

In this case, in a range of the length of 60% or more of the total length of the upper wiring portion, a layer having the magnetism as high as or higher than the magnetism of nickel is not present between the upper wiring portion and the third insulating layer. Thus, as for the conductor trace and the upper conductor trace, a transmission loss of an electrical signal can be reduced in a high frequency band.

Further, the third insulating layer comes into contact with the portion of the upper metal cover layer covering the upper wiring portion. The upper metal cover layer continuously extends from the surface of the upper terminal portion to the surface of the upper wiring portion, and extends on the surface of the upper wiring portion to the position at the distance of 3 µm or more from the position over the boundary between the upper terminal portion and the upper wiring portion. Thus, an occurrence of corrosion at the boundary between the upper terminal portion and the upper wiring portion of the upper conductor trace, and its vicinity is prevented.

Further, because the conductor trace and at least part of the upper conductor trace are vertically stacked, a reduction in size of the printed circuit board is realized, and the degree of flexibility of the design of the printed circuit board is improved.

(13) The printed circuit board may further include an upper conductor trace that is formed on the second insulating layer and has an upper terminal portion and an upper wiring portion extending from the upper terminal portion, an upper metal cover layer provided to cover the upper wiring portion and the upper terminal portion and continuously extend from a surface of the upper terminal portion to a surface of the upper wiring portion, and a third insulating layer provided on the second insulating layer to cover a portion of the upper metal cover layer covering the upper wiring portion and not to cover a portion of the upper metal cover layer covering the upper terminal portion, wherein at least part of the upper conductor trace may overlap with the conductor trace, the upper metal cover layer may come into contact with the upper wiring portion, the third insulating layer may come into contact with the portion of the upper metal cover layer covering the upper wiring portion, and the upper metal cover layer may have magnetism lower than the magnetism of nickel.

In this case, a layer having the magnetism as high as or higher than the magnetism of nickel is not present between the upper wiring portion and the third insulating layer. Thus, a transmission loss of an electrical signal can be reduced in a high frequency band.

Further, the third insulating layer comes into contact with the portion of the upper metal cover layer covering the upper wiring portion, and the upper metal cover layer continuously extends from the surface of the upper terminal portion to the surface of the upper wiring portion. Thus, an occurrence of corrosion at the boundary between the upper terminal portion and the upper wiring portion of the upper conductor trace, and its vicinity is prevented.

Further, because the conductor trace and at least part of the upper conductor trace are vertically stacked, a reduction in size of the printed circuit board is realized, and the degree of flexibility of the design of the printed circuit board is improved.

(14) The printed circuit board may further include an upper conductor trace that is formed on the second insulating layer and has an upper terminal portion and an upper wiring portion extending from the upper terminal portion, an upper metal cover layer provided to cover part of the upper wiring portion and the upper terminal portion, and continuously extend from a surface of the upper terminal portion to a surface of the upper wiring portion, and a third insulating layer provided on the second insulating layer to cover a portion of the upper metal cover layer covering the part of the upper wiring portion and another portion of the upper wiring portion not covered by the upper metal cover layer, and not to cover a portion of the upper metal cover layer covering the upper terminal portion, wherein at least part of the upper conductor trace may overlap with the conductor trace, the upper metal cover layer may come into contact with the part of the upper wiring portion and may extend on the surface of the upper wiring portion to a position at a distance of 3 µm or more from a position over a boundary between the upper terminal portion and the upper wiring portion, the third insulating layer may come into contact with the portion of the upper metal cover layer covering the upper wiring portion, and may come into contact with the other portion of the upper wiring portion, and the upper metal cover layer may have magnetism lower than the magnetism of nickel.

In this case, a layer having the magnetism as high as or higher than the magnetism of nickel is not present between the upper wiring portion and the third insulating layer. Thus, a transmission loss of an electrical signal can be reduced in a high frequency band.

Further, the third insulating layer comes into contact with the portion of the upper metal cover layer covering the upper wiring portion. The upper metal cover layer continuously extends from the surface of the upper terminal portion to the surface of the upper wiring portion, and extends on the surface of the upper wiring portion to the position at the distance of 3 μm or more from the position over the boundary between the upper terminal portion and the upper wiring portion. Thus, an occurrence of corrosion at the boundary between the upper terminal portion and the upper wiring portion of the upper conductor trace, and its vicinity is prevented.

Further, because the conductor trace and at least part of the upper conductor trace are vertically stacked, a reduction in size of the printed circuit board is realized, and the degree of flexibility of the design of the printed circuit board is improved.

(15) The printed circuit board may further include a lower insulating layer, and a lower conductor trace formed on the lower insulating layer, wherein the first insulating layer may be formed on the lower insulating layer to cover at least part of the lower conductor trace, and at least part of the conductor trace may overlap with the lower conductor trace. Thus, because the conductor trace and at least part of the lower conductor trace are vertically stacked, a reduction in size of the printed circuit board is realized, and the degree of flexibility of the design of the printed circuit board is improved.

(16) A method of manufacturing a printed circuit board according to yet another aspect of the present invention includes the steps of forming a conductor trace having a terminal portion and a wiring portion extending from the terminal portion on a first insulating layer, forming a metal cover layer using metal having magnetism lower than magnetism of nickel to cover the wiring portion and the terminal portion, continuously extend from a surface of the terminal portion to a surface of the wiring portion, and come into contact with the wiring portion, and forming a second insulating layer on the first insulating layer to cover a portion of the metal cover layer covering the wiring portion, not to cover a portion of the metal cover layer covering the terminal portion, and come into contact with the portion of the metal cover layer covering the wiring portion.

In the method of manufacturing the printed circuit board, the metal cover layer is provided to cover the wiring portion, and the second insulating layer is provided to cover the portion of the metal cover layer covering the wiring portion. The metal cover layer comes into contact with the wiring portion, and the second insulating layer comes into contact with the portion of the metal cover layer covering the wiring portion. In this case, a layer having the magnetism as high as or higher than the magnetism of nickel is not present between the wiring portion and the second insulating layer. Thus, a transmission loss of an electrical signal can be reduced in a high frequency band.

Further, the second insulating layer comes into contact with the portion of the metal cover layer covering the wiring portion, whereby adhesion between the second insulating layer and the wiring portion is improved. Further, the metal cover layer is formed to continuously extend from the surface of the terminal portion to the surface of the wiring portion. Thus, entry of fluid such as air, water or a chemical liquid to the inside of the metal cover layer from outside of the second insulating layer is prevented. Therefore, an occurrence of corrosion at the boundary between the terminal portion and the wiring portion of the conductor trace, and its vicinity is prevented.

(17) A method of manufacturing a printed circuit board according to yet another aspect of the present invention includes the steps of forming a conductor trace having a terminal portion and a wiring portion extending from the terminal portion on a first insulating layer, forming a metal cover layer using metal having magnetism lower than magnetism of nickel to cover the terminal portion and part of the wiring portion, continuously extend from a surface of the terminal portion to a surface of the wiring portion, and come into contact with the part of the wiring portion, forming a second insulating layer on the first insulating layer to cover a portion of the metal cover layer covering the part of the wiring portion and another portion of the wiring portion not covered by the metal cover layer, not to cover a portion of the metal cover layer covering the terminal portion, to come into contact with the portion of the metal cover layer covering the wiring portion, and to come into contact with the other portion of the wiring portion, wherein the metal cover layer is formed to extend on the surface of the wiring portion to a position at a distance of 3 μm or more from a position over a boundary between the terminal portion and the wiring portion in the step of forming the metal cover layer.

In the method of manufacturing the printed circuit board, the metal cover layer is provided to cover the terminal portion and the part of the wiring portion, and the second insulating layer is provided to cover the portion of the metal cover layer covering the part of the wiring portion, and the other portion of the wiring portion not covered by the metal cover layer. The metal cover layer comes into contact with the part of the wiring portion, and the second insulating layer comes into contact with the portion of the metal cover layer covering the wiring portion, and comes into contact with the other portion of the wiring portion. In this case, a layer having the magnetism as high as or higher than the magnetism of nickel is not present between the wiring portion and the second insulating layer. Thus, a transmission loss of an electrical signal can be reduced in a high frequency band.

Further, the second insulating layer comes into contact with the portion of the metal cover layer covering the wiring portion, and the metal cover layer extends on the surface of the wiring portion to the position at the distance of 3 μm or more from the position over the boundary between the terminal portion and the wiring portion. Thus, adhesion between the second insulating layer and the wiring portion is improved in the vicinity of the boundary between the terminal portion and the wiring portion of the conductor trace. Further, the metal cover layer is formed to continuously extend from the surface of the terminal portion to the surface of the wiring portion. Thus, entry of fluid such as air, water or a chemical liquid to the inside of the metal cover layer from outside of the second insulating layer is prevented. Therefore, an occurrence of corrosion at the boundary between the terminal portion and the wiring portion of the conductor trace, and its vicinity is prevented.

(18) A method of manufacturing a printed circuit board according to yet another aspect of the present invention includes the steps of forming a conductor trace having a terminal portion and a wiring portion extending from the terminal portion on a first insulating layer, forming a metal cover layer to cover the terminal portion and part of the wiring portion, continuously extend from a surface of the terminal portion to a surface of the wiring portion, and come into contact with the part of the wiring portion, forming a second insulating layer on the first insulating layer to cover a portion of the metal cover layer covering the part of the wiring portion and another portion of the wiring portion not covered by the metal cover layer, not to cover a portion of the metal cover layer covering the terminal portion, to come into contact with the portion of the metal cover layer covering the wiring portion, and to come into contact with the other portion of the wiring portion, wherein the metal cover layer is formed on the surface of the wiring portion to extend to a position at a distance of 3 µm or more from a position over a boundary between the terminal portion and the wiring portion in the step of forming the metal cover layer, and a ratio of a length of the metal cover layer covering the part of the wiring portion to a total length of the wiring portion is set to 40% or less.

In the method of manufacturing the printed circuit board, the metal cover layer is provided to cover the terminal portion and the part of the wiring portion, and the second insulating layer is provided to cover the portion of the metal cover layer covering the part of the wiring portion and the other portion of the wiring portion not covered by the metal cover layer. The metal cover layer comes into contact with the part of the wiring portion, and the second insulating layer comes into contact with the portion of the metal cover layer covering the wiring portion, and comes into contact with the other portion of the wiring portion.

The ratio of the length of the metal cover layer covering the part of the wiring portion to the total length of the wiring portion is 40% or less. In this case, for the length of 60% or more of the total length of the wiring portion, a layer having the magnetism as high as or higher than the magnetism of nickel is not present between the wiring portion and the second insulating layer. Thus, a transmission loss of an electrical signal can be reduced in a high frequency band.

Further, the second insulating layer comes into contact with the portion of the metal cover layer covering the wiring portion, and the metal cover layer extends on the surface of the wiring portion to the position at the distance of 3 µm or more from the position over the boundary between the terminal portion and the wiring portion. Thus, adhesion between the second insulating layer and the wiring portion is improved in the vicinity of the boundary between the terminal portion and the wiring portion of the conductor trace. Further, the metal cover layer is formed to continuously extend from the surface of the terminal portion to the surface of the wiring portion. Thus, entry of fluid such as air, water or a chemical liquid to the inside of the metal cover layer from outside of the second insulating layer is prevented. Therefore, an occurrence of corrosion at the boundary between the terminal portion and the wiring portion of the conductor trace, and its vicinity is prevented.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIGS. 17A and 17B are a plan view and a cross sectional view showing an example of another configuration of the connection terminals in the suspension board according to the fifth embodiment;

FIGS. 20A and 20B are a plan view and a cross sectional view showing an example of yet another configuration of the connection terminals in the suspension board according to the fifth embodiment;

FIGS. 24A to 24C are schematic views showing a step of manufacturing the suspension board of FIG. 21;

FIGS. 25A to 25C are schematic views showing a step of manufacturing the suspension board of FIG. 21;

DESCRIPTION OF THE PREFERRED EMBODIMENTS

A printed circuit board and a method of manufacturing the printed circuit board according to embodiments of the present invention will be described below with reference to drawings. A suspension board having a circuit (hereinafter abbreviated as a suspension board) used for an actuator of a hard disc drive will be described as the printed circuit board according to the embodiments of the present invention.

[1] First Embodiment (1) Configuration of Suspension Board

Figure 1:
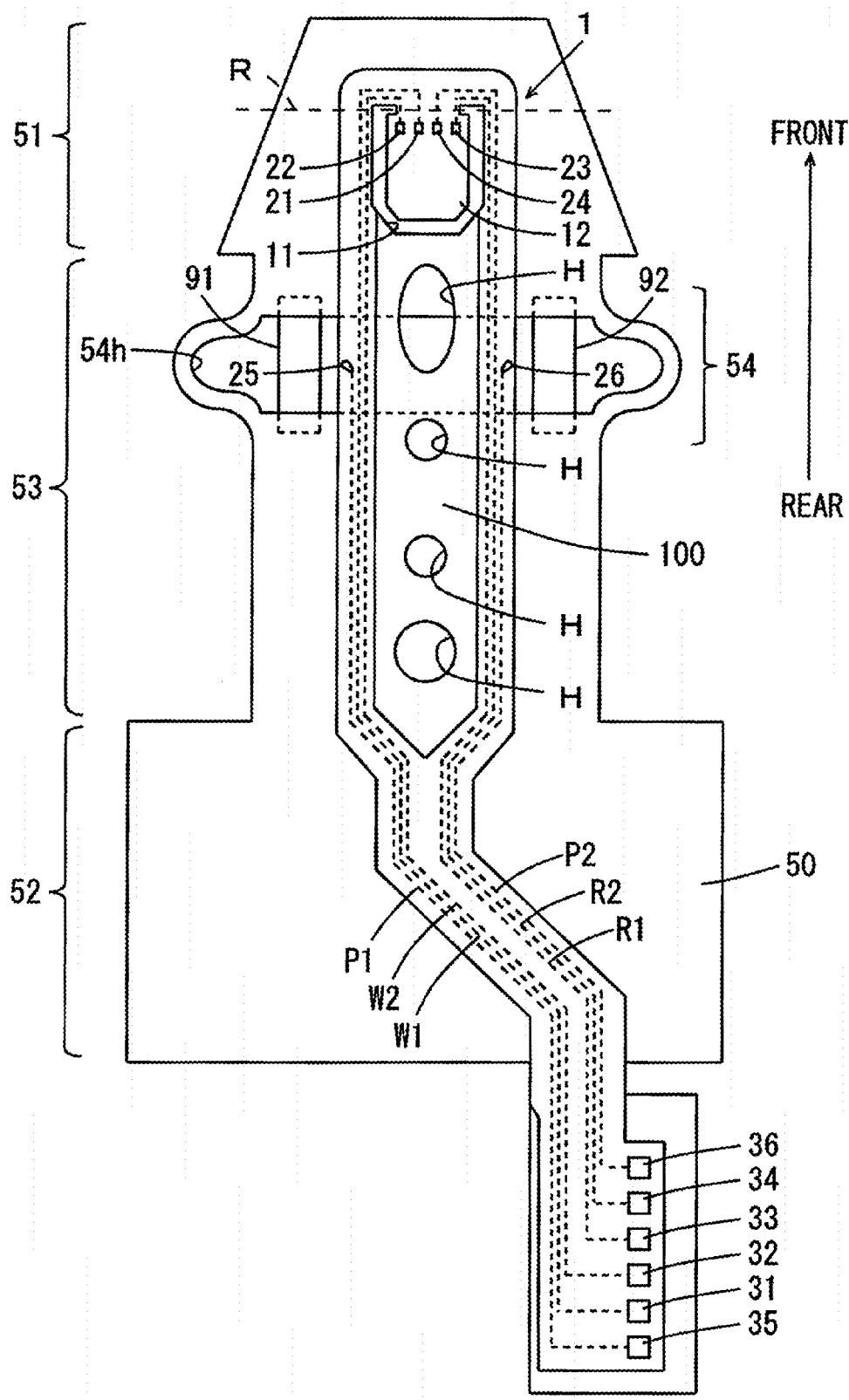
FIG. 1 is a plan view of a suspension board according to a first embodiment.

FIG. 1 is a plan view of the suspension board according to the first embodiment. In FIG. 1, a direction in which an arrow is directed is referred to as forward, and the opposite direction is referred to as rearward. As shown in FIG. 1, the suspension board 1 includes a suspension body 100 formed of an elongated metallic support substrate 10 (see FIGS. 5A to 5C). In FIG. 1, the suspension body 100 extends substantially in a front-and-rear direction.

The suspension board 1 is supported by an elongated support plate 50. As indicated by dotted lines, write wiring traces W1, W2, read wiring traces R1, R2 and power wiring traces P1, P2 are formed on an upper surface of the suspension body 100.

At one end of the suspension body 100, a magnetic head supporting portion (hereinafter referred to as a tongue) 12 is provided by forming a U-shaped opening 11. The tongue 12 is bent along a broken line R to form a predetermined angle with the suspension body 100.

Four connection terminals 21, 22, 23, 24 are formed on an upper surface of the tongue 12 at one end of the suspension body 100. Further, two connection terminals 25, 26 are respectively formed on both sides of the vicinity of the center portion in a direction in which the suspension body 100 extends. A head slider having a magnetic head (not shown) is mounted on the upper surface of the tongue 12. Terminals of the magnetic head of the head slider are connected to the connection terminals 21 to 24 of the tongue 12. The connection terminals 25, 26 are respectively connected to two piezoelectric elements 91, 92 that are provided at the support plate 50.

Six connection terminals 31, 32, 33, 34, 35, 36 are formed on an upper surface at the other end of the suspension body 100. Electric circuits such as a preamplifier are connected to the connection terminals 31 to 34. Power circuits for the piezoelectric elements 91, 92 are connected to the connection terminals 35, 36. The connection terminals 21 to 26 are respectively electrically connected to the connection terminals 31 to 36 by the write wiring traces W1, W2, the read wiring traces R1, R2 and the power wiring traces P1, P2. Further, a plurality of holes H are formed in the suspension body 100.

The support plate 50 has a front end region 51, a rear end region 52 and a center region 53. The rear end region 52 is rectangular. The front end region 51 is trapezoidal, and the width is gradually reduced forward. The center region 53 has a rectangular shape that extends in the front-and-rear direction, and is arranged between the front end region 51 and the rear end region 52. With the suspension board 1 being supported by an upper surface of the support plate 50, an end portion of the suspension board 1 including the connection terminals 31 to 36 projects rearward from the rear end region 52.

A piezoelectric element mounting region 54 is provided in one portion of the center region 53. The piezoelectric element mounting region 54 overlaps with the connection terminals 25, 26 of the suspension board 1. Both side portions of the piezoelectric element mounting region 54 project to be curved outward. Further, a through hole 54h extending in a width direction (a direction that is perpendicular to the front-and-rear direction) is formed in the piezoelectric element mounting region 54. This configuration causes the piezoelectric element mounting region 54 of the support plate 50 to be stretchable in the front-and-rear direction.

The piezoelectric elements 91, 92 are mounted on a lower surface of the piezoelectric element mounting region 54 so as to cross the through hole 54h. The piezoelectric elements 91, 92 are respectively positioned on both sides of the suspension board 1. The piezoelectric elements 91, 92 are respectively connected to the connection terminals 25, 26 of the suspension board 1 through the through hole 54h.

A voltage is added to the piezoelectric element 91 via the connection terminals 25, 35 and the power wiring trace P1, and a voltage is added to the piezoelectric element 92 via the connection terminals 26, 36 and the power wiring trace P2. Thus, with a stretch of the piezoelectric elements 91, 92, the support plate 50 is stretched in the front-and-rear direction. Subtle positioning of the magnetic head of the head slider on the suspension board 1 becomes possible by control of the voltage that is added to the piezoelectric elements 91, 92.

The suspension board 1 supported by the support plate 50 is provided in the hard disc drive. An electric current flows in the pair of write wiring traces W1, W2 at a time of writing the information in a magnetic disc. The write wiring trace W1 and the write wiring trace W2 constitute a differential signal line pair that transmits differential write signals. Further, an electric current flows in the pair of read wiring traces R1, R2 at a time of reading the information from the magnetic disc. The read wiring trace R1 and the read wiring trace R2 constitute a differential signal line pair that transmits differential read signals.

(2) Configuration of Connection Terminals and their Peripheral Portions

Figure 2A:
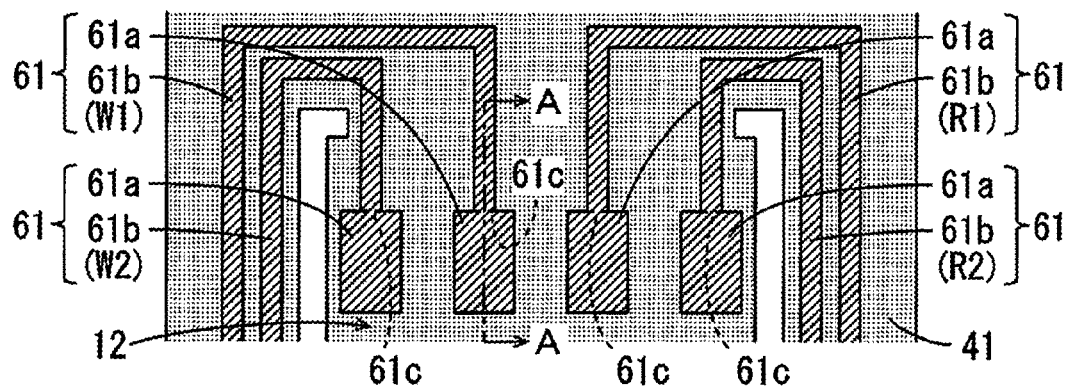
FIGS. 2A to 2C are plan views of connection terminals and their peripheral portions.

Next, details of the connection terminals 21 to 26, 31 to 36 of the suspension board 1 and their peripheral portions will be described. FIGS. 2A to 4C are plan views of the connection terminals 21 to 26, 31 to 36 and their peripheral portions. FIGS. 5A to 5C are cross sectional views of the connection terminals 21 to 26, 31 to 36 and their peripheral portions. Scales of FIGS. 2A to 2C are different from one another, scales of FIGS. 3A to 3C are different from one another, scales of FIGS. 4A to 4C are different from one another, and scales of FIGS. 5A to 5C are different from one another.

Figure 2B:
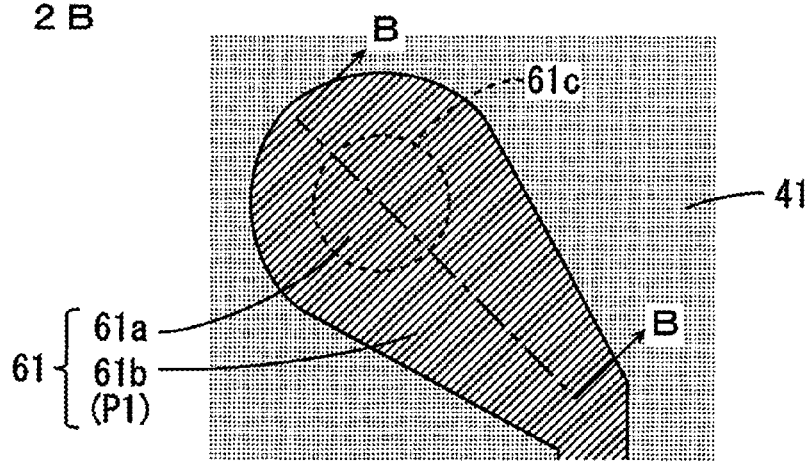
Figure 2C:
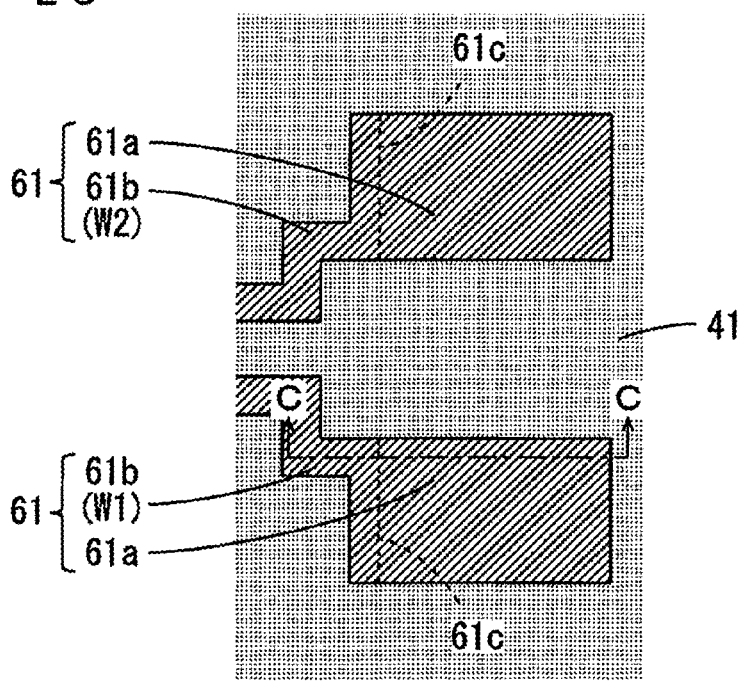
Figure 3A:
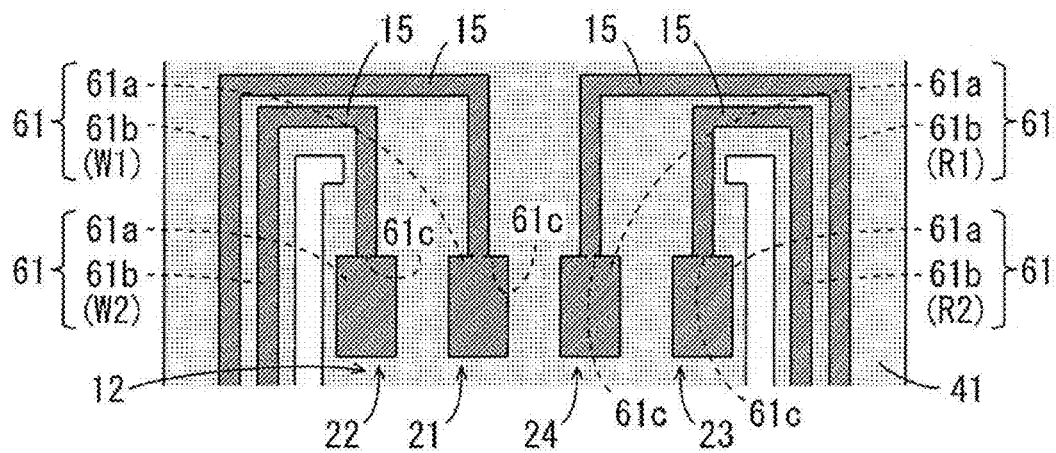
FIGS. 3A to 3C are plan views of the connection terminals and their peripheral portions.
Figure 3B:
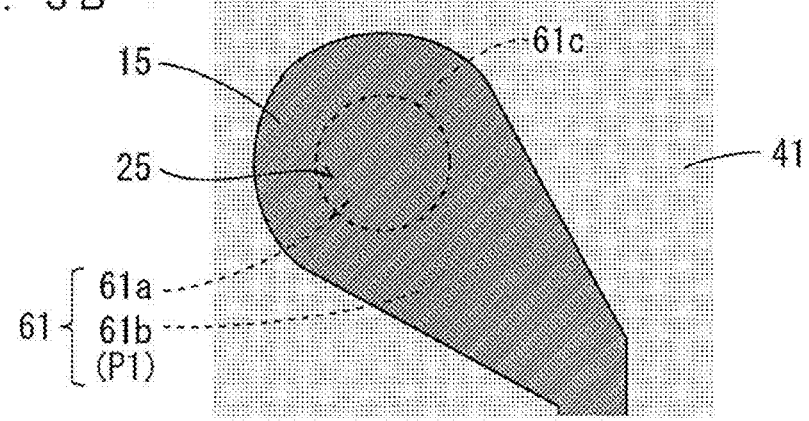
Figure 3C:
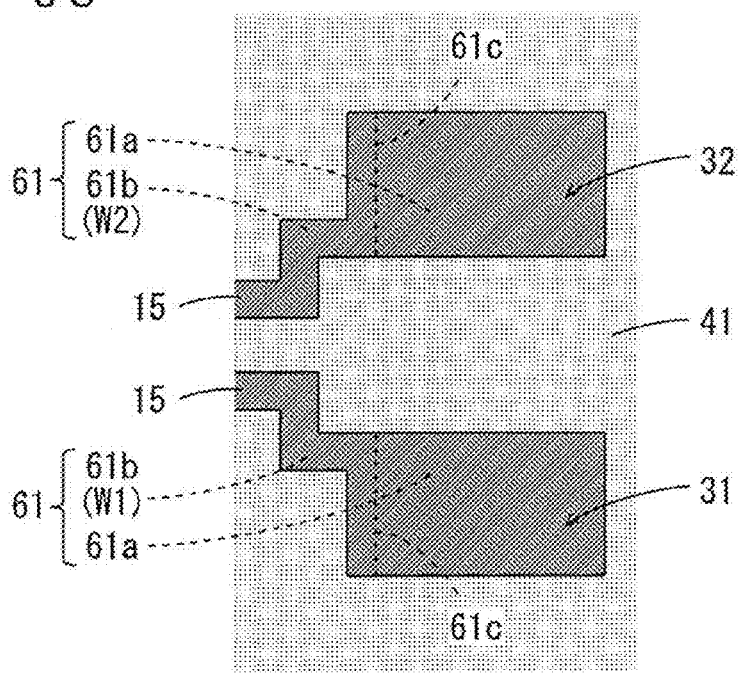
Figure 4A:
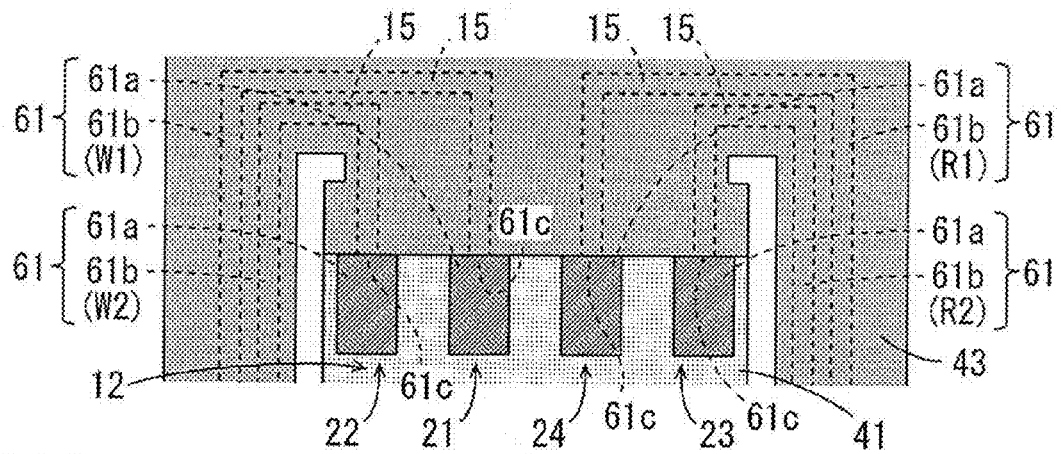
FIGS. 4A to 4C are plan views of the connection terminals and their peripheral portions.
Figure 4B:
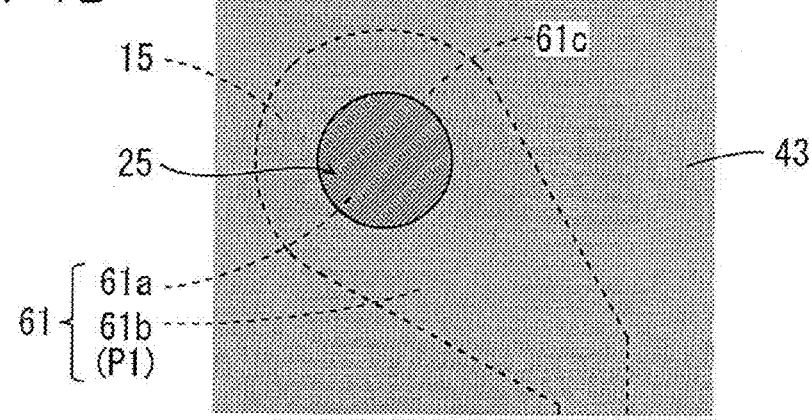
Figure 4C:
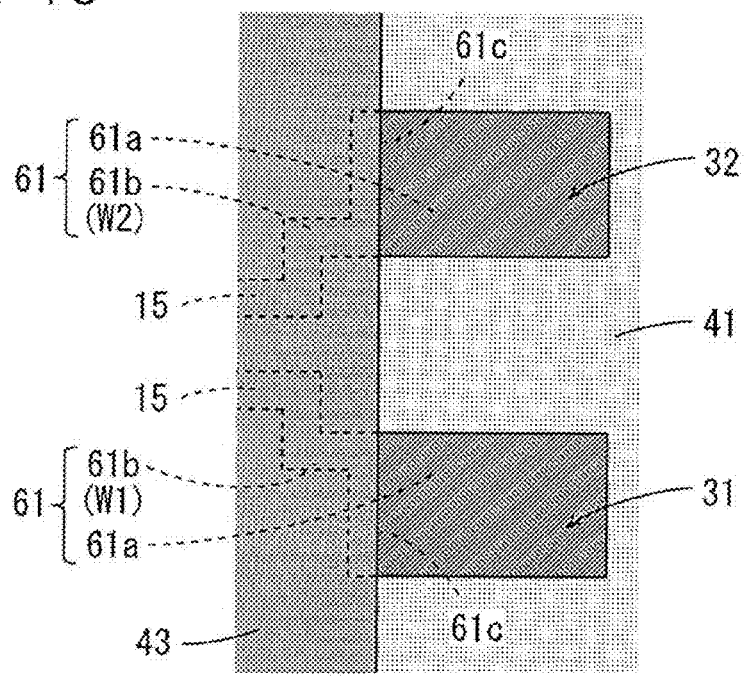
Figure 5A:
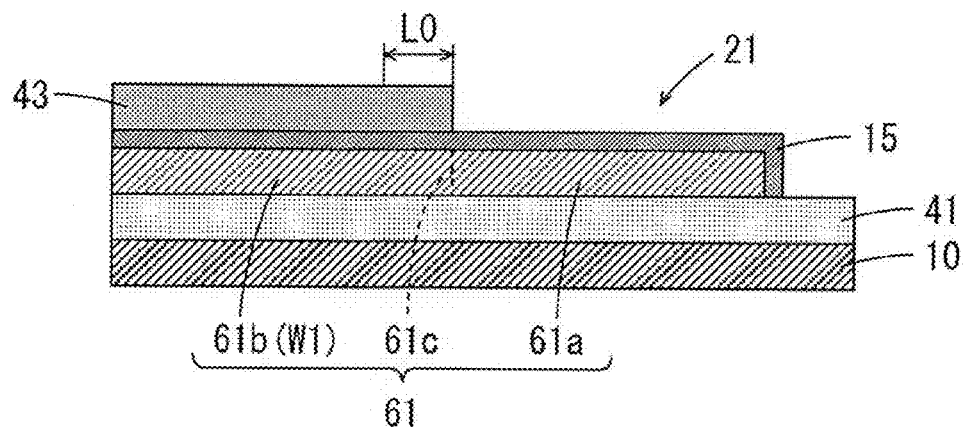
FIG. 5A to 5C are cross sectional views of the connection terminals and their peripheral portions.
Figure 5B:
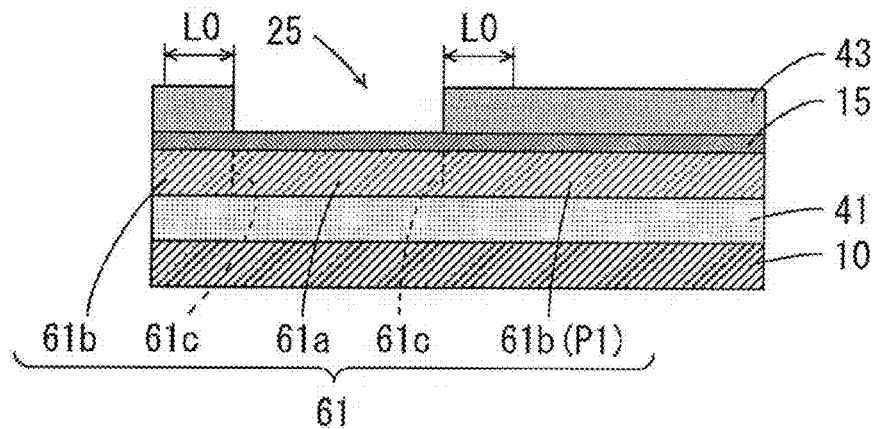
Figure 5C:
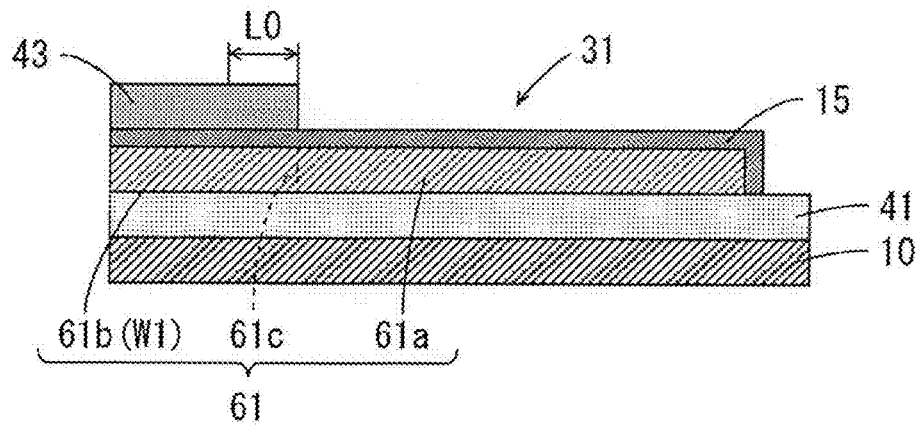

FIGS. 2A, 3A and 4A show the connection terminals 21 to 24 and their peripheral portions of FIG. 1, FIGS. 2B, 3B and 4B show the connection terminal 25 and its peripheral portions of FIG. 1, and FIGS. 2C, 3C and 4C show the connection terminals 31, 32 and their peripheral portions of FIG. 1. In FIGS. 2A to 2C, a metal cover layer 15 (see FIGS. 5A to 5C) and a cover insulating layer 43 (see FIGS. 5A to 5C) are not shown. In FIGS. 3A to 3C, the cover insulating layer 43 (see FIGS. 5A to 5C) is not shown. The connection terminal 26 has a configuration similar to the connection terminal 25, and the connection terminals 33 to 36 have a configuration similar to the connection terminals 31, 32.

FIGS. 5A to 5C respectively show an enlarged cross sectional view taken along the line A-A of FIG. 2A, an enlarged cross sectional view taken along the line B-B of FIG. 2B, and an enlarged cross sectional view taken along the line C-C of FIG. 2C. The same hatched and dotted patterns applied to each member of the cross sectional views of FIGS. 5A to 5C are applied to the members of the plan views of FIGS. 2A to 2C, FIGS. 3A to 3C and FIGS. 4A to 4C in order to facilitate understanding of the configuration. The same is true for the below-mentioned FIGS. 6A to 12B, 14A, 14B, 38A, 38B and the like.

As shown in each of FIGS. 5A to 5C, a base insulating layer 41 made of polyimide, for example, is formed on the metallic support substrate 10 made of a stainless steel, for example. As shown in each of FIGS. 2A to 2C, a plurality (six in the present example) of conductor traces 61 made of copper, for example, are formed on the base insulating layer 41. Each conductor trace 61 includes two terminal portions 61a and one wiring portion 61b. The wiring portion 61b is formed to connect the two terminal portions 61a to each other and extend from each terminal portion 61a. The above-mentioned write wiring traces W1, W2, read wiring traces R1, R2 and power wiring traces P1, P2 are respectively constituted by the wiring portions 61b of the six conductor traces 61. A seed layer (not shown) is formed between each conductor trace 61 and the base insulating layer 41.

As shown in each of FIGS. 5A to 5C, the metal cover layer 15 is formed to cover each entire conductor trace 61. Specifically, the metal cover layer 15 is formed to cover the terminal portion 61a and the wiring portion 61b of each conductor trace 61 and continuously extend from the surface of the terminal portion 61a to the surface of the wiring portion 61b. In the present embodiment, the metal cover layer 15 is mainly made of the metal having the magnetism lower than the magnetism of nickel (non-magnetic metal, for example), and has the magnetism lower than the magnetism of nickel. Specifically, the metal cover layer 15 is made of gold, for example.

The metal cover layer 15 is formed on each of the two terminal portions 61a of each of the plurality of conductor traces 61, so that each of the connection terminals 21 to 24 is formed at one end portion of each of the write wiring traces W1, W2 and the read wiring traces R1, R2 as shown in FIG. 3A. As shown in FIG. 3B, the connection terminal 25 is formed at one end portion of the power wiring trace P1. Similarly, the connection terminal 26 (FIG. 1) is formed at one end portion of the power wiring trace P2 (FIG. 1). As shown in FIG. 3C, the connection terminals 31, 32 are respectively formed at the other end portions of the write wiring traces W1, W2. Similarly, the connection terminals 33 to 36 (FIG. 1) are respectively formed at the other end portions of the write wiring traces R1, R2 (FIG. 1) and the power wiring traces P1, P2 (FIG. 1).

As shown in each of FIGS. 4A to 4C, the cover insulating layer 43 is formed on the base insulating layer 41 to cover a portion, of the metal cover layer 15 formed at each conductor pattern 61, covering the wiring portion 61b, and not to cover a portion of the metal cover layer 15 covering the terminal portion 61a. The cover insulating layer 43 is made of polyimide, for example.

In the above-mentioned configuration, the metal cover layer 15 comes into contact with the wiring portion 61b and the terminal portion 61a, and the cover insulating layer 43 comes into contact with the portion of metal cover layer 15 covering the wiring portion 61b. Further, an end of the cover insulating layer 43 positioned in the vicinity of each of the connection terminals 21 to 24, 33 to 36 is positioned over a boundary 61c between the terminal portion 61a and the wiring portion 61b of each conductor trace 61 (see FIGS. 5A to 5C).

As shown in each of FIGS. 5A to 5C, in the present embodiment, the metal cover layer 15 is formed to extend on the surface of the wiring portion 61b to a position at a distance of at least a distance L0 from the position over the boundary 61c between the terminal portion 61a and the wiring portion 61b. The distance L0 is 3 µm or more.

(3) Method of Manufacturing Suspension Board

The method of manufacturing the suspension board 1 will be described below. FIGS. 6A to 9B are schematic diagrams showing the steps of manufacturing the suspension board 1 of FIG. 1. FIGS. 6A to 7B are plan views of the portions equivalent to the connection terminals 21 to 24 and their peripheries. FIGS. 8A to 9B show cross sectional views taken along the line D-D of FIGS. 6A to 7B.

Figure 6A:
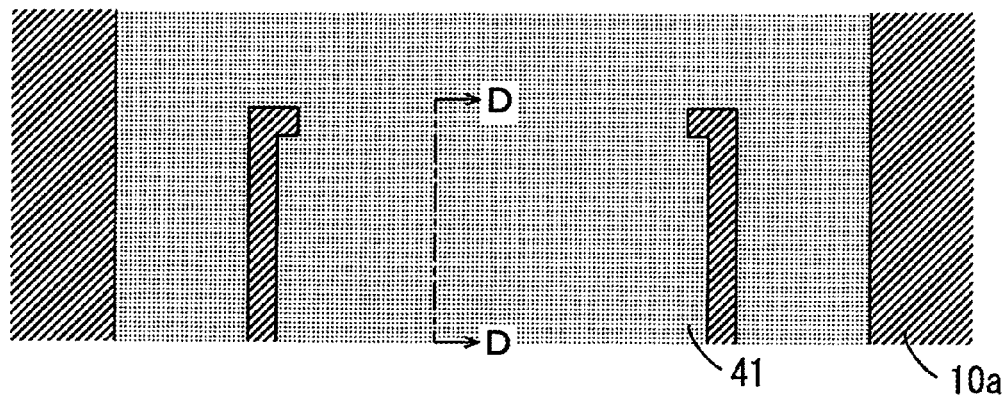
FIGS. 6A to 6C are schematic views showing the steps of manufacturing of the suspension board of FIG. 1.
Figure 8A:
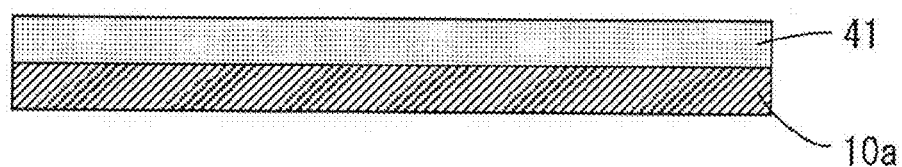
FIGS. 8A to 8C are schematic views showing the steps of manufacturing the suspension board of FIG. 1.

First, as shown in each of FIGS. 6A and 8A, the base insulating layer 41 made of polyimide, for example, is formed on a support layer 10a made of a stainless steel, for example. The thickness of the support layer 10a is not less than 10 µm and not more than 50 µm, for example. The thickness of the base insulating layer 41 is not less than 5 µm and not more than 15 µm, for example. The base insulating layer 41 is formed in the same shape as the shape of the suspension board 1 of FIG. 1.

Figure 6B:
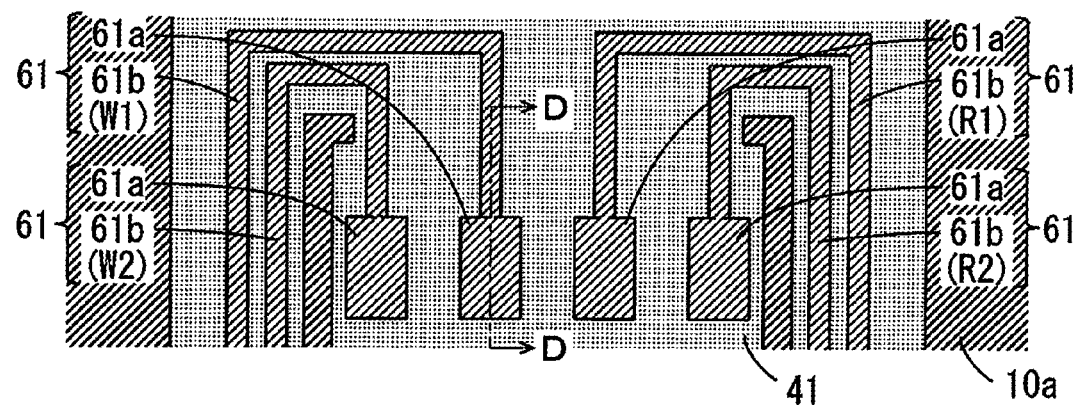
Figure 8B:
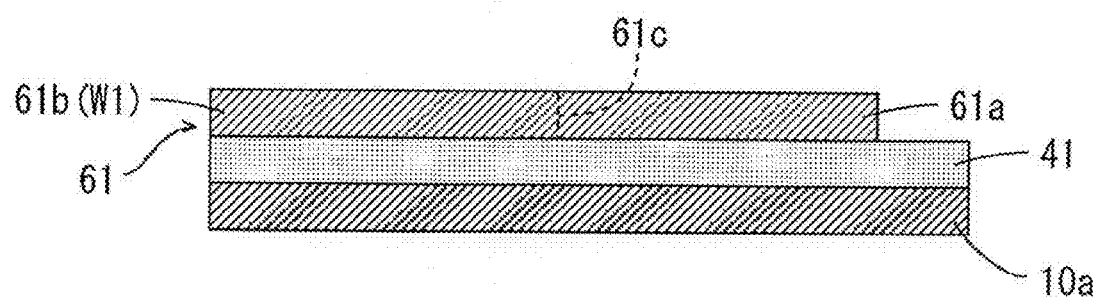

Next, as shown in each of FIGS. 6B and 8B, the plurality (six in the present example) of conductor traces 61 made of copper, for example, are formed on the base insulating layer 41 with the seed layer (not shown) sandwiched therebetween. The seed layer is made of a laminated film of chromium and copper, or a single layer film of chromium, for example, and can be formed by a method such as sputtering, electroless plating or vapor deposition. The thickness of each conductor trace 61 is not less than 1 µm and not more than 20 µm, for example. The write wiring traces W1, W2, the read wiring traces R1, R2, the power wiring traces P1, P2 are formed on the base insulating layer 41 by the wiring portions 61*b* of the six conductor traces 61.

A distance between the write wiring traces W1, W2 and a distance between the read wiring traces R1, R2 are respectively not less than 5 µm and not more than 100 µm, for example. Similarly, a distance between the write wiring trace W1 and the power wiring trace P1 and a distance between the read wiring trace R2 and the power wiring trace P2 are respectively not less than 5 µm and not more than 100 µm, for example. A width of each of the write wiring traces W1, W2, the read wiring traces R1, R2 and the power wiring traces P1, P2 is not less than 5 µm and not more than 200 µm, for example.

Figure 6C:
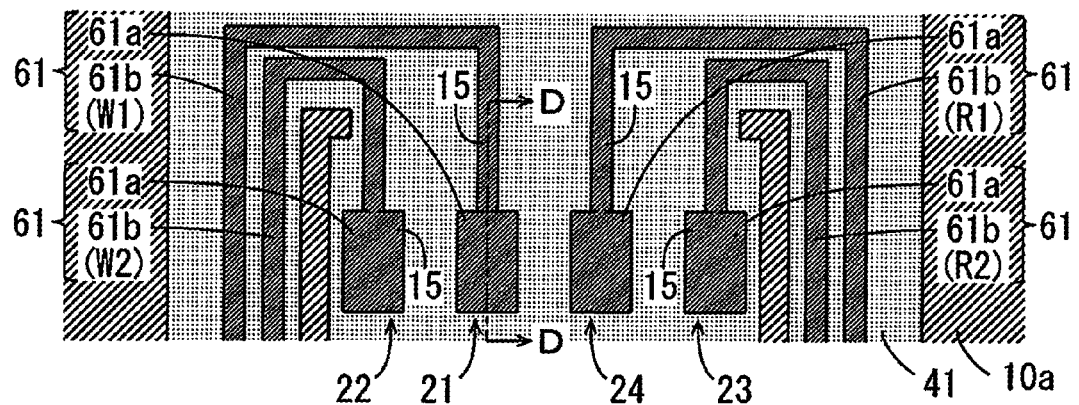
Figure 8C:
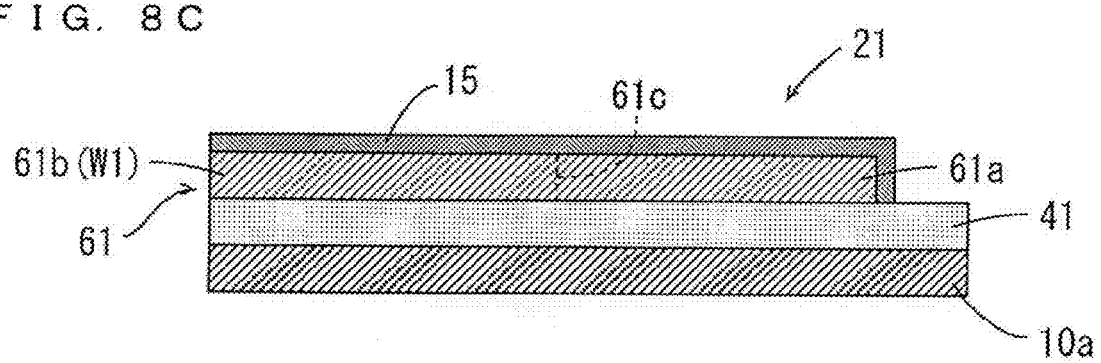

Subsequently, as shown in each of FIGS. 6C and 8C, the metal cover layer 15 is formed to cover the terminal portion 61*a* and the wiring portion 61*b* of each conductor trace 61 and continuously extend from the surface of the terminal portion 61*a* to the surface of the wiring portion 61*b*. The connection terminals 21 to 26, 31 to 36 of FIG. 1 are formed of the terminal portions 61*a* of the six conductor traces 61 and the metal cover layer 15 covering these terminal portions 61*a*.

The metal cover layer 15 is mainly made of metal having the magnetism lower than the magnetism of nickel, and is formed by electronic plating, for example. The metal cover layer 15 can be formed also by electroless plating or sputtering. As the material for the metal cover layer 15, gold is used, for example. Further, any of silver, chromium, tin and platinum can be used as the material for the metal cover layer 15.

The thickness of the metal cover layer 15 is not less than 0.005 µm and not more than 5 µm, for example, and is preferably not less than 0.01 µm and not more than 3 µm.

Figure 7A:
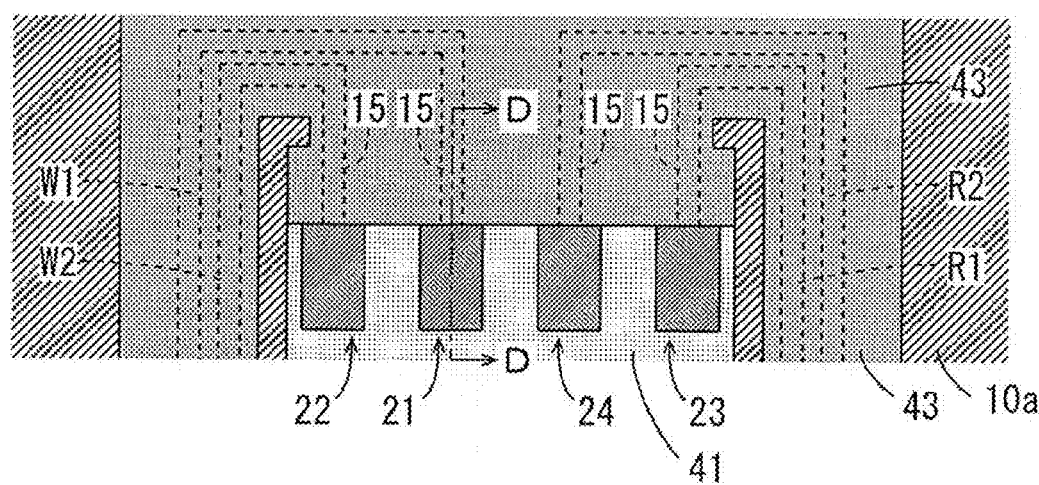
FIGS. 7A and 7B are schematic views showing the steps of manufacturing the suspension board of FIG. 1.
Figure 9A:
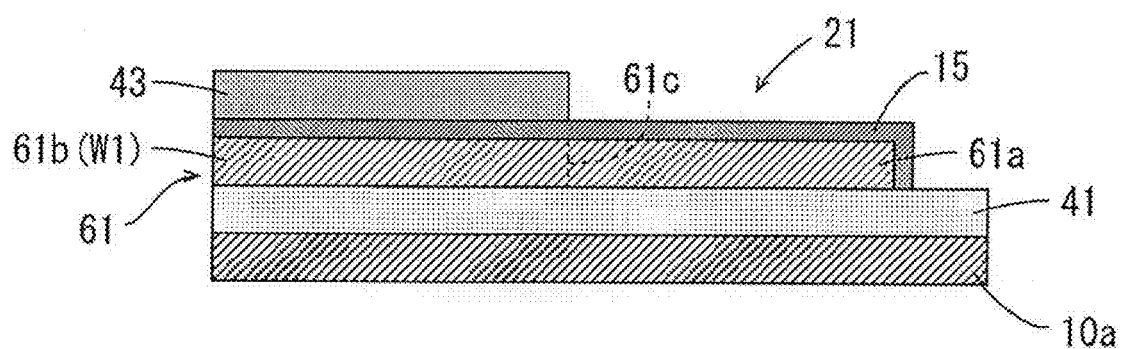
FIGS. 9A and 9B are schematic views showing the steps of manufacturing the suspension board of FIG. 1.

Thereafter, as shown in each of FIGS. 7A and 9A, the cover insulating layer 43 made of polyimide, for example, is formed on the base insulating layer 41 to cover the portion of the metal cover layer 15 covering the wiring portion 61*b* and not to cover the portion of the metal cover layer 15 covering the terminal portion 61*a*. Thus, the connection terminals 21 to 26, 31 to 36 are exposed from the cover insulating layer 43. The thickness of the cover insulating layer 43 is not less than 2 µm and not more than 10 µm, for example.

Figure 7B:
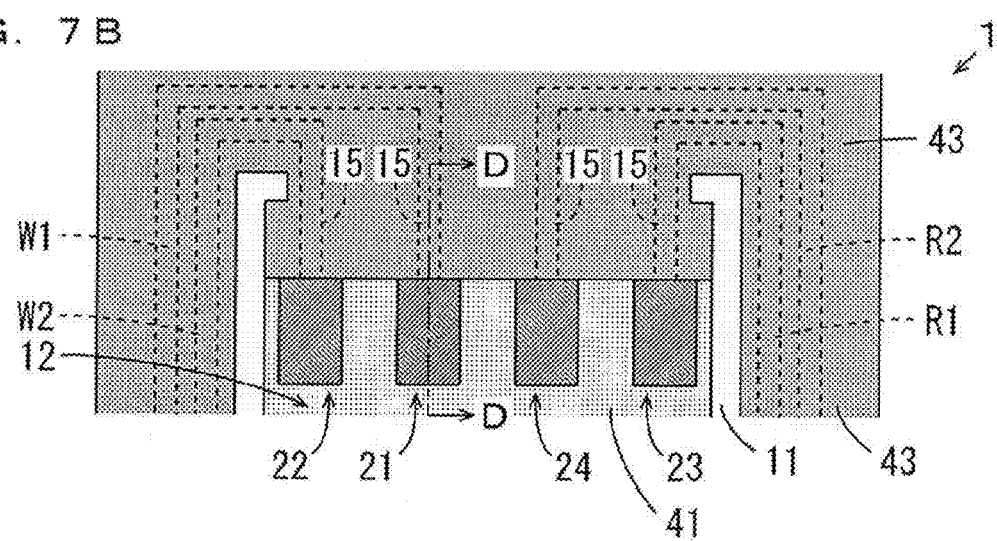
Figure 9B:
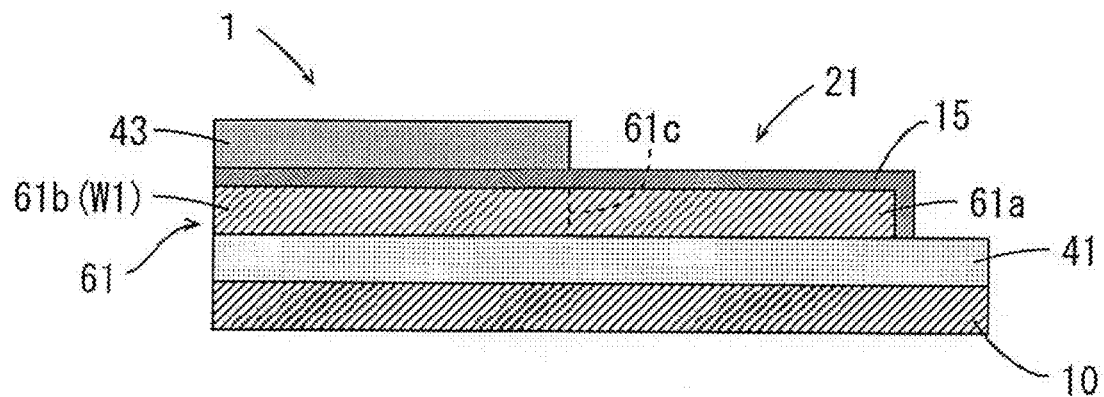

Thereafter, as shown in each of FIGS. 7B and 9B, the support layer 10*a* is processed such that a portion of the support layer 10*a* overlapping with the base insulating layer 41 remains, whereby the support substrate 10 is formed. The process of the support layer 10*a* is performed by etching, for example. Thus, the suspension board 1 is completed.

(4) Effects of First Embodiment

In the suspension board 1 according to the present embodiment, the metal cover layer 15 is provided to cover the wiring portion 61*b* of each conductor trace 61, and the cover insulating layer 43 is provided to cover a portion of the metal cover layer 15 covering the wiring portion 61*b*. The metal cover layer 15 comes into contact with the wiring portion 61*b*, and the cover insulating layer 43 comes into contact with the portion of the metal cover layer 15 covering the wiring portion 61*b*. In this case, a metal layer having the magnetism as high as or higher than the magnetism of nickel (a layer made of ferromagnetic metal, for example) is not present between the wiring portion 61*b* and the cover insulating layer 43. As a result of experiments and consideration by the inventors of the present application, it was found that a transmission loss of an electrical signal could be reduced in a high frequency band by absence of the metal layer having the magnetism as high as or higher than the magnetism of nickel between the wiring portion 61*b* and the cover insulating layer 43 covering the wiring portion 61*b*. Therefore, the above-mentioned suspension board 1 enables a transmission loss of an electrical signal in a high frequency band to be reduced.

Further, in the above-mentioned configuration, the cover insulating layer 43 comes into contact with the portion of the metal cover layer 15 covering the wiring portion 61*b*, whereby adhesion between the cover insulating layer 43 and the wiring portion 61*b* is improved as compared to the case where the cover insulating layer 43 and the wiring portion 61*b* come into contact with each other. Therefore, a large void is unlikely to be generated between the cover insulating layer 43 and the metal cover layer 15. Further, the metal cover layer 15 is formed to continuously extend from the surface of the terminal portion 61*a* to the surface of the wiring portion 61*b*. Thus, entry of fluid such as air, water or a chemical liquid to the inside of the metal cover layer 15 from outside of the cover insulating layer 43 is prevented. Therefore, an occurrence of corrosion at the boundary 61*c* between the terminal portion 61*a* and the wiring portion 61*b* of the conductor trace 61, and its vicinity is prevented.

In the above-mentioned method of manufacturing the suspension board 1, the metal cover layer 15 for the connection terminals 21 to 26, 31 to 36 is formed on the terminal portions 61*a* simultaneously with the formation of the metal cover layer 15 for preventing an occurrence of corrosion at the wiring traces 61*b*. In this case, because it is not necessary to independently form the metal cover layer 15 on the wiring portion 61*b* from the formation of the metal cover layer 15 on the terminal portion 61*a*, the number of steps of manufacturing the suspension board 1 is reduced.

[2] Second Embodiment

Figure 10A:
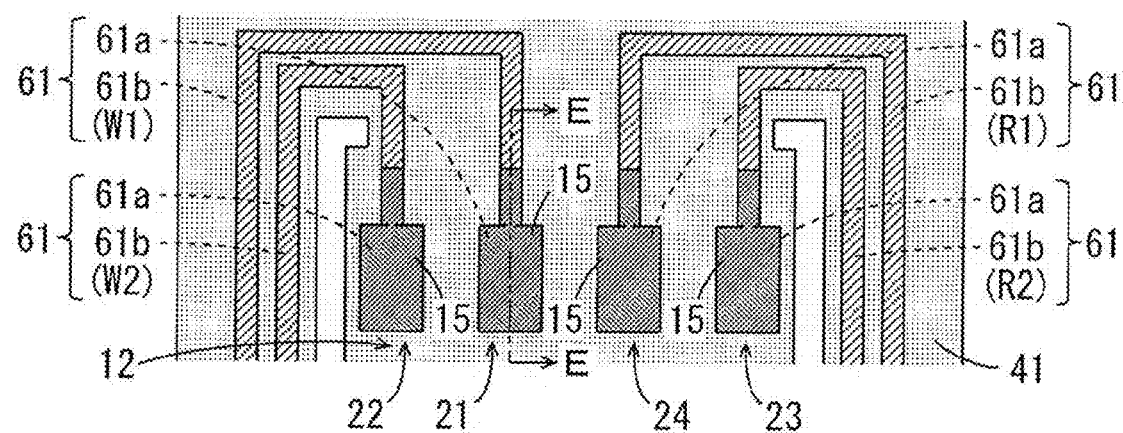
FIGS. 10A and 10B are a plan view and a cross sectional view showing part of a suspension board according to a second embodiment.
Figure 10B:
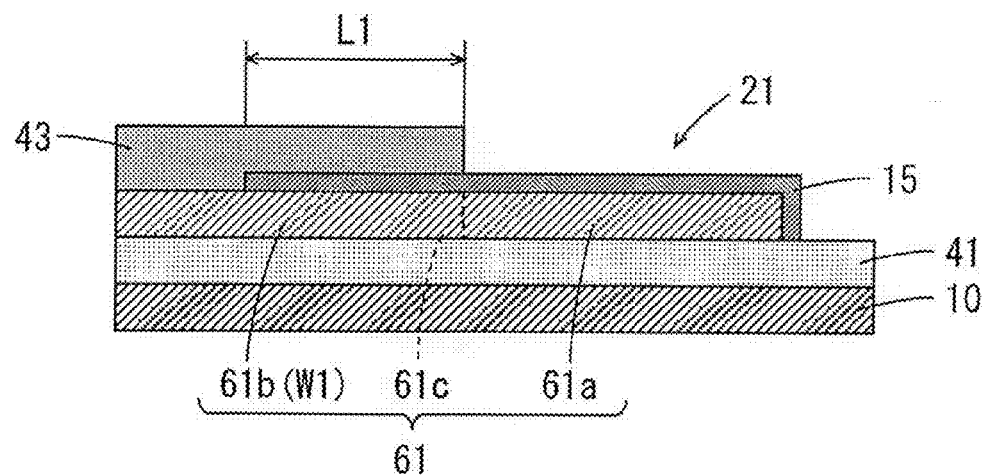

As for the suspension board according to the second embodiment, differences from the suspension board 1 according to the first embodiment will be described. FIGS. 10A and 10B are a plan view and a cross sectional view showing part of the suspension board according to the second embodiment. In FIGS. 10A and 10B, a plan view and a cross sectional view are respectively shown. The plan view of FIG. 10A corresponds to the plan view of FIG. 3A of the first embodiment. The cross sectional view of FIG. 10B shows an enlarged cross sectional view taken along the line E-E of FIG. 10A, and corresponds to the cross sectional view of FIG. 5A of the first embodiment.

Also in the suspension board according to the present embodiment, similarly to the first embodiment, the base insulating layer 41 is formed on the support substrate 10, and the plurality of conductor traces 61 are formed on the base insulating layer 41 with the seed layer (not shown) sandwiched therebetween. The cover insulating layer 43 is formed on the base insulating layer 41 to cover the wiring portions 61*b* of the plurality of conductor traces 61 (see FIG. 4A). In FIG. 10A, the cover insulating layer 43 is not shown.

As shown in each of FIGS. 10A and 10B, in the present embodiment, the metal cover layer 15 is provided to cover the terminal portion 61*a* and part of the wiring portion 61*b* of each conductor trace 61, and continuously extend from the surface of the terminal portion 61a to the surface of the wiring portion 61b. Further, the metal cover layer 15 extends on the surface of the wiring portion 61b to a position at a distance of a distance L1 from the position over the boundary 61c between the terminal portion 61a and the wiring portion 61b.

In the suspension board according to the present embodiment, the metal cover layer 15 is provided to cover the part of the wiring portion 61b of each conductor trace 61. Further, the cover insulating layer 43 is provided to cover a portion of the metal cover layer 15 covering the wiring portion 61b and another portion of the wiring portion 61b not covered by the metal cover layer 15. The metal cover layer 15 comes into contact with the part of the wiring portion 61b, the cover insulating layer 43 comes into contact with the portion of the metal cover layer 15 covering the wiring portion 61b, and comes into contact with the other portion of the wiring portion 61b. In this case, a metal layer having the magnetism as high as or higher than the magnetism of nickel is not present between the wiring portion 61b and the cover insulating layer 43. Therefore, also in the present embodiment, a transmission loss of an electrical signal in a high frequency band can be reduced.

In the present embodiment, the above-mentioned distance L1 is set to 3 μm or more. In this case, in the vicinity of the boundary 61c between the terminal portion 61a and the wiring portion 61b of the conductor trace 61, adhesion between the cover insulating layer 43 and the wiring portion 61b is improved by the metal cover layer 15. Thus, similarly to the first embodiment, entry of fluid such as air, water or a chemical liquid to the inside of the metal cover layer 15 from outside of the cover insulating layer 43 is prevented. Therefore, an occurrence of corrosion at the boundary 61c between the terminal portion 61a and the wiring portion 61b of the conductor trace 61, and its vicinity is prevented.

The above-mentioned distance L1 is preferably set to 5 μm or more. In this case, in the vicinity of the boundary 61c between the terminal portion 61a and the wiring portion 61b of the conductor trace 61, the adhesion between the cover insulating layer 43 and the wiring portion 61b is improved more sufficiently. Therefore, a large void is more unlikely to be generated between the cover insulating layer 43 and the metal cover layer 15. As a result, an occurrence of corrosion at the conductor trace 61 is prevented more sufficiently.

[3] Third Embodiment

Figure 11A:
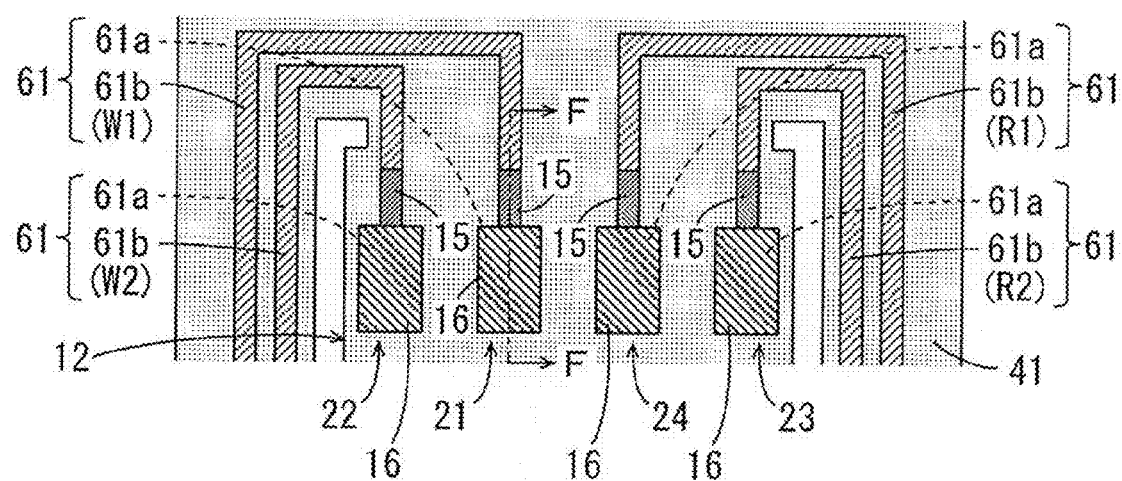
FIGS. 11A and 11B are a plan view and a cross sectional view showing part of a suspension board according to a third embodiment.
Figure 11B:
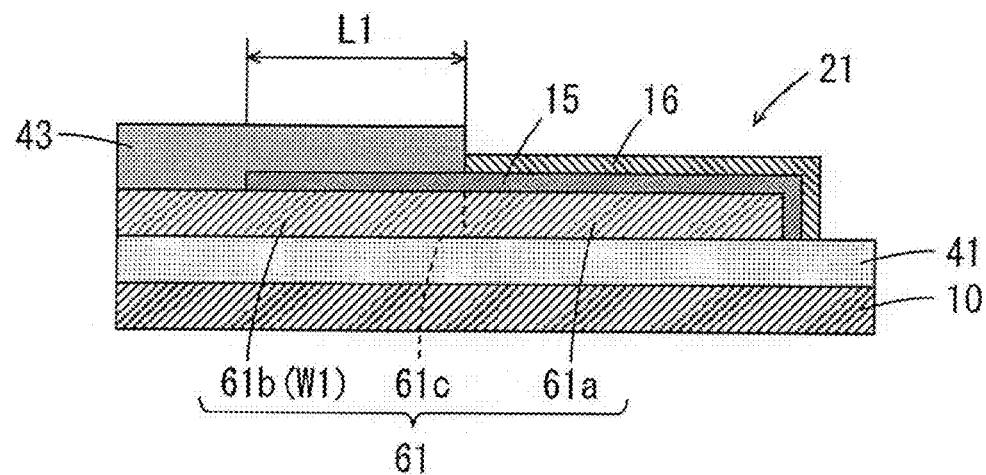

As for the suspension board according to the third embodiment, differences from the suspension board according to the second embodiment will be described. FIGS. 11A and 11B are a plan view and a cross sectional view showing part of the suspension board according to the third embodiment. In FIGS. 11A and 11B, a plan view and a cross sectional view are respectively shown. The plan view of FIG. 11A corresponds to the plan view of FIG. 10A of the second embodiment. The cross sectional view of FIG. 11B shows an enlarged cross sectional view taken along the line F-F of FIG. 11A, and corresponds to the cross sectional view of FIG. 10B of the second embodiment. Similarly to the example of FIG. 10A, the cover insulating layer 43 is not shown in FIG. 11A.

As shown in each of FIGS. 11A and 11B, in the present embodiment, a metal cover layer 16 made of gold, for example, is formed to cover a portion, of the metal cover layer 15 formed on each conductor trace 61, covering the terminal portion 61a. The thickness of the metal cover layer 16 is not less than 0.005 μm and not more than 5 μm, for example, and is preferably not less than 0.01 μm and not more than 3 μm.

In the method of manufacturing the suspension board according to the present embodiment, the cover insulating layer 43 (see FIG. 7A and FIG. 9A) is formed, and then the metal cover layer 16 is formed on the exposed metal cover layer 15 by electrolytic plating, for example. In this case, the connection terminals 21 to 26, 31 to 36 of FIG. 1 are formed of the terminal portions 61a of the conductor traces 61, the metal cover layer 15 and the metal cover layer 16.

In the above-mentioned configuration, even in the case where a surface condition of the metal cover layer 15 is unstable in the process of manufacturing the suspension board, the surface of the metal cover layer 15 on each of the terminal portions 61a is covered by the metal cover layer 16. Thus, the surface condition of the connection terminals 21 to 26, 31 to 36 can be smoothed.

While gold is used as the material for the metal cover layer 16 in the present embodiment, the present invention is not limited to the above-mentioned example. As the material for the metal cover layer 16, any of nickel, silver, chromium, tin and platinum can be used.

[4] Fourth Embodiment

Figure 12A:
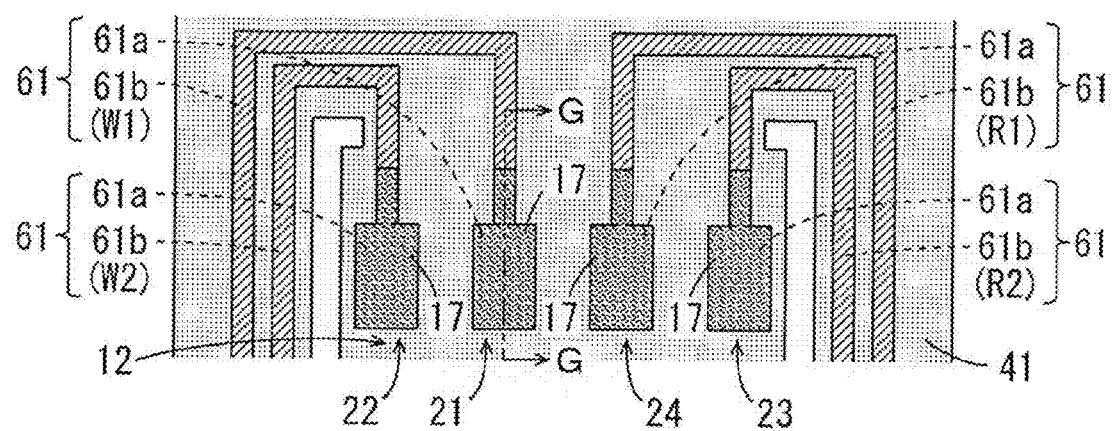
FIGS. 12A and 12B are a plan view and a cross sectional view showing part of a suspension board according to a fourth embodiment.
Figure 12B:
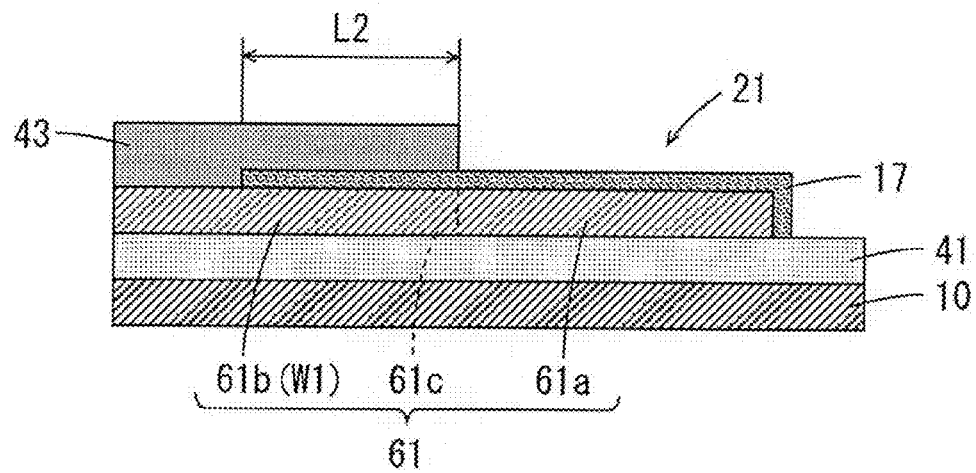

As for the suspension board according to the fourth embodiment, differences from the suspension board according to the second embodiment will be described. FIGS. 12A and 12B are a plan view and a cross sectional view showing part of the suspension board according to the fourth embodiment. In FIGS. 12A and 12B, a plan view and a cross sectional view are respectively shown. The plan view of FIG. 12A corresponds to the plan view of FIG. 10A of the second embodiment. The cross sectional view of FIG. 12B shows an enlarged cross sectional view taken along the line G-G of FIG. 12A, and corresponds to the cross sectional view of FIG. 10B of the second embodiment. Similarly to the example of FIG. 10A, the cover insulating layer 43 is not shown in FIG. 12A.

As shown in each of FIGS. 12A and 12B, in the present embodiment, a metal cover layer 17 made of nickel, for example, is provided instead of the metal cover layer 15 of FIGS. 10A and 10B. In the present embodiment, the metal cover layer 17 is mainly made of the metal having the magnetism as high as or higher than the magnetism of nickel, and is formed by electrolytic plating, electroless plating or sputtering, for example. The thickness of the metal cover layer 17 is not less than 0.005 μm and not more than 5 μm, for example, and is preferably not less than 0.01 μm and not more than 3 μm.

The metal cover layer 17 extends on the surface of the wiring portion 61b to a position at a distance of a distance L2 from the position over the boundary 61c between the terminal portion 61a and the wiring portion 61b. The distance L2 is set to 3 μm or more. Thus, similarly to the second embodiment, in the vicinity of the boundary 61c between the terminal portion 61a and the wiring portion 61b of the conductor trace 61, adhesion between the cover insulating layer 43 and the wiring portion 61b is improved by the metal cover layer 17. Therefore, an occurrence of corrosion at the boundary 61c between the terminal portion 61a and the wiring portion 61b of the conductor trace 61, and its vicinity is prevented.

Figure 13:
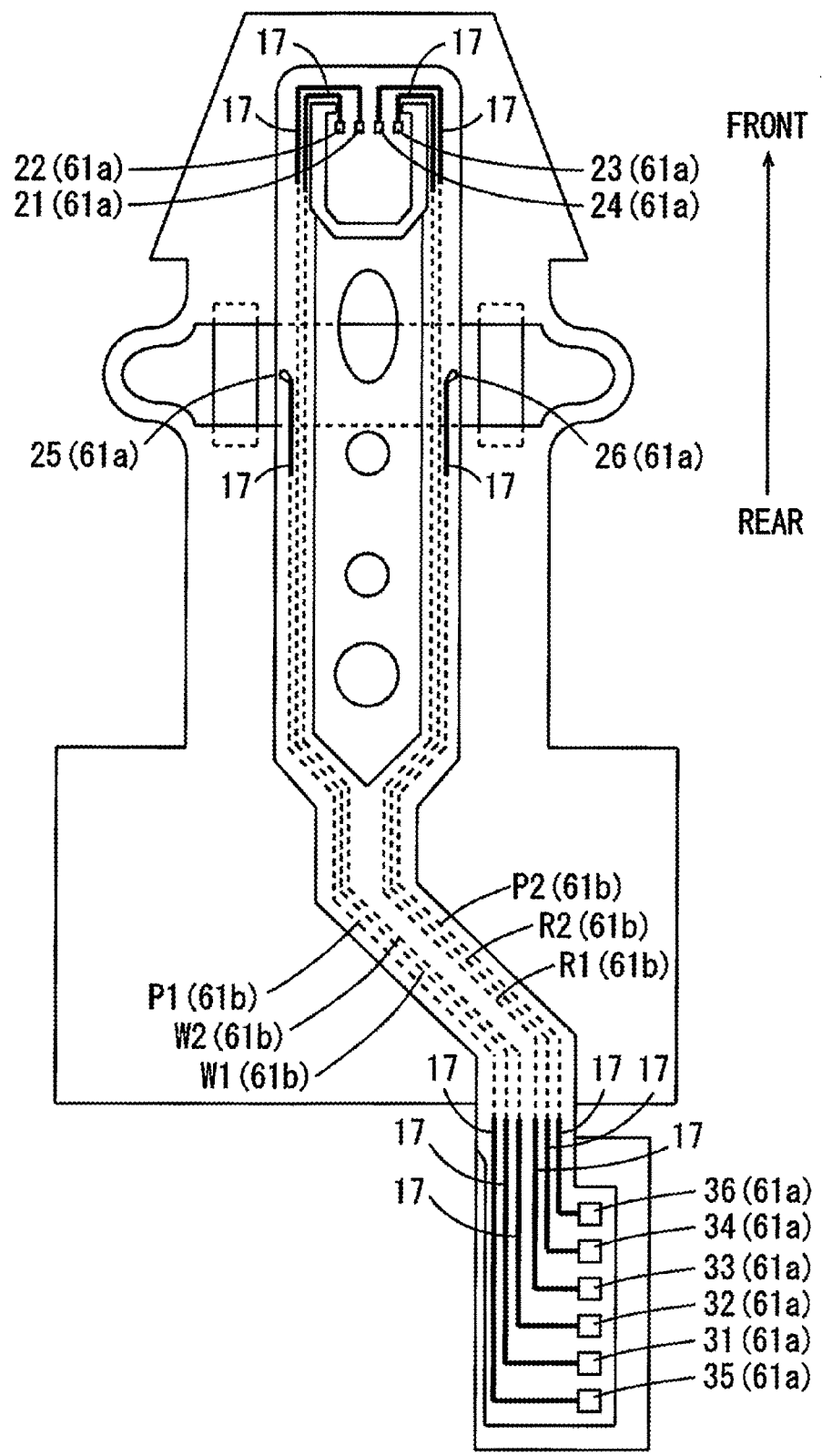
FIG. 13 is a plan view showing another example of the suspension board according to the fourth embodiment.

FIG. 13 is a plan view showing another example of the suspension board according to the fourth embodiment. In FIG. 13, portions of the write wiring traces W1, W2, the read wiring traces R1, R2 and the power wiring traces P1, P2 on which the metal cover layer 17 is formed are indicated by thick solid lines. In the suspension board of FIG. 13, the distance L2 of the metal cover layer 17 is longer than the example of FIGS. 12A and 12B.

In each of the plurality of conductor traces 61 that constitute the write wiring traces W1, W2, the read wiring traces R1, R2 and the power wiring traces P1, P2, a distance between one terminal portion 61a and the other terminal portion 61a of the wiring portion 61b is referred to as a total length of the wiring portion 61b.

In this case, the above-mentioned distance L2 is set such that a ratio of the length of the entire metal cover layer 17 covering the wiring portion 61b to the total length of the wiring portion 61b is 40% or less.

In the above-mentioned configuration, the metal cover layer 17 is provided to cover the terminal portion 61a and part of the wiring portion 61b, and the cover insulating layer 43 is provided to cover a portion of the metal cover layer 17 covering the part of the wiring portion 61b and another portion of the wiring portion 61b not covered by the metal cover layer 17. The metal cover layer 17 comes into contact with the part of the wiring portion 61b, and the cover insulating layer 43 comes into contact with the portion of the metal cover layer 17 covering the wiring portion 61b and comes into contact with the other portion of the wiring portion 61b.

In this case, in a range of the length of 60% or more of the total length of the wiring portion 61b, a metal layer having the magnetism as high as or higher than the magnetism of nickel is not present between the wiring portion 61b and the cover insulating layer 43. As a result of experiments and consideration by the inventors of the present application, it was found that, even in the case where the metal layer having the magnetism as high as or higher than the magnetism of nickel was present between the wiring portion 61b and the cover insulating layer 43 covering the wiring portion 61b, it was possible to reduce a transmission loss of an electrical signal in a high frequency band by setting a ratio of the length of the metal layer to the total length of the wiring portion 61b to 40% or less. Thus, also in the present embodiment, a transmission loss of an electrical signal in a high frequency band can be reduced.

[5] Fifth Embodiment

Figure 14A:
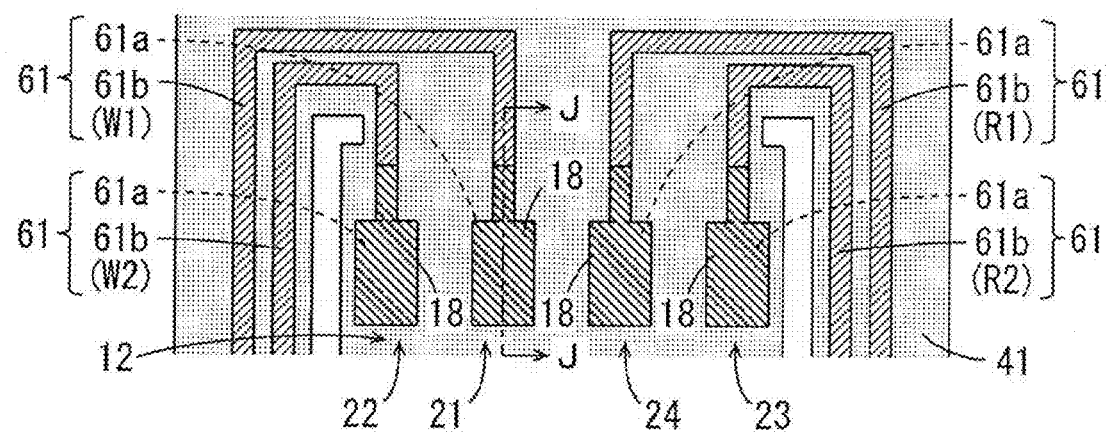
FIGS. 14A and 14B are a plan view and a cross sectional view showing part of a suspension board according to a fifth embodiment.
Figure 14B:
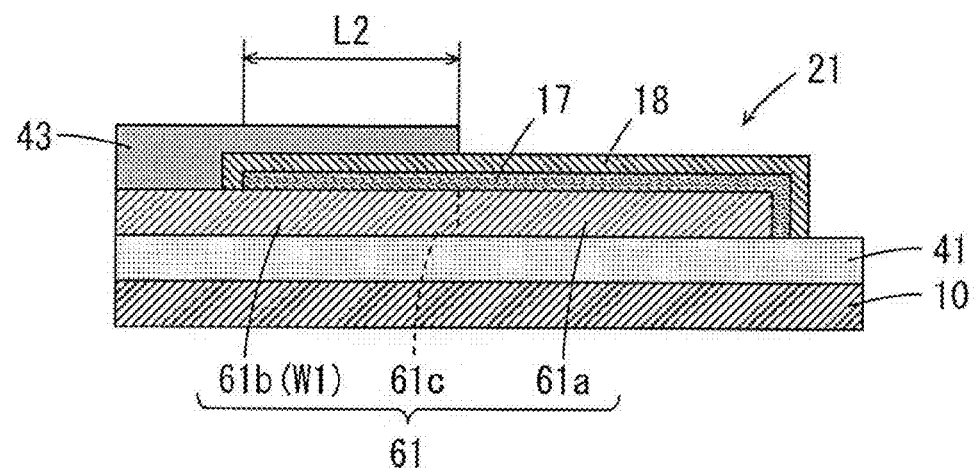

As for the suspension board according to the fifth embodiment, differences from the suspension board according to the fourth embodiment will be described. FIGS. 14A and 14B are a plan view and a cross sectional view showing part of the suspension board according to the fifth embodiment. In FIGS. 14A and 14B, a plan view and a cross sectional view are respectively shown. The plan view of FIG. 14A corresponds to the plan view of FIG. 12A of the fourth embodiment. The cross sectional view of FIG. 14B shows an enlarged cross sectional view taken along the line J-J of FIG. 14A, and corresponds to the cross sectional view of FIG. 12B of the fourth embodiment. Similarly to the example of FIG. 12A, the cover insulating layer 43 is not shown in FIG. 14A.

As shown in each of FIGS. 14A and 14B, in the present embodiment, a metal cover layer 18 is formed to cover the entire metal cover layer 17 of FIGS. 12A and 12B. The thickness of the metal cover layer 18 is not less than 0.005 μm and not more than 5 μm, for example, and is preferably not less than 0.01 μm and not more than 3 μm. As the material for the metal cover layer 18, gold is used, for example. Further, any of nickel, silver, chromium, tin and platinum can be used as the material for the metal cover layer 18.

In the method of manufacturing the suspension board according to the fifth embodiment, the plurality of conductor traces 61 are formed on the base insulating layer 41 with the seed layer (not shown) sandwiched therebetween, and then the metal cover layer 17 and the metal cover layer 18 are sequentially laminated on part of each conductor trace 61. The metal cover layer 17 is formed by electroless plating or sputtering, for example, and the metal cover layer 18 is formed by electrolytic plating, for example. Thereafter, the cover insulating layer 43 is formed on the base insulating layer 41 to cover a portion of the metal cover layer 18 covering the wiring portion 61b and another portion of the wiring portion 61b not covered by the metal cover layers 17, 18.

In the present embodiment, the cover insulating layer 43 comes into contact with the portion of the metal cover layer 18 covering the wiring portion 61b. The metal cover layer 18 extends on the surface of the wiring portion 61b to a position at a distance of the distance L2 from the position over the boundary 61c between the terminal portion 61a and the wiring portion 61b. The distance L2 is set to 3 μm or more. Thus, similarly to the fourth embodiment, in the vicinity of the boundary 61c between the terminal portion 61a and the wiring portion 61b of the conductor trace 61, adhesion between the cover insulating layer 43 and the wiring portion 61b is improved by the metal cover layer 18. Thereafter, an occurrence of corrosion at the boundary 61c between the terminal portion 61a and the wiring portion 61b of the conductor trace 61, and its vicinity is prevented.

Figure 15A:
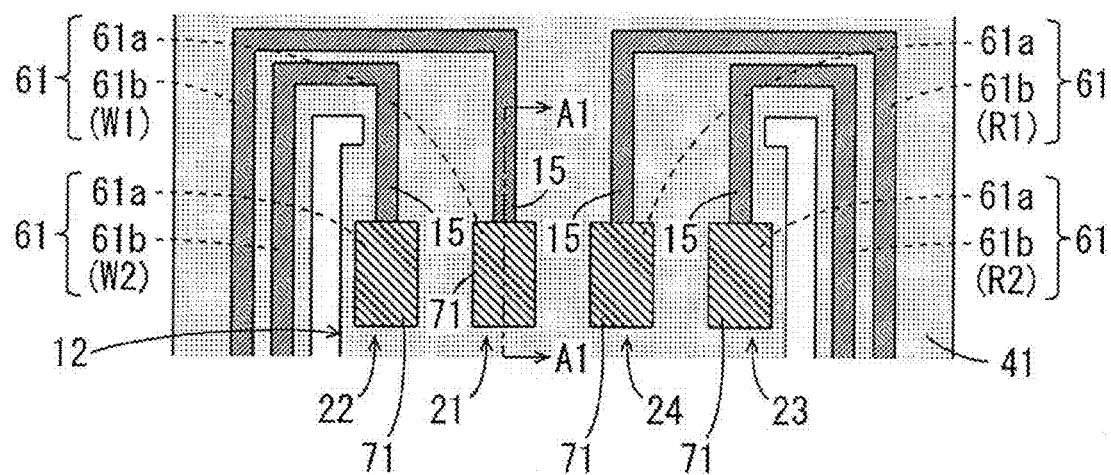
FIGS. 15A and 15B are a plan view and a cross sectional view showing an example of another configuration of the connection terminals in the suspension board according to the first embodiment.
Figure 15B:
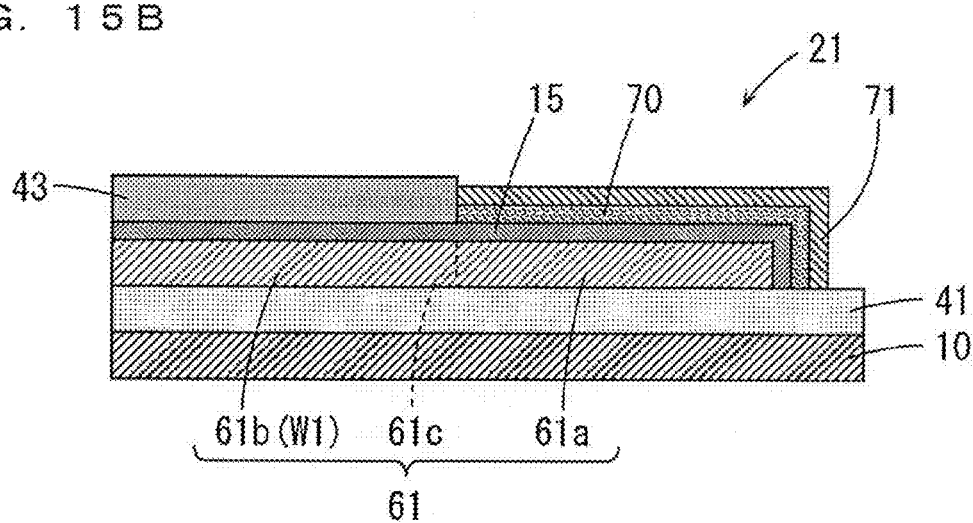

[6] Other Embodiments (1) In the suspension board 1 according to the first embodiment, the connection terminals 21 to 24 may have the following configuration instead of the configuration of FIG. 2A to 5C. FIGS. 15A and 15B are a plan view and a cross sectional view showing another example of the configuration of the connection terminals 21 to 24 in the suspension board 1 according to the first embodiment. In FIGS. 15A and 15B, the plan view and the cross sectional view are shown, respectively. The plan view of FIG. 15A corresponds to the plan view of FIG. 3A of the first embodiment. The cross sectional view of FIG. 15B shows the enlarged cross sectional view taken along the line A1-A1 of FIG. 15A, and corresponds to the cross sectional view of FIG. 5A of the first embodiment. Similarly to the example of FIG. 3A, the cover insulating layer 43 is not shown in FIG. 15A.

As shown in each of FIGS. 15A and 15B, a barrier layer 70 is formed to cover the portion, of the metal cover layer 15 formed on each conductor trace 61, covering the terminal portion 61a. Further, a gold layer 71 is formed to cover the barrier layer 70. In this case, the connection terminals 21 to 24 are formed of the terminal portions 61a of the conductor traces 61, the metal cover layer 15, the barrier layer 70 and the gold layer 71.

The thickness of the barrier layer 70 is not less than 0.2 μm and not more than 4.0 μm, for example, and is preferably not less than 0.5 μm and not more than 3.0 μm. Further, the thickness of the gold layer 71 is not less than 0.02 μm and not more than 1.5 μm, for example, and is preferably not less than 0.05 μm not more than 1.0 μm.

The barrier layer 70 has a function of inhibiting a copper component that diffuses from the surface of the conductor trace 61 to the metal cover layer 15 from further diffusing to the gold layer 71. In order to realize such a function, nickel is used as a material for the barrier layer 70 in the present example. As the barrier layer 70, palladium can be used instead of nickel.

The above-mentioned configuration prevents the copper component of the conductor trace 61 from diffusing to the gold layer 71 exposed outside in the connection terminals 21 to 24. Thus, reductions in corrosion resistance and wettability of the gold layer 71 due to the diffusion of the copper component to the gold layer 71 are inhibited. Therefore, the connection terminals 21 to 24 having good corrosion resistance and good wettability are realized.

Also in the connection terminals 25, 26, 31 to 36, the barrier layer 70 and the gold layer 71 may be provided similarly to the connection terminals 21 to 24 of FIGS. 15A and 15B. Thus, the connection terminals 25, 26, 31 to 36 having good corrosion resistance and good wettability are realized.

Figure 16A:
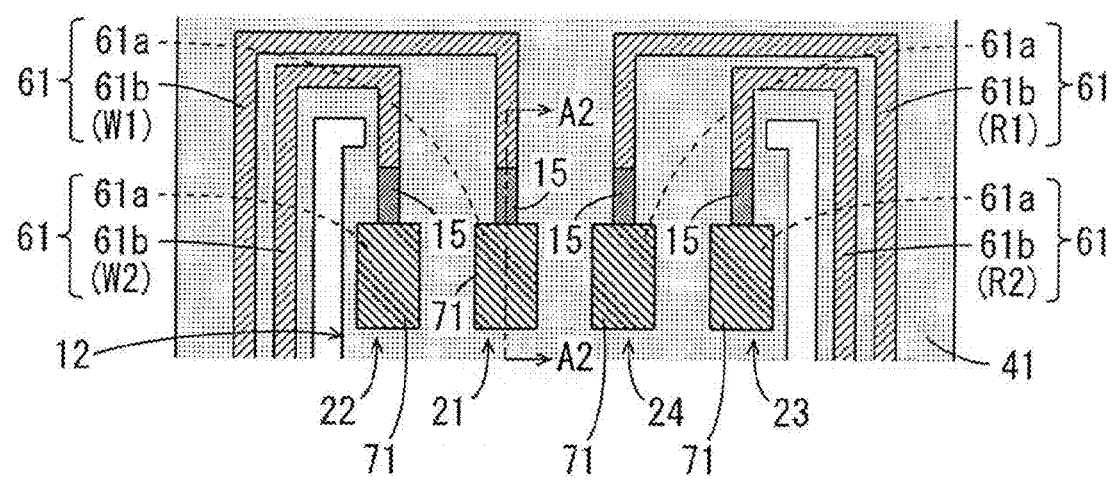
FIGS. 16A and 16B are a plan view and a cross sectional view showing an example of another configuration of the connection terminals in the suspension board according to the second embodiment.
Figure 16B:
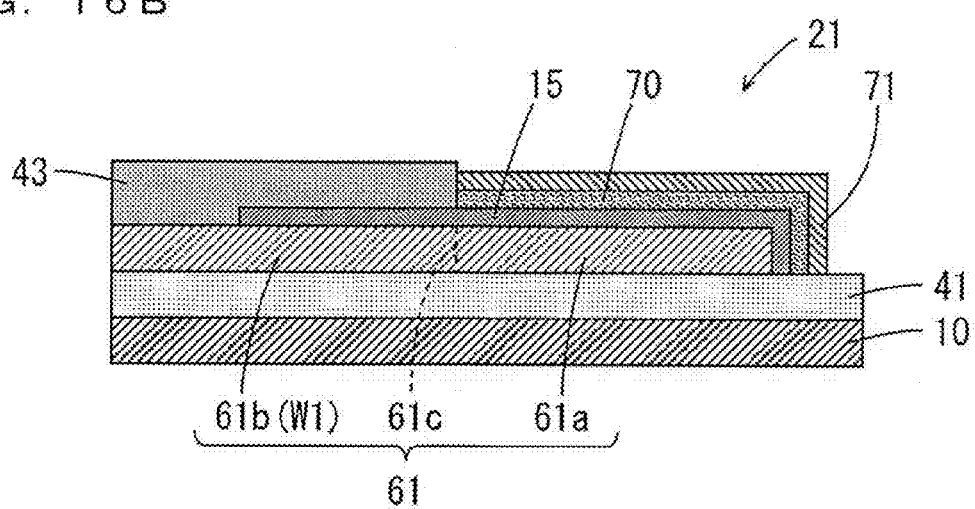

(2) In the suspension board according to the second embodiment, the connection terminals 21 to 24 may have the following configuration instead of the configuration of FIGS. 10A and 10B. FIGS. 16A and 16B are a plan view and a cross sectional view showing another example of the configuration of the connection terminals 21 to 24 in the suspension board according to the second embodiment. In FIGS. 16A and 16B, the plan view and the cross sectional view are shown, respectively. The plan view of FIG. 16A corresponds to the plan view of FIG. 10A of the second embodiment. The cross sectional view of FIG. 16B shows the enlarged cross sectional view taken along the line A2-A2 of FIG. 16A, and corresponds to the cross sectional view of FIG. 10B of the second embodiment. Similarly to the example of FIG. 10A, the cover insulating layer 43 is not shown in FIG. 16A.

As shown in each of FIGS. 16A and 16B, in the present example, the barrier 70 is formed to cover the portion, of the metal cover layer 15 formed on each conductor trace 61, covering the terminal portion 61*a* similarly to the example of FIGS. 15A and 15B. Further, the gold layer 71 is formed to cover the barrier layer 70. Thus, reductions in corrosion resistance and wettability of the gold layer 71 due to the diffusion of the copper component of the conductor trace 61 to the gold layer 71 are inhibited. Therefore, the connection terminals 21 to 24 having good corrosion resistance and good wettability are realized.

Also in the connection terminals 25, 26, 31 to 36, the barrier layer 70 and the gold layer 71 may be provided similarly to the connection terminals 21 to 24 of FIGS. 16A and 16B. Thus, the connection terminals 25, 26, 31 to 36 having good corrosion resistance and good wettability are realized.

(3) In the suspension board according to the fifth embodiment, the connection terminals 21 to 24 may have the following configuration instead of the configuration of FIGS. 14A and 14B. FIGS. 17A and 17B are a plan view and a cross sectional view showing another example of the configuration of the connection terminals 21 to 24 in the suspension board according to the fifth embodiment. In FIGS. 17A and 17B, the plan view and the cross sectional view are shown, respectively. The plan view of FIG. 17A corresponds to the plan view of FIG. 14A of the fifth embodiment. The cross sectional view of FIG. 17B shows the enlarged cross sectional view taken along the line A3-A3 of FIG. 17A, and corresponds to the cross sectional view of FIG. 14B of the fifth embodiment. Similarly to the example of FIG. 14A, the cover insulating layer 43 is not shown in FIG. 17A.

As shown in each of FIGS. 17A and 17B, the barrier layer 70 similar to the examples of FIGS. 15A to 16B is formed to cover the portion, of each of the metal cover layers 17, 18 formed on each conductor trace 61, covering the terminal portion 61*a*. Further, the gold layer 71 is formed to cover the barrier layer 70. In this case, the connection terminals 21 to 24 are formed of the terminal portions 61*a* of the conductor traces 61, the metal cover layers 17, 18 and the barrier layer 70 and the gold layer 71.

The barrier layer 70 of the present example has the function of inhibiting the copper component that diffuses from the surface of the conductor trace 61 to the metal cover layers 17, 18 from further diffusing to the gold layer 71. Thus, reductions in corrosion resistance and wettability of the gold layer 71 due to the diffusion of the copper component of the conductor trace 61 to the gold layer 71 are inhibited. Therefore, the connection terminals 21 to 24 having good corrosion resistance and good wettability are realized.

Also in the connection terminals 25, 26, 31 to 36, the barrier layer 70 and the gold layer 71 may be provided similarly to the connection terminals 21 to 24 of FIGS. 17A and 17B. Thus, the connection terminals 25, 26, 31 to 36 having good corrosion resistance and good wettability are realized.

Figure 18A:
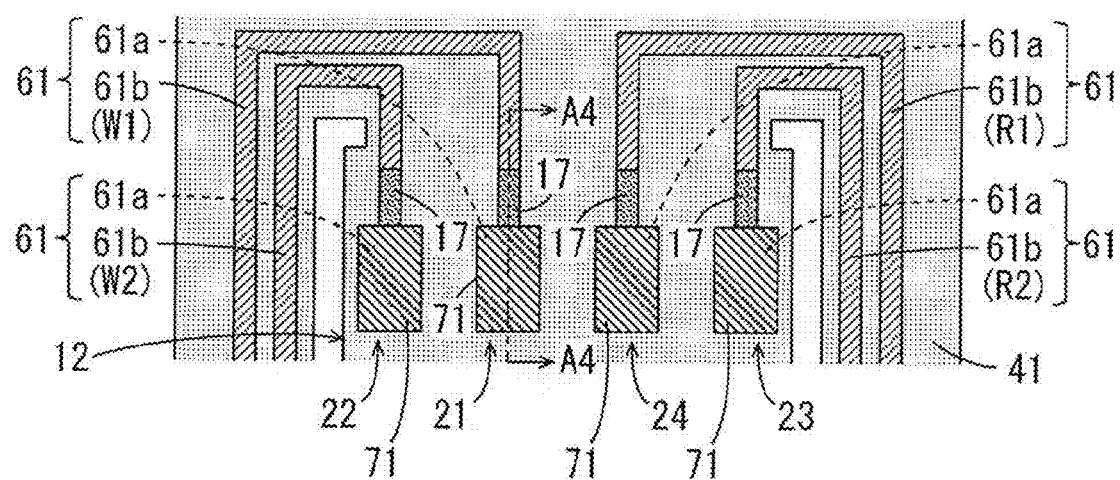
FIGS. 18A and 18B are a plan view and a cross sectional view showing an example of another configuration of the connection terminals in the suspension board according to the fourth embodiment.
Figure 18B:
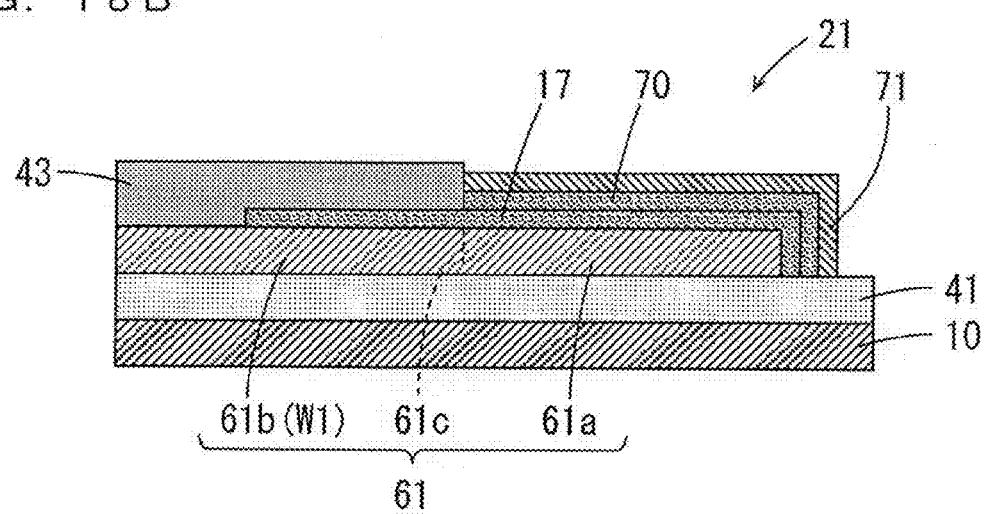

(4) In the suspension board according to the fourth embodiment, the connection terminals 21 to 24 may have the following configuration instead of the configuration of FIGS. 12A and 12B. FIGS. 18A and 18B are a plan view and a cross sectional view showing another example of the configuration of the connection terminals 21 to 24 in the suspension board according to the fourth embodiment. In FIGS. 18A and 18B, the plan view and the cross sectional view are shown, respectively. The plan view of FIG. 18A corresponds to the plan view of FIG. 12A of the fourth embodiment. The cross sectional view of FIG. 18B shows the enlarged cross sectional view taken along the line A4-A4 of FIG. 18A, and corresponds to the cross sectional view of FIG. 12B of the fourth embodiment. Similarly to the example of FIG. 12A, the cover insulating layer 43 is not shown in FIG. 18A.

In the present example, nickel is used as the material for the metal cover layer 17. As shown in each of FIGS. 18A and 18B, the barrier layer 70 made of nickel is formed to cover the portion, of the metal cover layer 17 formed on each conductor trace 61, covering the terminal portion 61*a*. Further, the gold layer 71 is formed to cover the barrier layer 70. In this case, the connection terminals 21 to 24 are formed of the terminal portions 61*a* of the conductor traces 61, the metal cover layer 17, the barrier layer 70 and the gold layer 71.

In the process of manufacturing the suspension board of the present example, the base insulating layer 41 is formed on the support layer 10*a*, and the metal cover layer 17 is formed on part of the conductor trace 61 formed on the base insulating layer 41. The cover insulating layer 43 is formed to overlap with the wiring portion 61*b* of the conductor trace 61, and the opening 11 and the holes H of FIG. 1 are formed in the support layer 10*a*. Thereafter, the barrier layer 70 and the gold layer 71 are sequentially formed on part of the metal cover layer 17 covering the terminal portion 61*a*, and the support layer 10*a* is processed such that an outer shape of the support substrate 10 is formed.

During a period from the time when the cover insulating layer 43 is formed until the time when the gold layer 71 is formed in the above-mentioned manufacturing process, a surface condition of a portion of the metal cover layer 17 not covered by the cover insulating layer 43 is sometimes unstable due to soft etching for removing the seed layer, for example. Even in such a case, the portion of the metal cover layer 17 not covered by the cover insulating layer 43 is covered by the barrier layer 70 in the step afterwards. Therefore, the gold layer 71 can be continuously formed on the barrier layer 70 of which surface condition is smoothed.

Further, the diffusion of the copper component from the conductor trace 61 to the gold layer 71 is sufficiently inhibited by the nickel in the metal cover layer 17 and the barrier layer 70. Therefore, reductions in corrosion resistance and wettability of the gold layer 71 due to the diffusion of the copper component of the conductor trace 61 to the gold layer 71 are inhibited. As a result, the connection terminals 21 to 24 having good corrosion resistance and good wettability are realized.

Also in the connection terminals 25, 26, 31 to 36, the barrier layer 70 and the gold layer 71 may be provided similarly to the connection terminals 21 to 24 of FIGS. 18A and 18B. Thus, the connection terminals 25, 26, 31 to 36 having good corrosion resistance and good wettability are realized.

In the case where the surface condition of the portion of the metal cover layer 17 is not unstable during the period from the time when the cover insulating layer 43 is formed until the time when the gold layer 71 is formed in the above-mentioned manufacturing process, the barrier layer 70 does not have to be provided. The gold layer 71 may be formed on the portion of the metal cover layer 17 covering the terminal portion 61a.

Figure 19A:
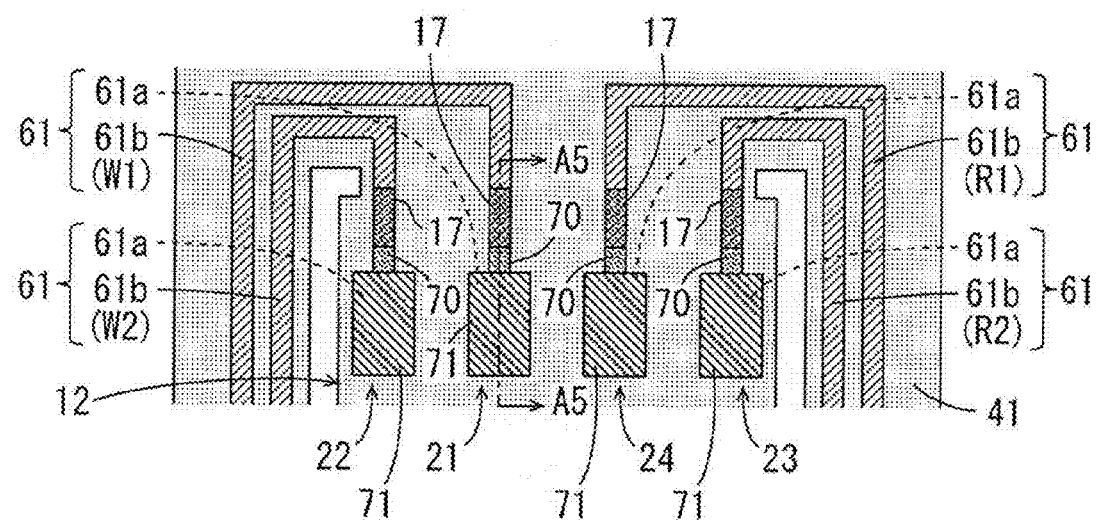
FIGS. 19A and 19B are a plan view and a cross sectional view showing an example of yet another configuration of the connection terminals in the suspension board according to the fourth embodiment.
Figure 19B:
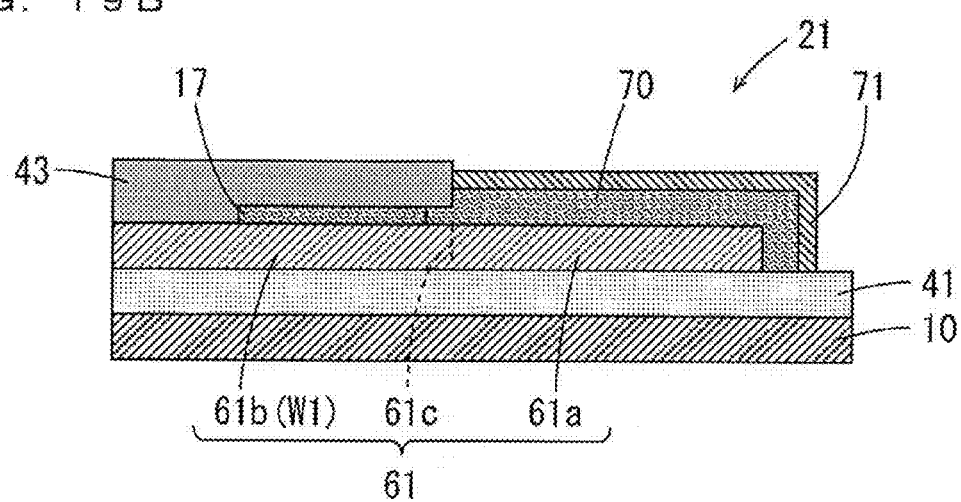

(5) In the suspension board according to the fourth embodiment, the connection terminals 21 to 24 may have the following configuration instead of the configuration of FIGS. 12A and 12B. FIGS. 19A and 19B are a plan view and a cross sectional view showing an example of yet another configuration of the connection terminals 21 to 24 in the suspension board according to the fourth embodiment. In FIGS. 19A and 19B, the plan view and the cross sectional view are shown, respectively. The plan view of FIG. 19A corresponds to the plan view of FIG. 12A of the fourth embodiment. The cross sectional view of FIG. 19B shows the enlarged cross sectional view taken along the line A5-A5 of FIG. 19A, and corresponds to the cross sectional view of FIG. 12B of the fourth embodiment. Similarly to the example of FIG. 12A, the cover insulating layer 43 is not shown in FIG. 19A.

In the present example, nickel is used as the material for the metal cover layer 17 similarly to the example of FIGS. 18A and 18B. As shown in each of FIGS. 19A and 19B, the metal cover layer 17 is formed to cover part of the wiring portion 61b except for the boundary 61c and its vicinity of the conductor trace 61. The barrier layer 70 is formed to cover the boundary 61c and its vicinity, and the terminal portion 61a of the conductor trace 61 that are not covered by the metal cover layer 17. The barrier layer 70 of the present example is made of the same material as the metal cover layer 17. The gold layer 71 is formed to cover a portion of the barrier layer 70 covering the terminal portion 61a. In this case, the connection terminals 21 to 24 are formed of the terminal portions 61a of the conductor traces 61, the barrier layer 70 and the gold layer 71.

In the process of manufacturing the suspension board of the present example, the base insulating layer 41 is formed on the support layer 10a, and the metal cover layer 17 is formed on part of the conductor trace 61 formed on the base insulating layer 41. The cover insulating layer 43 is formed to overlap with the wiring portion 61b of the conductor trace 61, and then a portion of the metal cover layer 17 not covered by the cover insulating layer 43 is removed by etching. At this time, a portion of the metal cover layer 17 positioned in the vicinity of the boundary 61c is also removed. Subsequently, the opening 11 and the holes H of FIG. 1 are formed in the support layer 10a. Thereafter, the barrier layer 70 and the gold layer 71 are formed to cover the boundary 61c and its vicinity, and the terminal portion 61a of the exposed conductor trace 61, and the support layer 10a is processed such that the outer shape of the support substrate 10 is formed.

During a period from the time when the cover insulating layer 43 is formed until the time when the barrier layer 70 is formed in the above-mentioned manufacturing process, the metal cover layer 17 that covers the boundary 61c and its vicinity, and the terminal portion 61a of the conductor trace 61 is removed. Thereafter, the barrier layer 70 and the gold layer 71 are sequentially formed on the exposed conductor trace 61. In this case, the gold layer 71 can be continuously formed on the barrier layer 70 of which the surface condition is smoothed. Further, the diffusion of the copper component from the conductor trace 61 to the gold layer 71 is sufficiently inhibited by the nickel in the barrier layer 70. Thus, reductions in corrosion resistance and wettability of the gold layer 71 due to the diffusion of the copper component of the conductor trace 61 to the gold layer 71 are inhibited. Therefore, the connection terminals 21 to 24 having good corrosion resistance and good wettability are realized.

In the example of FIGS. 19A and 19B, the metal cover layer 17 and the barrier layer 70 formed on the conductor trace 61 are made of the same nickel, and integrally formed. The barrier layer 70 covering the terminal portion 61a functions as part of the metal cover layer 17. The boundary 61c and its vicinity of the conductor trace 61 are continuously covered by the metal cover layer 17 and the barrier layer 70. Thus, also in the present example, entry of fluid such as air, water or a chemical liquid to the inside of the metal cover layer 17 from outside of the cover insulating layer 43 is prevented. The connection terminals 25, 26, 31 to 36 may have the configuration similar to the connection terminals 21 to 24 of FIGS. 19A and 19B. Thus, the connection terminals 25, 26, 31 to 36 having good corrosion resistance and good wettability are realized.

(6) In the suspension board according to the fifth embodiment, the connection terminals 21 to 24 may have the following configuration instead of the configuration of FIGS. 14A and 14B. FIGS. 20A and 20B are a plan view and a cross sectional view showing an example of yet another configuration of the connection terminals 21 to 24 in the suspension board according to the fifth embodiment. In FIGS. 20A and 20B, the plan view and the cross sectional view are shown, respectively. The plan view of FIG. 20A corresponds to the plan view of FIG. 14A of the fifth embodiment. The cross sectional view of FIG. 20B shows the enlarged cross sectional view taken along the line A6-A6 of FIG. 20A, and corresponds to the cross sectional view of FIG. 14B of the fifth embodiment. Similarly to the example of FIG. 14A, the cover insulating layer 43 is not shown in FIG. 20A.

In the present example, nickel is used as the material for the metal cover layer 17, and gold is used as the material for the metal cover layer 18. As shown in FIG. 20B, the metal cover layer 18 is formed not to come into contact with the conductor trace 61. In this case, the metal cover layer 17 made of nickel inhibits the diffusion of the copper component of the conductor trace 61 to the metal cover layer 18.

Thus, reductions in corrosion resistance and wettability of the metal cover layer 18 caused by the diffusion of the copper component of the conductor trace 61 to the metal cover layer 18 are inhibited. Therefore, the connection terminals 21 to 24 having good corrosion resistance and good wettability are realized.

In the process of manufacturing the suspension board of the present example, when the metal cover layer 18 is formed after the formation of the metal cover layer 17 on part of the conductor trace 61, a mask is formed on an end surface of the metal cover layer 17 and a surface portion of the conductor trace 61 not covered by the metal cover layer 17. In this state, the metal cover layer 18 is formed to cover the metal cover layer 17. Thereafter, the mask is removed. Thus, the metal cover layer 18 can be formed such that the metal cover layer 18 and the conductor trace 61 do not come into contact with each other.

The connection terminals 25, 26, 31 to 36 may have the similar configuration to the connection terminals 21 to 24 of FIGS. 20A and 20B. Thus, the connection terminals 25, 26, 31 to 36 having good corrosion resistance and good wettability are realized.

(7) While portions of the support substrate 10 with which the connection terminals 21 to 26, 31 to 36 overlap have a constant thickness in the suspension boards according to the above-mentioned first to fifth embodiments, the present invention is not limited to this. An opening may be formed in a portion of the support substrate 10 with which any of the connection terminals 21 to 26, 31 to 36 overlaps. Further, in each of the suspension boards according to the above-mentioned first to fifth embodiments, portions of the base insulating layer 41 with which the connection terminals 21 to 26, 31 to 36 overlap have a constant thickness. However, the present invention is not limited to this. A recess may be formed at a portion of the base insulating layer 41 with which any of the connection terminals 21 to 26, 31 to 36 overlaps.

Figure 21:
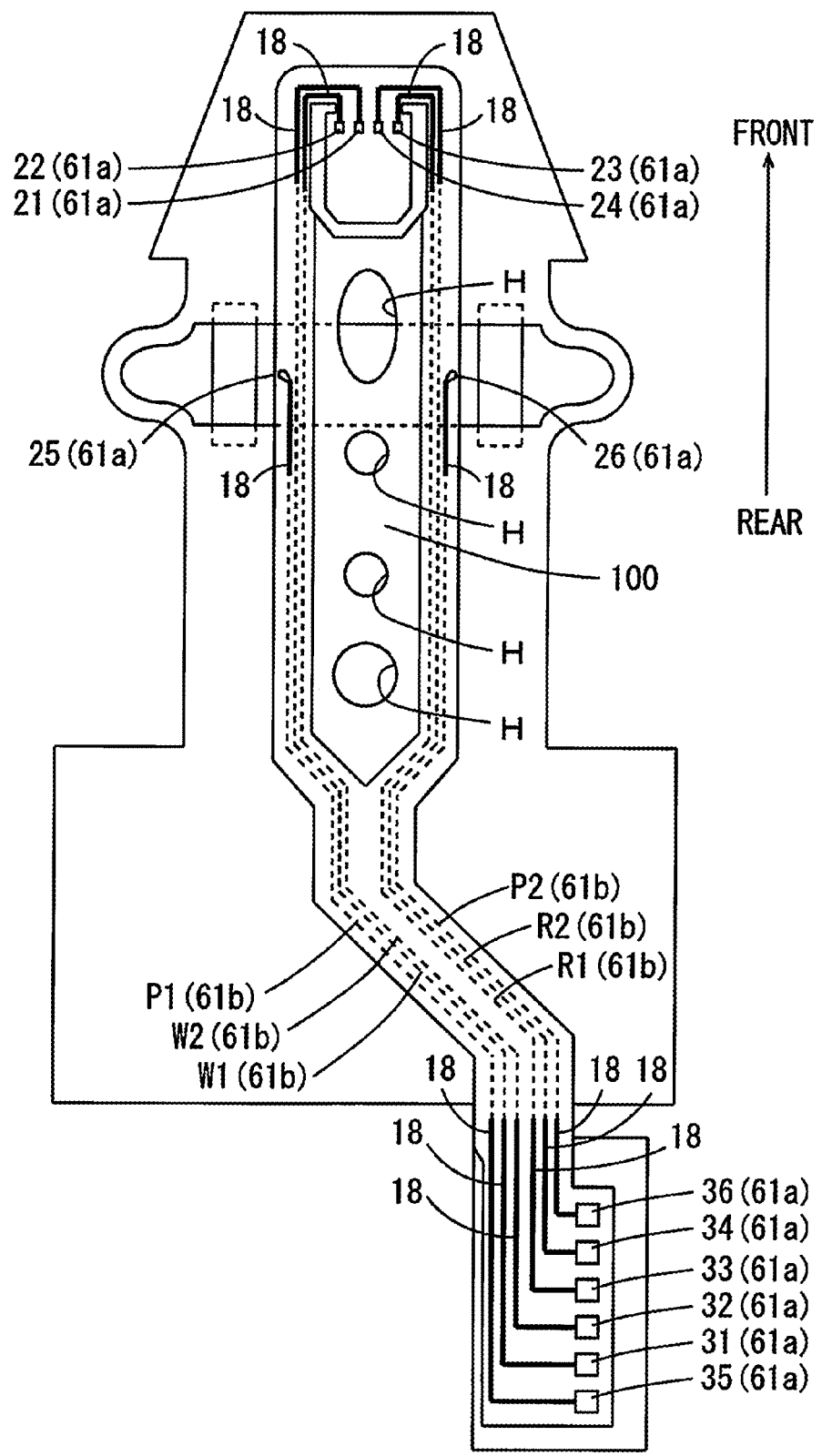
FIG. 21 is a plan view of a suspension board according to other embodiments.

FIG. 21 is a plan view of a suspension board according to another embodiment. The suspension board of FIG. 21 basically has the same configuration as the suspension board according to the fifth embodiment. In FIG. 21, portions of the write wiring traces W1, W2, the read wiring traces R1, R2 and the power wiring traces P1, P2 on which the metal cover layer 18 is formed are indicated by thick solid lines. As for the suspension board of FIG. 21, differences from the suspension board according to the fifth embodiment will be described below.

Figure 22A:
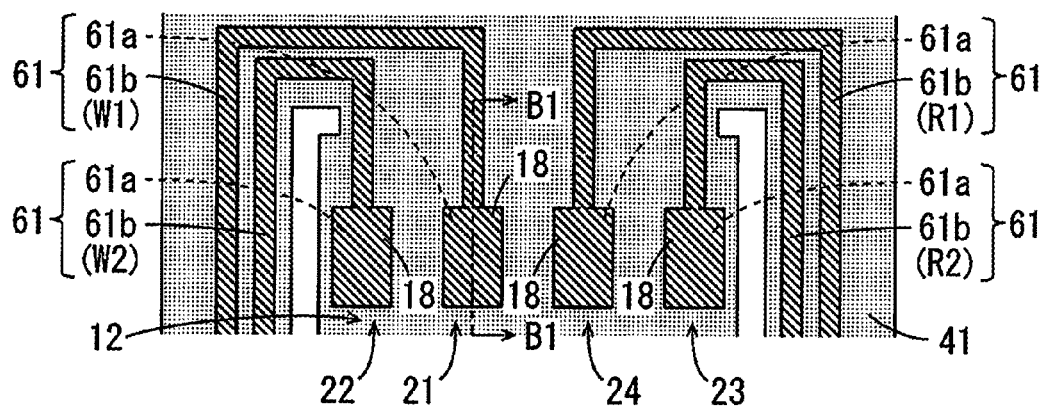
FIGS. 22A to 22C are plan views of connection terminals and their peripheral portions of the suspension board of FIG. 21.

FIGS. 22A to 22O are plan views of the connection terminals 21 to 26, 31 to 36 and their peripheral portions. FIGS. 23A to 23O are cross sectional views of the connection terminals 21 to 26, 31 to 36 and their peripheral portions. Scales of FIGS. 22A to 22C are different from one another, and scales of FIGS. 23A to 23C are different from one another.

Figure 22B:
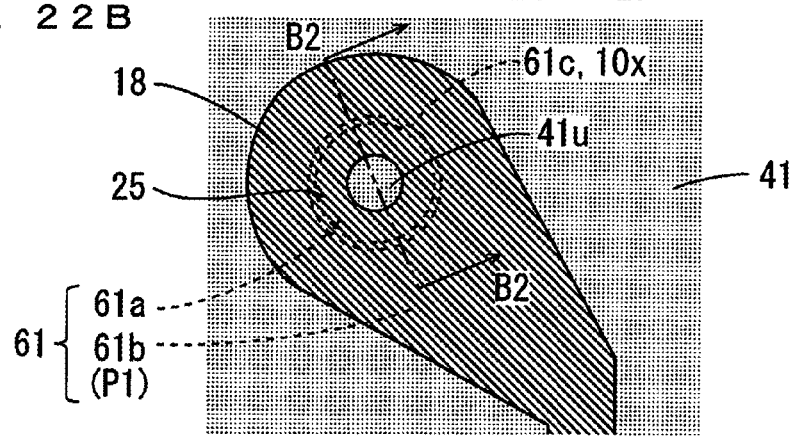
Figure 22C:
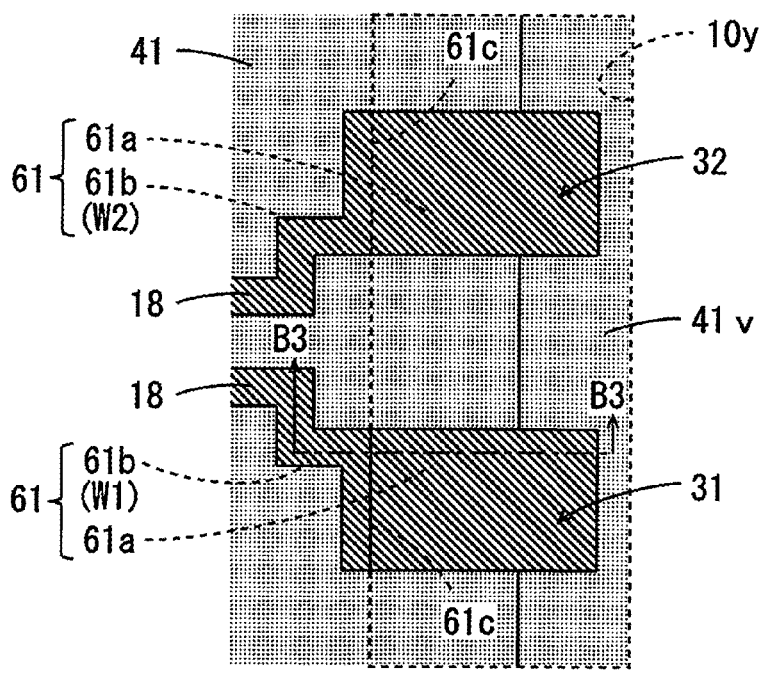
Figure 23A:
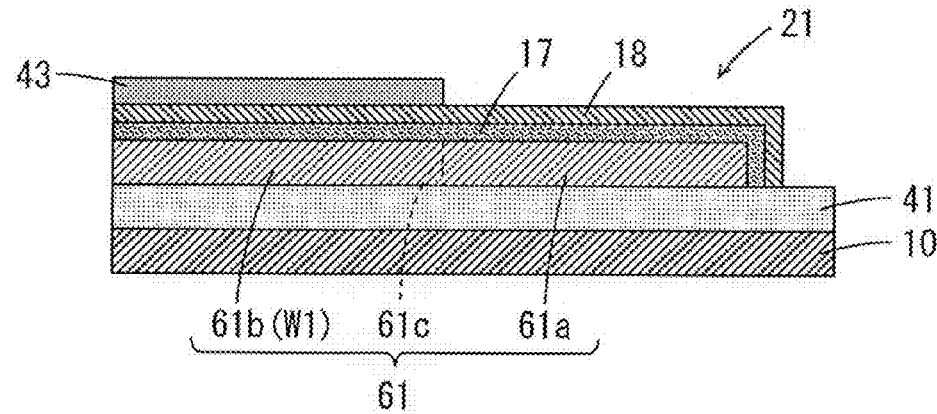
FIGS. 23A to 23C are cross sectional views of the connection terminals and their peripheral portions of the suspension board of FIG. 21.

FIG. 22A shows the connection terminals 21 to 24 and their peripheral portions of FIG. 21, FIG. 22B shows the connection terminal 25 and its peripheral portions of FIG. 21, and FIG. 22C shows the connection terminals 31, 32 and their peripheral portions of FIG. 21. In each of FIGS. 22A to 22C, the cover insulating layer 43 (see FIGS. 23A to 23C) is not shown. The connection terminal 26 has the configuration similar to the connection terminal 25, and the connection terminals 33 to 36 have the configuration similar to the connection terminals 31, 32. FIGS. 23A to 23C respectively show an enlarged cross sectional view taken along the line B1-B1 of FIG. 22A, an enlarged cross sectional view taken along the line B2-B2 of FIG. 22B, and an enlarged cross sectional view taken along the line B3-B3 of FIG. 22C.

As shown in each of FIGS. 22A and 23A, the configuration of the connection terminals 21 to 24 and their peripheral portions is the same as the configuration of the connection terminals 21 to 24 and their peripheral portions according to the fifth embodiment (see FIGS. 14A and 14B).

Figure 23B:
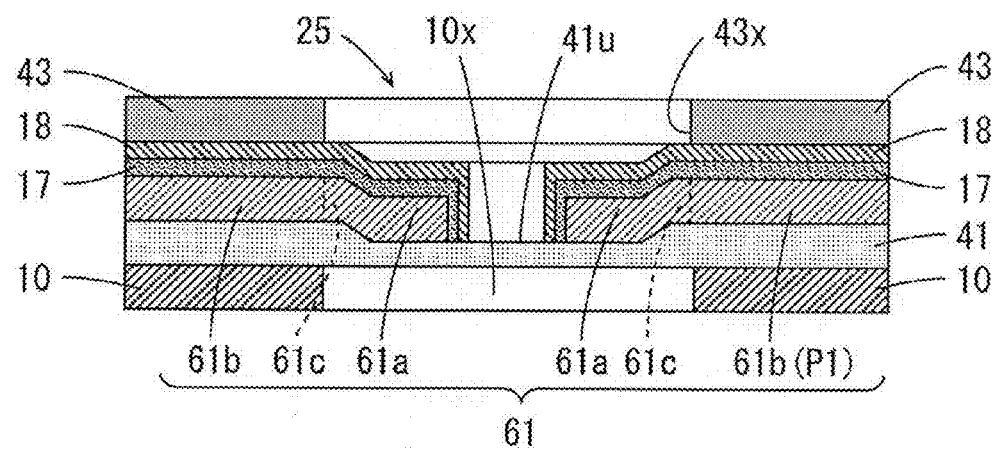
Figure 23C:
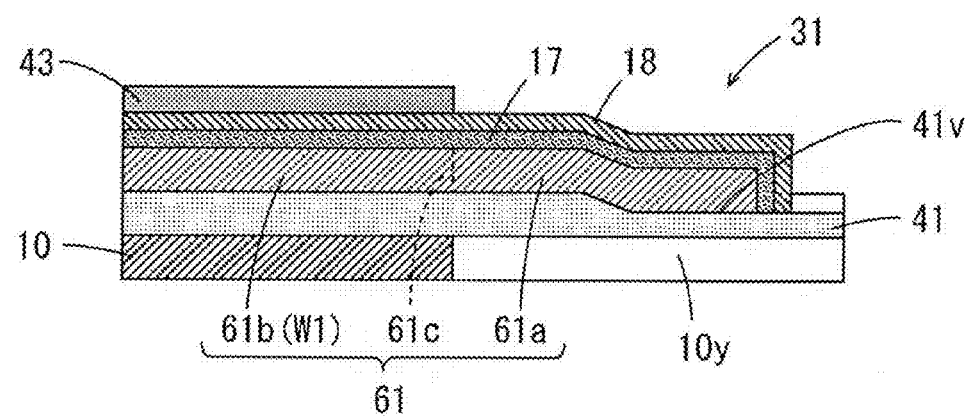

As shown in each of FIGS. 22B and 23B, the connection terminal 25 is formed to be exposed upward through a circular opening 43x (FIG. 23B) formed in the cover insulating layer 43. Further, the connection terminal 25 is formed of the terminal portion 61a of the conductor trace 61, and the metal cover layers 17, 18. The terminal portion 61a that constitutes the connection terminal 25 of the present example is annular. Further, the metal cover layers 17, 18 are formed to cover an inner peripheral surface and an upper surface of the terminal portion 61a. A circular recess 41u corresponding to the boundary 61c of the conductor trace 61 is formed at a portion of the base insulating layer 41 overlapping with the terminal portion 61a. Further, a circular opening 10x corresponding to the boundary 61c of the conductor trace 61 is formed at a portion of the support substrate 10 overlapping with the terminal portion 61a.

As shown in each of FIGS. 22C and 23C, in the connection terminal 31 and its peripheral portions, a recess 41v is formed in a rectangular region of the base insulating layer 41 overlapping with the terminal portion 61a. Further, a rectangular opening 10y is formed in a portion of the support substrate 10 overlapping with the terminal portion 61a.

The method of manufacturing the suspension board of FIG. 21 will be described. FIGS. 24A to 28C are schematic diagrams showing the steps of manufacturing the suspension board of FIG. 21. Each of FIGS. 24A, 25A, 26A, 27A and 28A corresponds to the enlarged cross sectional view taken along the line B1-B1 of FIG. 22A, each of FIGS. 24B, 25B, 26B, 27B and 28B corresponds to the enlarged cross sectional view taken along the line B2-B2 of FIG. 22B, and each of FIGS. 24C, 25C, 26C, 27C and 28C corresponds to the enlarged cross sectional view taken along the line B3-B3 of FIG. 22C.

First, as shown in each of FIGS. 24A to 24C, the base insulating layer 41 made of polyimide is formed on the support layer 10a made of a stainless steel, whereby a two-layer substrate made of the support layer 10a and the base insulating layer 41 is formed. Further, as shown in each of FIGS. 24B and 24C, each of the recesses 41u, 41v is formed in a predetermined region of the base insulating layer 41 that is to overlap with each of the connection terminals 25, 26, 31 to 36. The recesses 41u, 41v can be formed by a graduation exposure technique, a laser processing technique or an etching technique, for example.

Next, as shown in each of FIGS. 25A to 25C, a plurality of conductor traces 61 made of copper are formed on the base insulating layer 41 with the seed layer (not shown) sandwiched therebetween. The write wiring traces W1, W2, the read wiring portions R1, R2 and the power wiring traces P1, P2 are formed on the base insulating layer 41 by the wiring portions 61b of the six conductor traces 61.

Figure 26A:
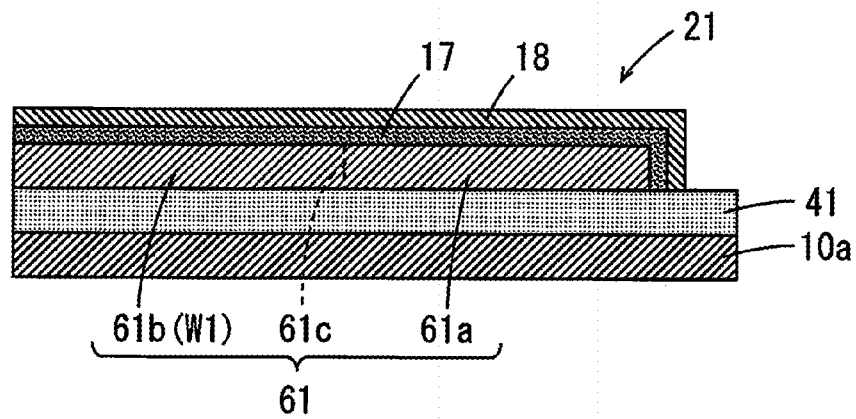
FIGS. 26A to 26C are schematic views showing a step of manufacturing the suspension board of FIG. 21.
Figure 26B:
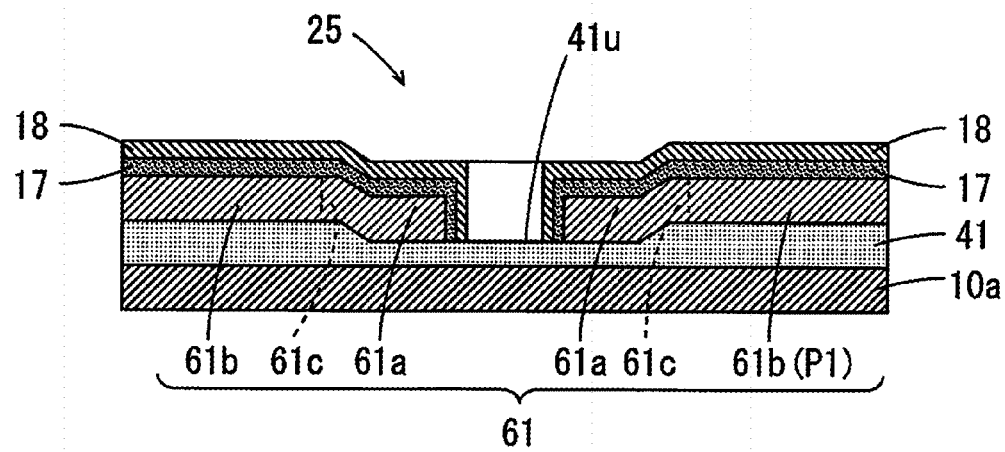
Figure 26C:
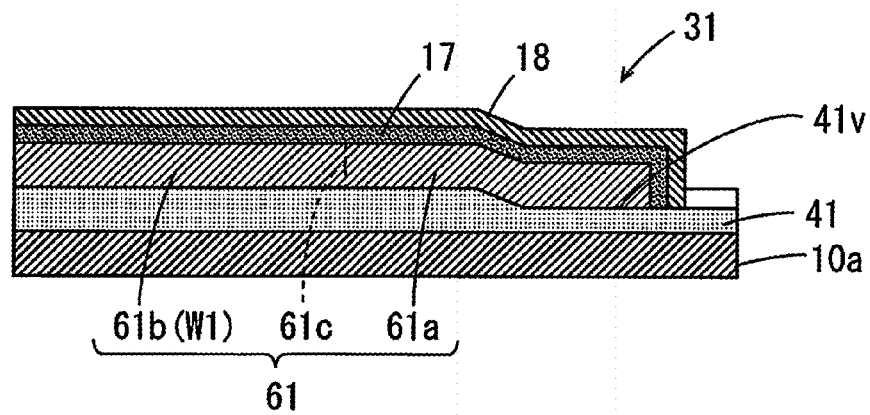

Then, as shown in each of FIGS. 26A to 26C, the metal cover layer 17 made of nickel is formed to cover the terminal portion 61a and the part of wiring portion 61b of each conductor trace 61, and continuously extend from the surface of the terminal portion 61a to the surface of part of the wiring portion 61b. Further, the metal cover layer 18 made of gold is formed to cover the metal cover layer 17. Thus, the connection terminals 21 to 26, 31 to 36 are formed.

Figure 27A:
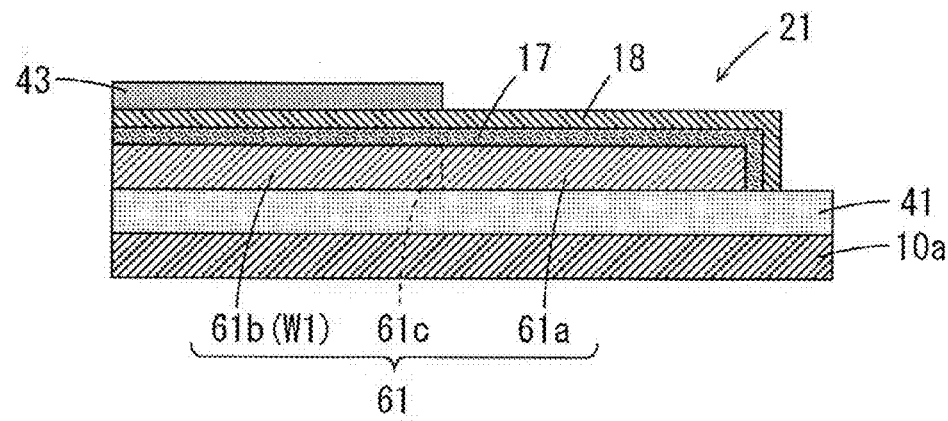
FIGS. 27A to 27C are schematic views showing a step of manufacturing the suspension board of FIG. 21.
Figure 27B:
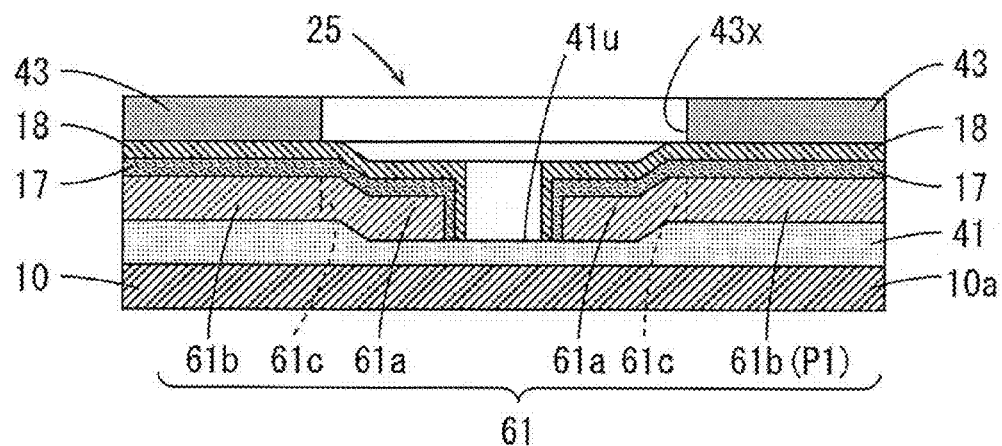
Figure 27C:
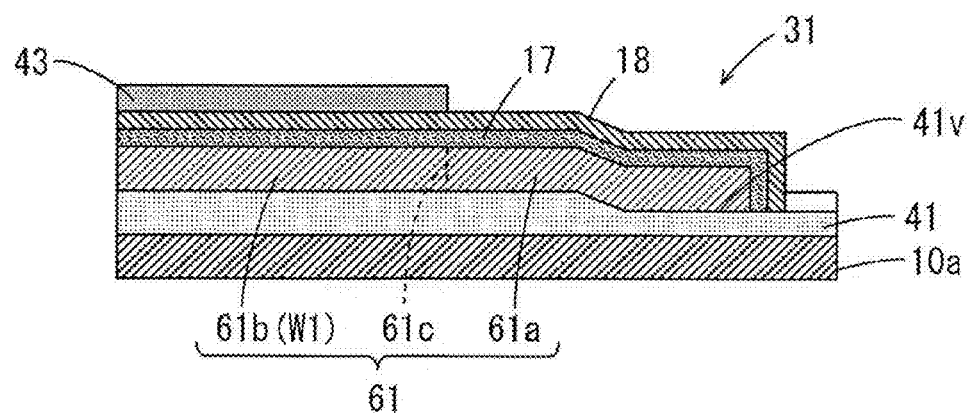

Next, as shown in each of FIGS. 27A to 27C, the cover insulating layer 43 made of polyimide, for example, is formed on the base insulating layer 41 to cover a portion of each of the metal cover layers 17, 18 covering the wiring portion 61b and not to cover a portion of each of the metal cover layers 17, 18 covering the terminal portion 61a.

Figure 28A:
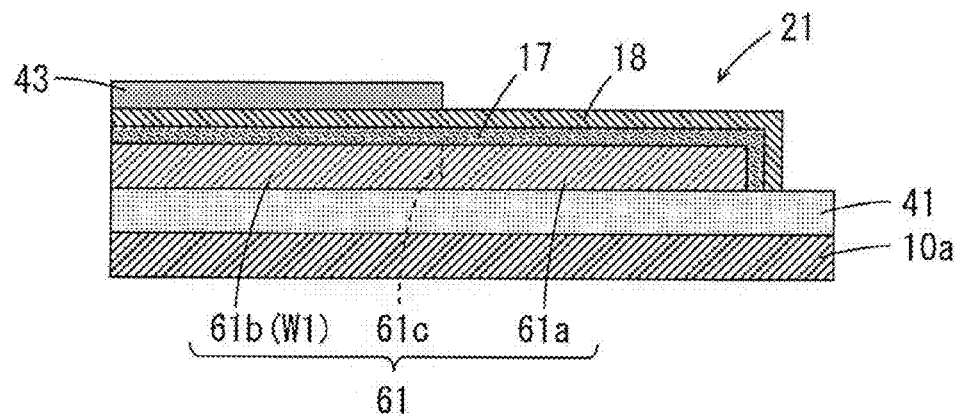
FIGS. 28A to 28C are schematic views showing a step of manufacturing the suspension board of FIG. 21.
Figure 28B:
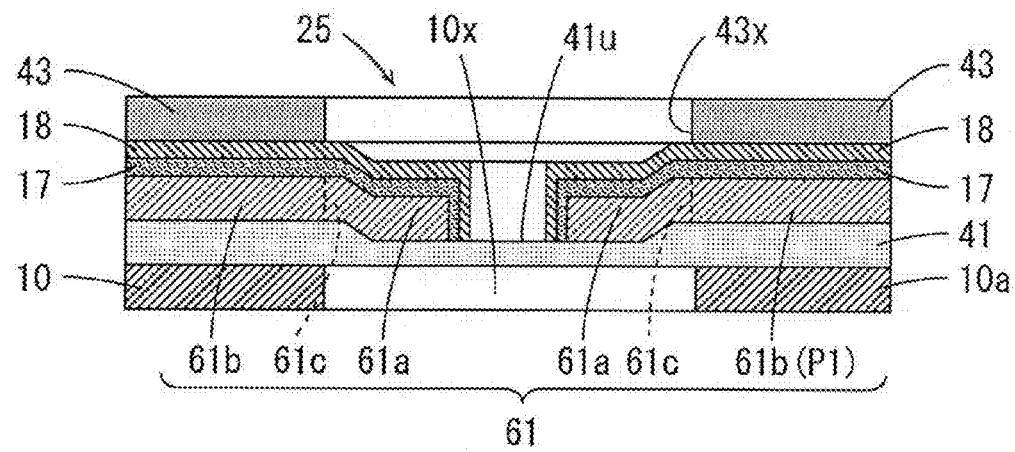
Figure 28C:
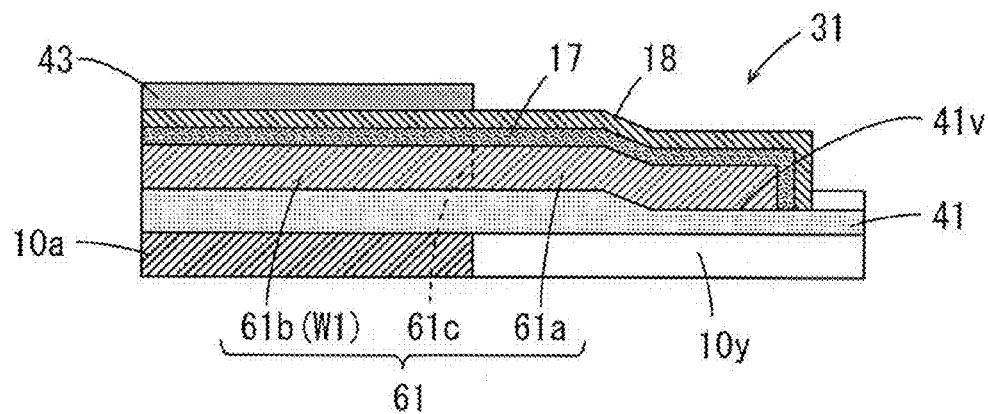

Thereafter, as shown in each of FIGS. 28A to 28C, each of openings 10x, 10y is formed in a predetermined portion of the support layer 10a overlapping with the terminal portion 61a simultaneously with the formation of the opening 11 and the holes H of FIG. 1 in the support layer 10a.

Finally, the support layer 10a is processed such that a portion of the support layer 10a overlapping with the base insulating layer 41 remains, whereby the support substrate 10 is formed. Thus, the suspension board is completed.

In the above-mentioned suspension board of FIG. 21, the metal cover layer 18 may be formed not to come into contact with the conductor trace 61. Thus, similarly to the example of FIGS. 20A and 20B, the connection terminals 21 to 26, 31 to 36 having good corrosion resistance and good wettability are realized. Further, in the above-mentioned suspension board of FIG. 21, the connection terminals 21 to 26, 31 to 36 are completed in the step before the formation of the cover insulating layer 43. Thus, it is not necessary to perform plating for the terminals before the step where the support layer 10a is processed and the support substrate 10 is formed after the step of FIGS. 28A to 28C. Therefore, an increase in number of manufacturing steps is inhibited.

Further, each of the connection terminals 21 to 26, 31 to 36 of the present example has the simple configuration that the two metal cover layers 17, 18 are laminated on the conductor trace 61. Therefore, even in the case where the suspension board is cleaned with ultrasonic waves, the connection terminals 21 to 26, 31 to 36 are unlikely to be damaged by the impact of the ultrasonic waves.

In the above-mentioned suspension board of FIG. 21, an opening may be formed in a portion of the base insulating layer 41 with which any of the connection terminals 21 to 26, 31 to 36 overlaps instead of each of the recesses 41u, 41v. FIGS. 29A to 29C and 30A to 30C are diagrams showing an example where an opening is formed in part of the base insulating layer 41 in the suspension board of FIG. 21.

Figure 29A:
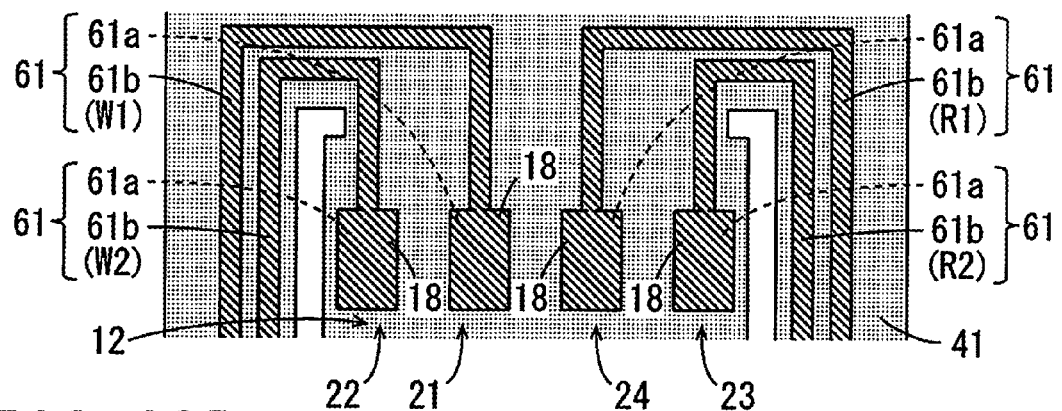
FIGS. 29A to 29C are diagrams showing an example where openings are formed in parts of a base insulating layer in the suspension board of FIG. 21.
Figure 29B:
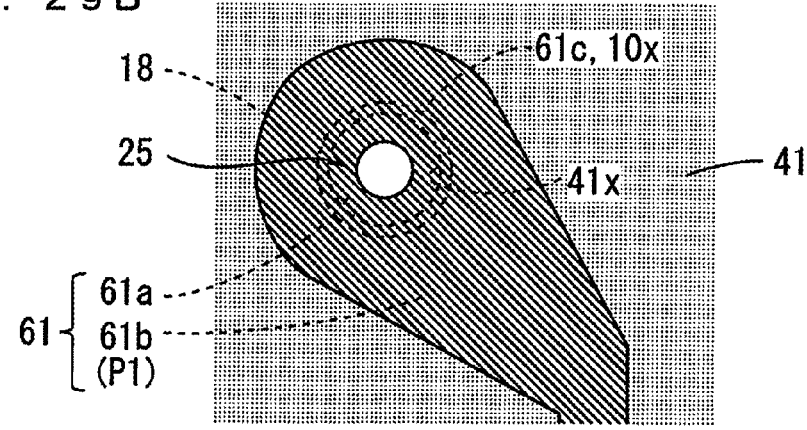
Figure 29C:
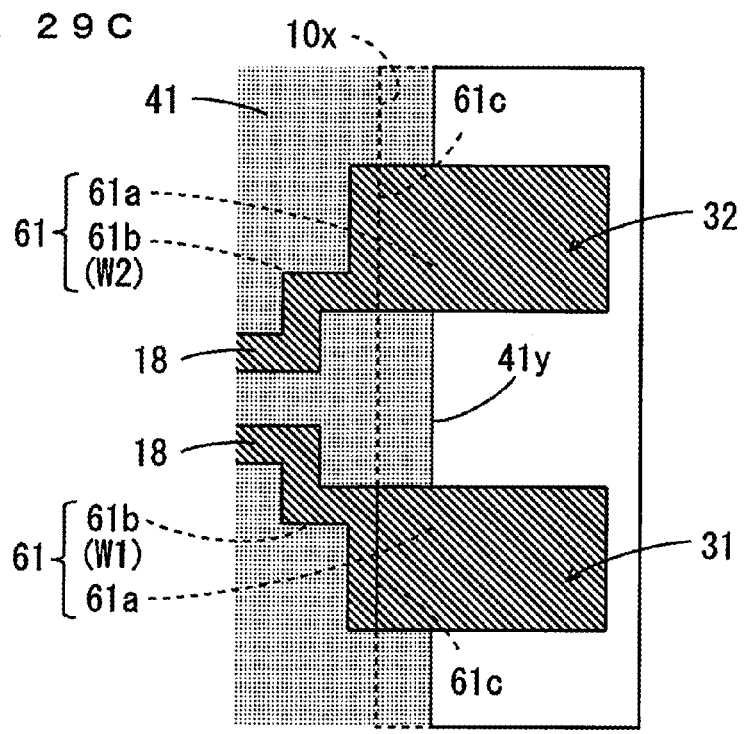

The plan views of FIGS. 29A to 29C respectively correspond to the plan views of FIGS. 22A to 22C. The enlarged cross sectional views of FIGS. 30A to 30C respectively correspond to the enlarged cross sectional views of FIGS. 23A to 23C.

Figure 30A:
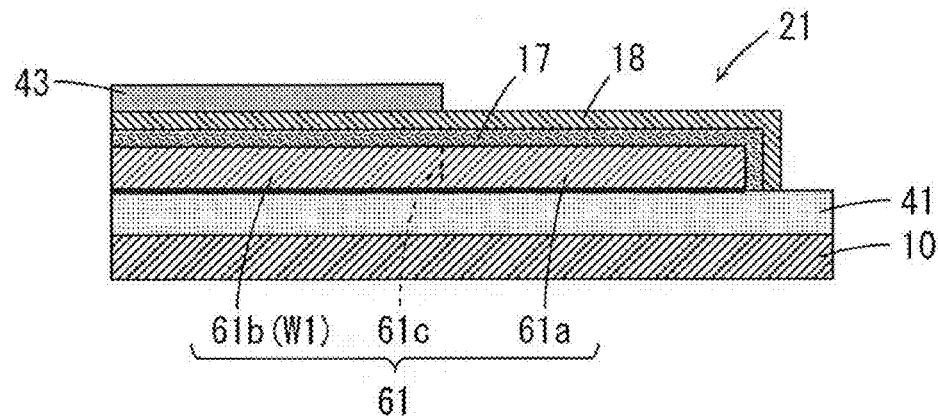
FIGS. 30A to 30C are diagrams showing an example where openings are formed in parts of the base insulating layer in the suspension board of FIG. 21.

As shown in each of FIGS. 29A and 30A, the configuration of the connection terminals 21 to 24 and their peripheral portions is the same as the configuration of the connection terminals 21 to 24 and their peripheral portions according to the fifth embodiment (see FIGS. 14A and 14B). As shown in each of FIGS. 29B and 30B, in the present example, a circular opening 41x corresponding to the boundary 61c of the conductor trace 61 is formed in a portion of the base insulating layer 41 overlapping with the terminal portion 61a. Further, as shown in each of FIGS. 29C and 30C, in the connection terminal 31 and its peripheral portions, an opening 41y is formed in a rectangular region of the base insulating layer 41 overlapping with the terminal portion 61a. The openings 41x, 41y of the base insulating layer 41 are formed before the step where the support layer 10a is processed and the support substrate 10 is formed after the step of FIGS. 28A to 28C, for example.

Figure 30B:
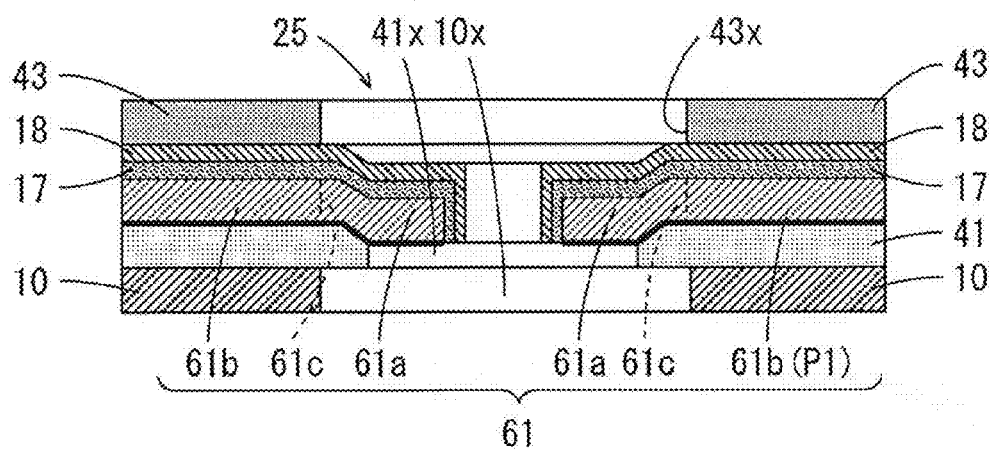
Figure 30C:
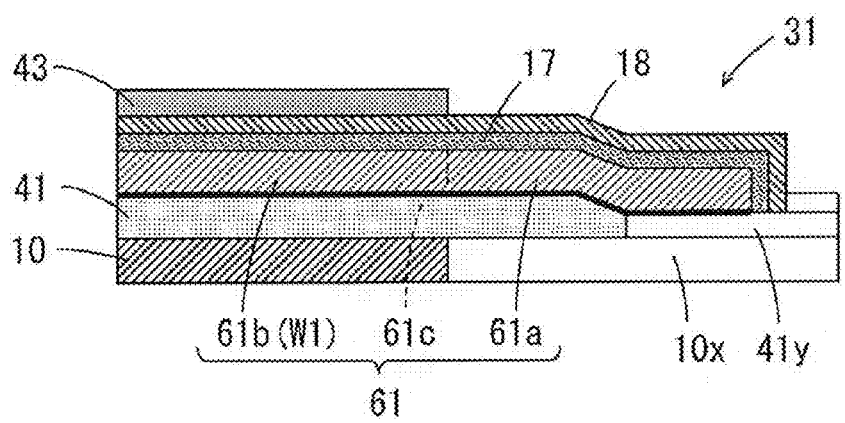

In each of FIGS. 30A to 30C, the seed layer formed on the base insulating layer 41 as an underlayer of the conductor trace 61 is indicated by one or two thick solid lines. In this case, as shown in each of FIGS. 30B and 30C, in each of the connection terminals 25, 26, 31 to 36, the seed layer formed on the lower surface of the conductor trace 61 is exposed downward through each of the openings 41x, 41y of the base insulating layer 41 and each of the openings 10x, 10y of the support substrate 10. Thus, a terminal of an electronic appliance or the like can be connected to each exposed portion.

Figure 31A:
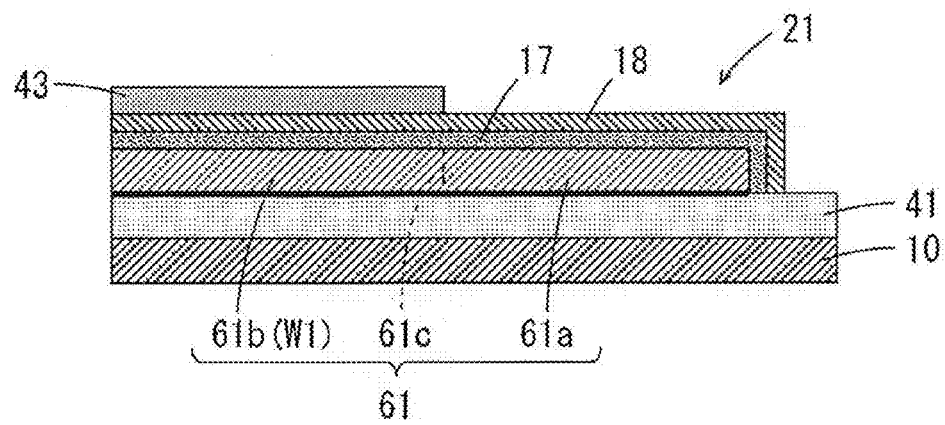
FIGS. 31A to 31C are diagrams showing a state where portions of an exposed seed layer are removed in the suspension board of FIGS. 30A to 30C.
Figure 31B:
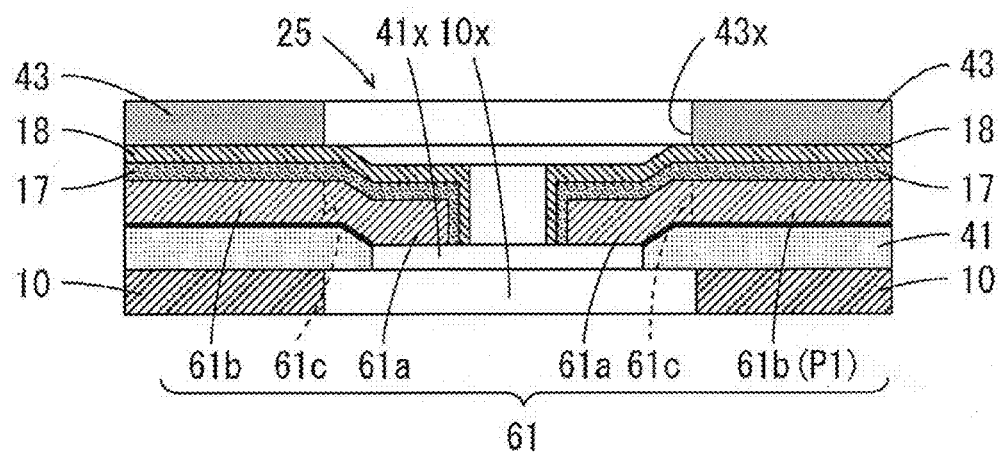
Figure 31C:
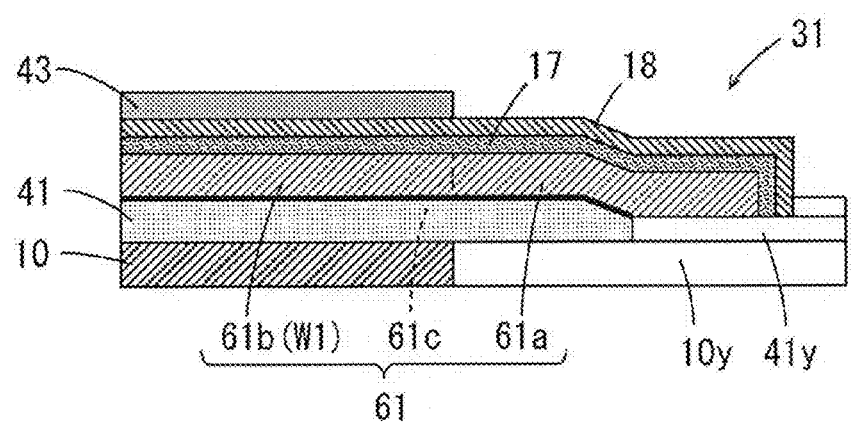

In the configuration of FIGS. 30A to 30C, each portion of the seed layer exposed downward may be removed. FIGS. 31A to 31C are diagrams showing a state where each exposed portion of the seed layer in the suspension board of FIGS. 30A to 30C is removed. FIGS. 31A to 31C respectively correspond to the enlarged cross sectional views of FIGS. 30A to 30C. As shown in FIGS. 31B and 31C, in the present example, the lower surface of the conductor trace 61 is exposed downward through the openings 41x, 41y of the base insulating layer 41 and the openings 10x, 10y of the support substrate 10. Thus, a terminal of an electronic appliance or the like can be connected to each exposed portion. Portions of the seed layer positioned in the openings 41x, 41y of the base insulating layer 41 can be removed after the formation of the openings 41x, 41y of the base insulating layer 41, for example.

(8) While the suspension board according to the above-mentioned embodiment has the configuration that the base insulating layer 41, the conductor trace 61 and the cover insulating layer 43 are basically laminated on the support substrate 10 in this order, the present invention is not limited to this. A plurality of base insulating layers 41 and a plurality of conductor traces 61 may be alternately laminated on the support substrate 10. An example of the configuration of the plurality of vertically stacked conductor traces 61 and the plurality of connection terminals corresponding to the plurality of conductor traces 61 will be described.

Figure 32A:
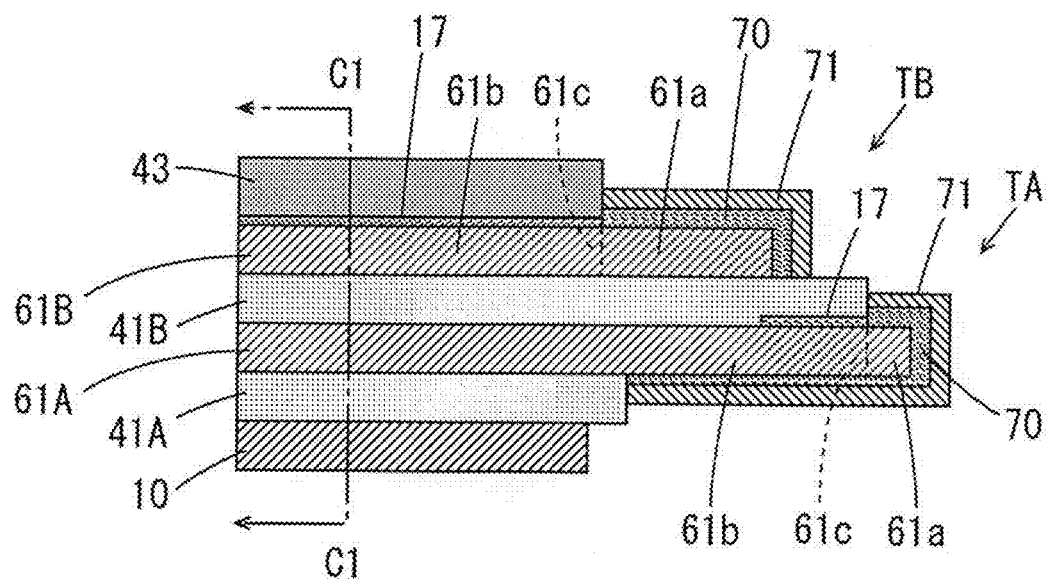
FIGS. 32A and 32B are cross sectional views showing an example of a first configuration of two vertically stacked conductor traces and two connection terminals corresponding to the conductor traces.
Figure 32B:
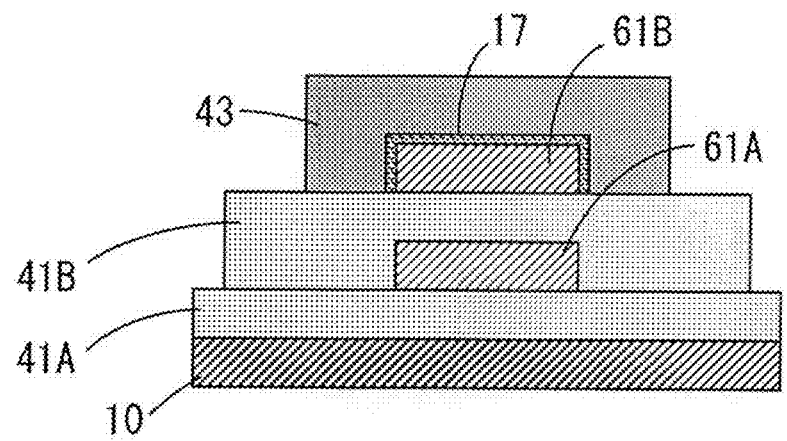

FIGS. 32A and 32B are cross sectional views showing an example of a first configuration of two vertically stacked conductor traces and two connection terminals corresponding to the conductor traces. In FIG. 32A, a longitudinal cross sectional view of two connection terminals and their peripheral members of the two conductor traces 61A, 61B is shown. In FIG. 32B, a longitudinal cross sectional view taken along the line C1-C1 of FIG. 32A is shown.

In the example of the first configuration of FIGS. 32A and 32B, an insulating layer 41A is formed on the support substrate 10. The conductor trace 61A made of copper is formed on the insulating layer 41A. The conductor trace 61A includes a terminal portion 61a and a wiring portion 61b. The terminal portion 61a and part of the wiring portion 61b of the conductor trace 61A project from the end of the insulating layer 41A.

The metal cover layer 17 made of nickel is formed to cover part of the wiring portion 61b of the conductor trace 61A. The metal cover layer 17 extends on an upper surface and both side surfaces of the conductor trace 61A to a position at a distance of 3 μm or more from the boundary 61c of the conductor trace 61A. The barrier layer 70 made of the same material as the metal cover layer 17 is formed to cover the terminal portion 61a of the conductor trace 61A. Further, the barrier layer 70 extends on a lower surface of the conductor trace 61A to a position at the end of the insulating layer 41A from the end of the conductor trace 61A. A ratio of a length of the entire metal cover layer 17 covering the wiring portion 61b to a total length of the wiring portion 61b of the conductor trace 61A is set to 40% or less. The length from the end of the conductor trace 61A to the end of the insulating layer 41A is extremely small as compared to the total length of the wiring portion 61b of the conductor trace 61A.

An insulating layer 41B is formed on the insulating layer 41A to cover the metal cover layer 17 and another portion of the wiring portion 61b of the conductor trace 61A not covered by the metal cover layer 17 and not to cover the barrier layer 70. A conductor trace 61B made of copper is formed on the insulating layer 41B. The conductor trace 61B includes a terminal portion 61a and a wiring portion 61b. Part of the conductor trace 61B overlaps with the conductor trace 61A. The metal cover layer 17 made of nickel is formed to cover the entire wiring portion 61b of the conductor trace 61B. The barrier layer 70 made of the same material as the metal cover layer 17 is formed to cover the terminal portion 61a of the conductor trace 61B. The cover insulating layer 43 is formed on the insulating layer 41B to overlap with the wiring portion 61b of the conductor trace 61B and cover the metal cover layer 17.

The gold layer 71 is formed to cover the barrier layer 70 provided on the conductor trace 61A positioned below. Thus, a connection terminal TA having flying structure is formed. The gold layer 71 is formed to cover the barrier layer 70 provided on the conductor trace 61B positioned above. Thus, a connection terminal TB is formed.

As described above, the ratio of the length of the entire metal cover layer 17 covering the wiring portion 61b to the total length of the wiring portion 61b of the conductor trace 61A positioned below is set to 40% or less. Thus, in the wiring portion 61b of the conductor trace 61A, a transmission loss of an electrical signal in a high frequency band can be reduced similarly to the fourth embodiment. Therefore, the wiring portion 61b of the conductor trace 61A can be effectively used as a transmission line for a high-frequency signal.

Further, in the above-mentioned configuration, the metal cover layer 17 and the barrier layer 70 are made of the same nickel, and the metal cover layer 17 and the barrier layer 70 are integrally formed. The barrier layer 70 functions as part of the metal cover layer 17. The boundary 61c and its vicinity of each of the conductor trace 61A, 61B are continuously covered by the metal cover layer 17 and the barrier layer 70. Thus, entry of fluid such as air, water or a chemical liquid to the inside of the metal cover layer 17 and the barrier layer 70 from outside of the cover insulating layer 43 is prevented. Therefore, an occurrence of corrosion at the boundary 61c and its vicinity of each of the conductor traces 61A, 61B is prevented.

Because the metal cover layer 17 made of nickel is formed to cover the entire wiring portion 61b of the conductor trace 61B positioned above, adhesion between the conductor trace 61B and the cover insulating layer 43 is improved. The wiring portion 61b of the conductor trace 61B is preferably used as a transmission line for a low-frequency signal, a grounding conductor layer or a shield layer, for example.

In the example of the first configuration of each of FIGS. 32A and 32B, the metal cover layer 17 may be formed between the terminal portion 61a of each of the conductor traces 61A, 61B and each barrier layer 70 similarly to the example of FIGS. 18A and 18B.

Figure 33A:
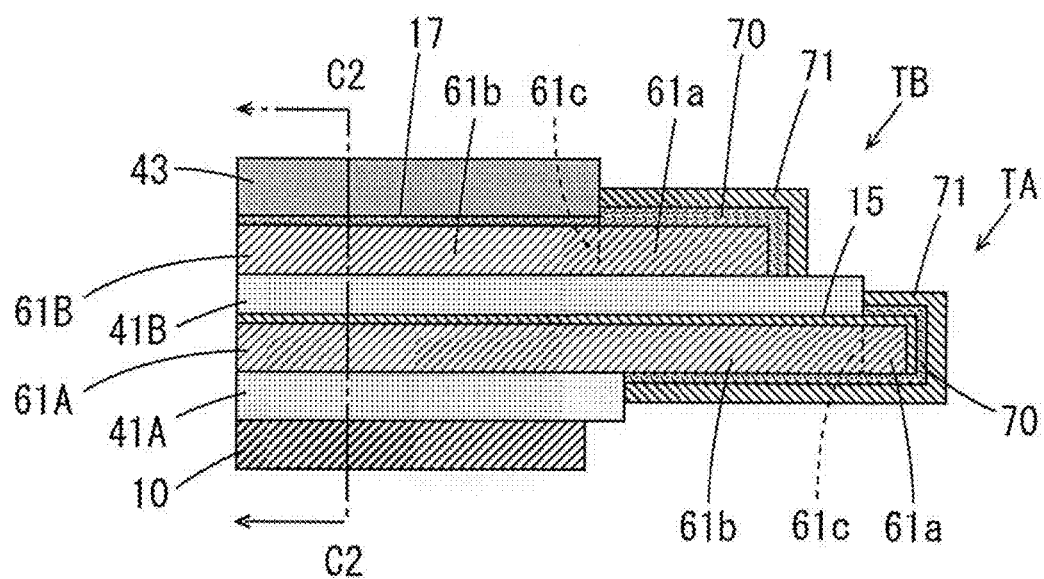
FIGS. 33A and 33B are cross sectional views showing an example of a second configuration of the two vertically stacked conductor traces and the two connection terminals corresponding to the conductor traces.
Figure 33B:
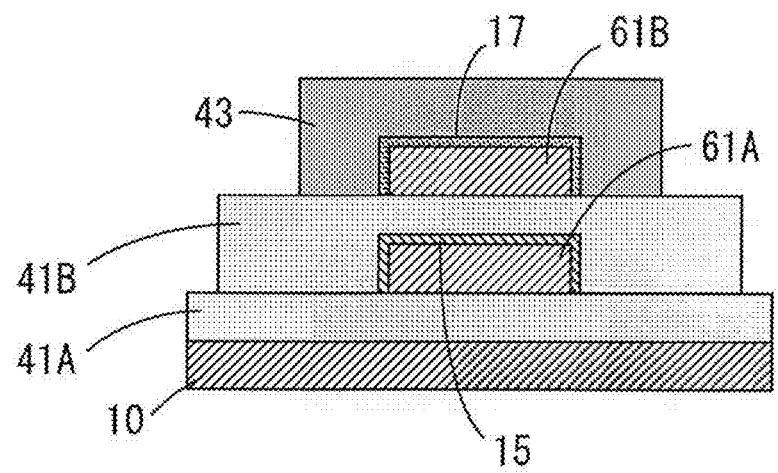

FIGS. 33A and 33B are cross sectional views showing an example of a second configuration of two vertically stacked conductor traces and two connection terminals corresponding to the conductor traces. In FIG. 33A, the two connection terminals of the two conductor traces 61A, 61B and their peripheral members are shown. In FIG. 33B, a longitudinal cross sectional view taken along the line C2-C2 of FIG. 33A is shown. As for the example of the second configuration, differences from the example of the first configuration of FIGS. 32A and 32B will be described below.

In the example of the second configuration of FIGS. 33A and 33B, the metal cover layer 15 is formed to cover the entire wiring portion 61b and the terminal portion 61a of the conductor trace 61A. The metal cover layer 15 is mainly made of metal having the magnetism lower than the magnetism of nickel (non-magnetic metal, for example), and has the magnetism lower than the magnetism of nickel. In the present example, gold or silver is used as a material for the metal cover layer 15. The barrier layer 70 made of nickel is formed to cover a portion of the metal cover layer 15 covering the terminal portion 61a. Further, the barrier layer 70 extends on the lower surface of the conductor trace 61A to a position at the end of the insulating layer 41A from the end of the conductor trace 61A.

The insulating layer 41B is formed on the insulating layer 41A to cover a portion of the metal cover layer 15 covering the wiring portion 61b of the conductor trace 61A and not to cover another portion of the metal cover layer 15 covering the terminal portion 61a of the conductor trace 61A. The conductor trace 61B made of copper is formed on the insulating layer 41B. Similarly to the example of the first configuration of FIGS. 32A and 32B, the metal cover layer 17 and the barrier layer 70 made of nickel are formed on the conductor trace 61B.

The gold layer 71 is formed to cover the barrier layer 70 provided at the conductor trace 61A positioned below. Thus, the connection terminal TA having the flying structure is formed. The gold layer 71 is formed to cover the barrier layer 70 provided on the conductor trace 61B positioned above. Thus, the connection terminal TB is formed.

In the above-mentioned configuration, a metal layer having the magnetism as high as or higher than the magnetism of nickel is not present between the wiring portion 61b of the conductor trace 61A positioned below and the insulating layer 41B. Thus, in the wiring portion 61b of the conductor trace 61A, a transmission loss of an electrical signal in a high frequency band can be reduced similarly to the first embodiment. Therefore, the wiring portion 61b of the conductor trace 61A can be effectively used as a transmission line for a high-frequency signal. Further, because the boundary 61c and its vicinity of the conductor trace 61A are continuously covered by the metal cover layer 15, entry of fluid such as air, water or a chemical liquid to the inside of the metal cover layer 15 from outside of the cover insulating layer 43 is prevented. Therefore, an occurrence of corrosion at the boundary 61c and its vicinity of the conductor trace 61A is prevented.

Because the metal cover layer 17 made of nickel is formed to cover the entire wiring portion 61b of the conductor trace 61B positioned above, adhesion between the conductor trace 61B and the cover insulating layer 43 is improved. The wiring portion 61b of the conductor trace 61B is preferably used as a transmission line for a low-frequency signal, a grounding conductor layer or a shield layer, for example.

In the example of the second configuration of FIGS. 33A and 33B, the metal cover layer 15 may be formed to cover not the entire conductor trace 61A but the terminal portion 61a and part of the wiring portion 61b of the conductor trace 61A similarly to the example of the second embodiment of FIGS. 10A and 10B. Further, similarly to FIGS. 18A and 18B, the metal cover layer 17 may be formed between the terminal portion 61a of the conductor trace 61B and the barrier layer 70.

Figure 34A:
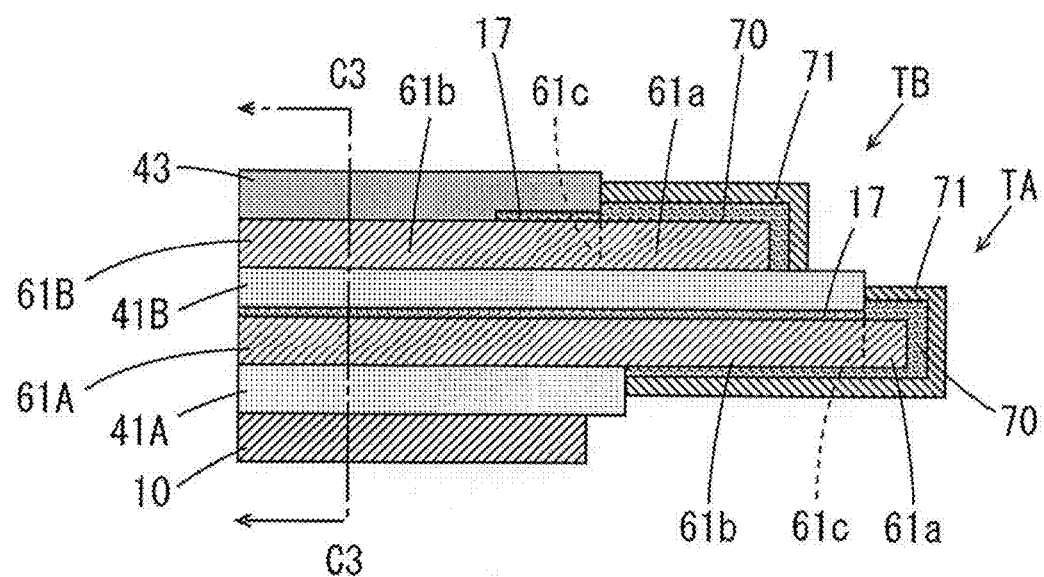
FIGS. 34A and 34B are cross sectional views showing an example of a third configuration of the two vertically stacked conductor traces and the two connection terminals corresponding to the conductor traces.
Figure 34B:
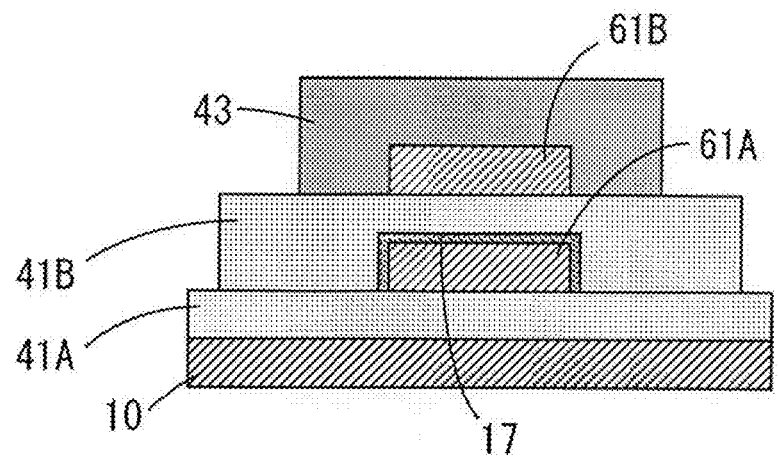

FIGS. 34A and 34B are cross sectional views showing an example of a third configuration of two vertically stacked conductor traces and two connection terminals corresponding to the conductor traces. In FIG. 34A, the two connection terminals of the two conductor traces 61A, 61B and their peripheral members are shown. In FIG. 34B, a longitudinal cross sectional view taken along the line C3-C3 of FIG. 34A is shown. As for the example of the third configuration, differences from the example of the first configuration of FIGS. 32A and 32B will be described below.

In the example of the third configuration of FIGS. 34A and 34B, the metal cover layer 17 made of nickel is formed to cover the entire wiring portion 61b of the conductor trace 61A. The barrier layer 70 made of nickel is formed to cover the terminal portion 61a of the conductor trace 61A. The barrier layer 70 extends on the lower surface of the conductor trace 61A from the end of the conductor trace 61A to the end of the insulating layer 41A.

The insulating layer 41B is formed on the insulating layer 41A to overlap with the wiring portion 61b of the conductor trace 61A and cover the metal cover layer 17. The conductor trace 61B made of copper is formed on the insulating layer 41B. The metal cover layer 17 made of nickel is formed to cover part of the wiring portion 61b of the conductor trace 61B. The metal cover layer 17 extends to a position at a distance of 3 μm or more from the boundary 61c of the conductor trace 61B. The barrier layer 70 made of the same material as the metal cover layer 17 is formed to cover the terminal portion 61a of the conductor trace 61B. A ratio of the length of the entire metal cover layer 17 covering the wiring portion 61b to the total length of the wiring portion 61b of the conductor trace 61B is set to 40% or less.

The gold layer 71 is formed to cover the barrier layer 70 provided on the conductor trace 61A positioned below. Thus, the connection terminal TA having the flying structure is formed. The gold layer 71 is formed to cover the barrier layer 70 provided on the conductor trace 61B positioned above. Thus, the connection terminal TB is formed.

As described above, the ratio of the length of the entire metal cover layer 17 covering the wiring portion 61b to the total length of the wiring portion 61b of the conductor trace 61B positioned above is set to 40% or less. Thus, in the wiring portion 61b of the conductor trace 61B, a transmission loss of an electrical signal in a high frequency band can be reduced similarly to the fourth embodiment. Therefore, the wiring portion 61b of the conductor trace 61B can be effectively used as a transmission line for a high-frequency signal.

Further, in the above-mentioned configuration, the metal cover layer 17 and the barrier layer 70 are made of the same nickel, and the metal cover layer 17 and the barrier layer 70 are integrally formed. The barrier layer 70 functions as part of the metal cover layer 17. The boundary 61c and its vicinity of each of the conductor traces 61A, 61B are continuously covered by the metal cover layer 17 and the barrier layer 70. Thus, entry of fluid such as air, water or a chemical liquid to the inside of the metal cover layer 17 and the barrier layer 70 from outside of the cover insulating layer 43 is prevented. Therefore, an occurrence of corrosion at the boundary 61c and its vicinity of each of the conductor traces 61A, 61B is prevented.

Because the metal cover layer 17 made of nickel is formed to cover the entire wiring portion 61b of the conductor trace 61A positioned below, adhesion between the conductor trace 61A and the insulating layer 41B is improved. The wiring portion 61b of the conductor trace 61A is preferably used as a transmission line for a low-frequency signal, a grounding conductor layer or a shield layer, for example.

In the example of the third configuration of FIGS. 34A and 34B, the metal cover layer 17 may be formed between the terminal portion 61a of each of the conductor traces 61A, 61B and the barrier layer 70 similarly to the example of FIGS. 18A and 18B.

Figure 35A:
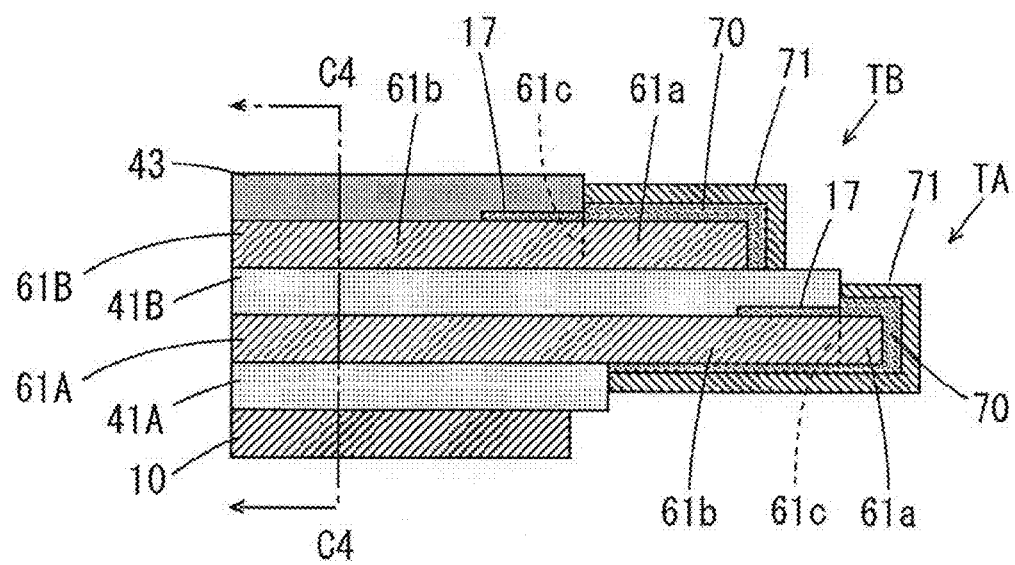
FIGS. 35A and 35B are cross sectional views showing an example of a fourth configuration of the two vertically stacked conductor traces and the two connection terminals corresponding to the conductor traces.
Figure 35B:
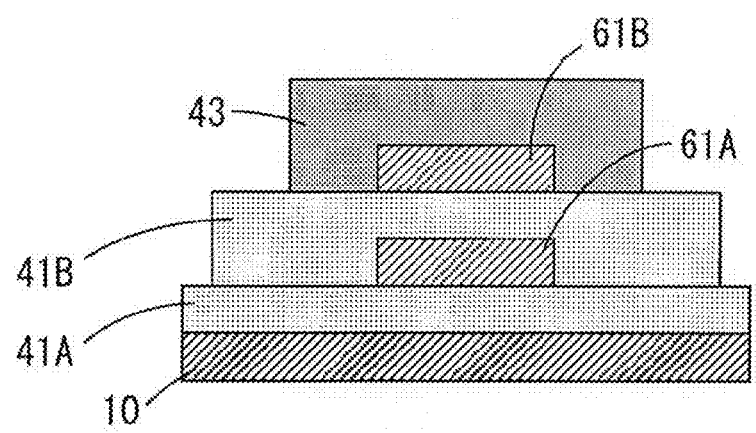

FIGS. 35A and 35B are cross sectional views showing an example of a fourth configuration of two vertically stacked conductor traces and two connection terminals corresponding to the conductor traces. In FIG. 35A, a longitudinal cross sectional view of the two connection terminals of the two conductor traces 61A, 61B and their peripheral members is shown. In FIG. 35B, a longitudinal cross sectional view taken along the line C4-C4 of FIG. 35A is shown. As for the example of the fourth configuration, differences from the example of the first configuration of FIGS. 32A and 32B will be described below.

In the example of the fourth configuration of FIGS. 35A and 35B, the metal cover layer 17 made of nickel is formed to cover part of the wiring portion 61b of the conductor trace 61A positioned below similarly to the example of the first configuration of FIGS. 32A and 32B. A ratio of the length of the entire metal over layer 17 covering the wiring portion 61b to the total length of the wiring portion 61b of the conductor trace 61A is set to 40% or less.

Further, in the example of the fourth configuration of FIGS. 35A and 35B, the metal cover layer 17 made of nickel is formed to cover part of the wiring portion 61b of the conductor trace 61B positioned above similarly to the example of the third configuration of FIGS. 34A and 34B. A ratio of the length of the entire metal cover layer 17 covering the wiring portion 61b to the total length of the wiring portion 61b of the conductor trace 61B is set to 40% or less.

From the above, in the wiring portion 61b of each of the conductor traces 61A, 61B, a transmission loss of an electrical signal in a high frequency band can be reduced similarly to the fourth embodiment. Therefore, the wiring portion 61b of each of the conductor traces 61A, 61B can be effectively used as a transmission line for a high-frequency signal.

In the example of the fourth configuration of FIGS. 35A and 35B, the metal cover layer 17 may be formed between the terminal portion 61a of each of the conductor traces 61A, 61B and the barrier layer 70 similarly to the example of FIGS. 18A and 18B.

Figure 36A:
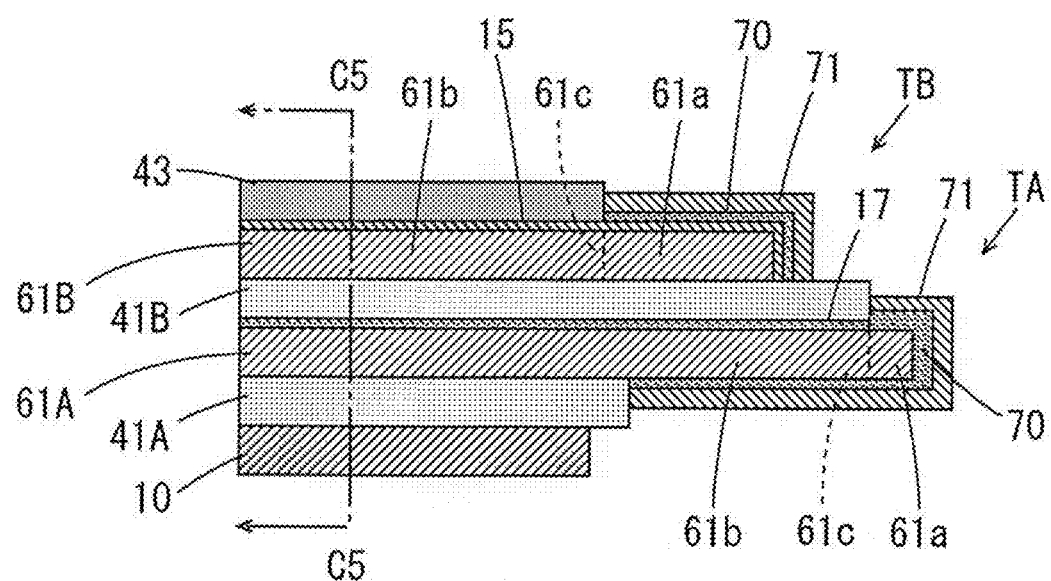
FIGS. 36A and 36B are cross sectional views showing an example of a fifth configuration of the two vertically stacked conductor traces and the two connection terminals corresponding to the conductor traces.
Figure 36B:
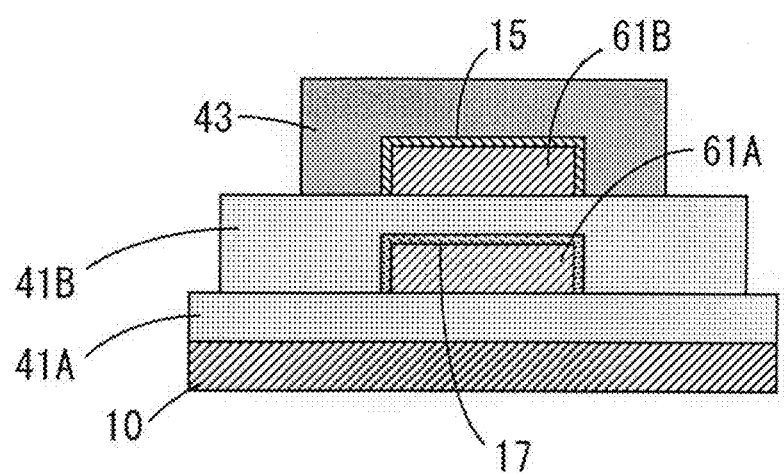

FIGS. 36A and 36B are cross sectional views showing an example of a fifth configuration of two vertically stacked conductor traces and two connection terminals corresponding to the conductor traces. In FIG. 36A, a longitudinal cross sectional view of the two connection terminals of the two conductor traces 61A, 61B and their peripheral members are shown. In FIG. 36B, a longitudinal cross sectional view taken along the line C5-C5 of FIG. 36A is shown. As for the example of the fifth configuration, differences from the example of the third configuration of FIGS. 34A and 34B will be described below.

In the example of the fifth configuration of FIGS. 36A and 36B, the metal cover layer 17 made of nickel is formed to cover the entire wiring portion 61b of the conductor trace 61A positioned below similarly to the example of the third configuration of FIGS. 34A and 34B.

On the one hand, as for the conductor trace 61B positioned above, the metal cover layer 15 is formed to cover the entire wiring portion 61b and the terminal portion 61a. The metal cover layer 15 is mainly made of metal having the magnetism lower than the magnetism of nickel (non-magnetic metal, for example), and has the magnetism lower than the magnetism of nickel. In the present example, gold or silver is used as the material for the metal cover layer 15.

The cover insulating layer 43 is formed on the insulating layer 41B to cover a portion of the metal cover layer 15 covering the wiring portion 61b of the conductor trace 61B and not to cover another portion of the metal cover layer 15 covering the terminal portion 61a. The barrier layer 70 made of nickel is formed to cover the portion of the metal cover layer 15 covering the terminal portion 61a. The gold layer 71 is formed to cover the barrier layer 70. Thus, the connection terminal TB is formed.

In the above-mentioned configuration, a metal layer having the magnetism as high as or higher than the magnetism of nickel is not present between the wiring portion 61b of the conductor trace 61B positioned above and the cover insulating layer 43. Thus, in the wiring portion 61b of the conductor trace 61B, a transmission loss of an electrical signal in a high frequency band can be reduced similarly to the first embodiment. Therefore, the wiring portion 61b of the conductor trace 61B can be effectively used as a transmission line for a high-frequency signal. Further, because the boundary 61c and its vicinity of the conductor trace 61B are continuously covered by the metal cover layer 15, entry of fluid such as air, water, a chemical liquid to the inside of the metal cover layer 15 from outside of the cover insulating layer 43 is prevented. Therefore, an occurrence of corrosion at the boundary 61c and its vicinity of the conductor trace 61B is prevented.

In the example of the fifth configuration of FIGS. 36A and 36B, the metal cover layer 15 may be formed not to cover the entire conductor trace 61B but the terminal portion 61a and part of the wiring portion 61b of the conductor trace 61B similarly to the example of the second embodiment of FIGS. 10A and 10B. Further, similarly to the example of FIGS. 18A and 18B, the metal cover layer 17 may be formed between the terminal portion 61a of the conductor trace 61A and the barrier layer 70.

Figure 37A:
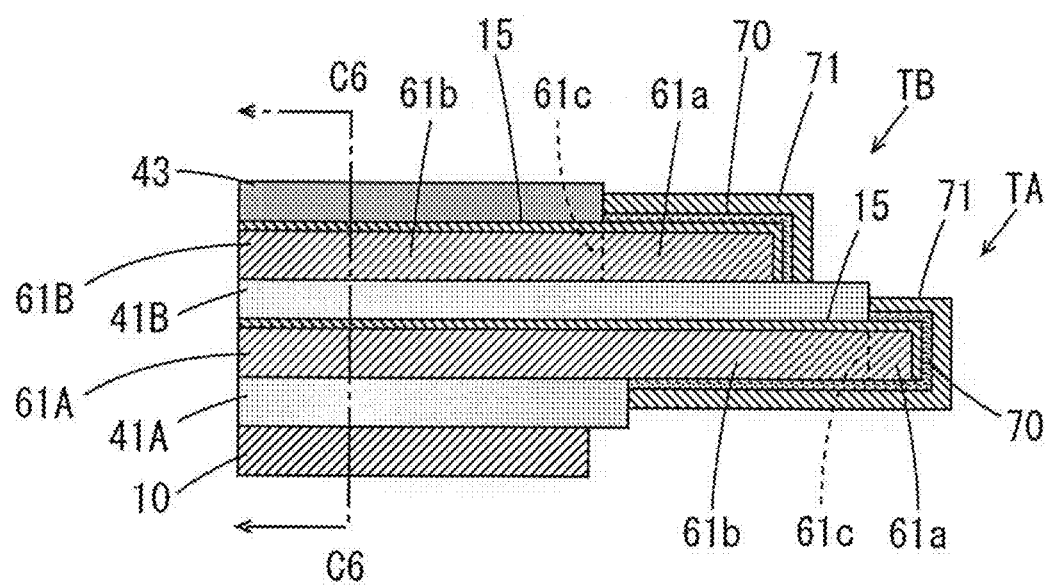
FIGS. 37A and 37B are cross sectional views showing an example of a sixth configuration of the two vertically stacked conductor traces and the two connection terminals corresponding to the conductor traces.
Figure 37B:
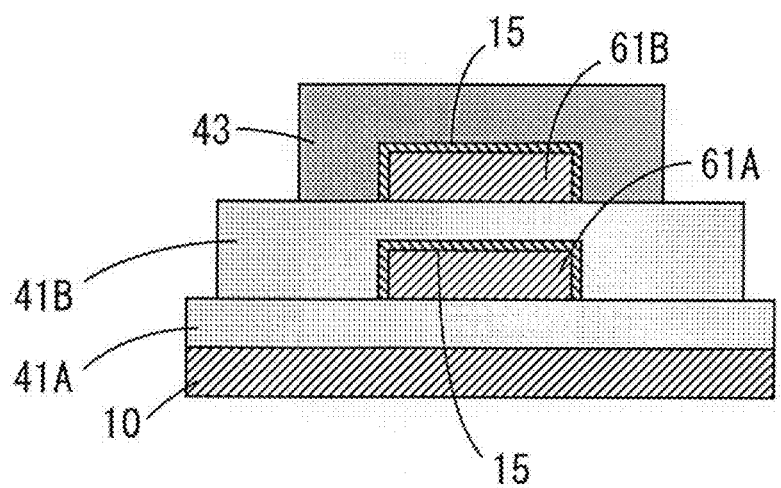

FIGS. 37A and 37B are cross sectional views showing an example of a sixth configuration of two vertically stacked conductor traces and two connection terminals corresponding to the two conductor traces. In FIG. 37A, a longitudinal cross sectional view of the two connection terminals of the two conductor traces 61A, 61B and their peripheral members is shown. In FIG. 37B, a longitudinal cross sectional view taken along the line C6-C6 of FIG. 37A is shown. As for the example of the sixth configuration, differences from the example of the second configuration of FIGS. 33A and 33B will be described below.

In the example of the sixth configuration of FIGS. 37A and 37B, the metal cover layer 15 is formed to cover the entire wiring portion 61b and the terminal portion 61a of the conductor trace 61A positioned below similarly to the example of the second configuration of FIGS. 33A and 33B. As described above, the metal cover layer 15 has the magnetism lower than the magnetism of nickel.

Further, in the example of the sixth configuration of FIGS. 37A and 37B, the metal cover layer 15 is formed to cover the entire wiring portion 61b and the terminal portion 61a of the conductor trace 61B positioned above similarly to the example of the fifth configuration of FIGS. 36A and 36B.

From the above, in the wiring portion 61b of each of the conductor traces 61A, 61B, a transmission loss of an electrical signal in a high frequency band can be reduced similarly to the first embodiment. Therefore, the wiring portion 61b of each of the conductor traces 61A, 61B can be effectively used as a transmission line for a high-frequency signal. Further, because the boundary 61c and its vicinity of each of the conductor traces 61A, 61B are continuously covered by the metal cover layer 15, an occurrence of corrosion at the boundary 61c and its vicinity of each of the conductor traces 61A, 61B is prevented.

In the example of the sixth configuration of FIGS. 37A and 37B, the metal cover layer 15 may be formed not to cover the entire conductor trace 61A but the terminal portion 61a and part of the wiring portion 61b of the conductor trace 61A similarly to the example of the second embodiment of FIGS. 10A and 10B. Further, the metal cover layer 15 may be formed not to cover the entire conductor trace 61B but the terminal portion 61a and part of the wiring portion 61b of the conductor trace 61B.

(9) While the printed circuit board is the suspension board 1 including the support substrate 10 in the above-mentioned embodiment, the present invention is not limited to this. The printed circuit board may be a flexible printed circuit board that does not include the support substrate 10, for example.

(10) While the metal cover layers 15, 17 are formed by electrolytic plating, electroless plating and sputtering, for example, in the above-mentioned embodiment, the present invention is not limited to this. The metal cover layers 15, 17 may be formed using another method such as a semi-additive method or a subtractive method.

While the metal cover layers 16, 18 are formed by electrolytic plating in the above-mentioned embodiment, the present invention is not limited to this. The metal cover layers 16, 18 may be formed using another method such as electroless plating, sputtering, a semi-additive method or a subtractive method.

(11) In the first embodiment, similarly to the third embodiment, the metal cover layer 16 of FIGS. 11A and 11B may be formed on the portion of the metal cover layer 15 covering the terminal portion 61a of the conductor trace 61. Further, in the fourth embodiment, similarly to the third embodiment, the metal cover layer 16 of FIGS. 11A and 11B may be formed on the portion of the metal cover layer 17 covering the terminal portion 61a of the conductor trace 61. Further, in the fifth embodiment, similarly to the third embodiment, the metal cover layer 16 of FIGS. 11A and 11B may be formed on the portion of the metal cover layer 18 covering the terminal portion 61a of the conductor trace 61. In these cases, the surface conditions of the connection terminals 21 to 26, 31 to 36 are smoothed.

(12) In the first to third embodiments, similarly to the fifth embodiment, the metal cover layer 18 of FIGS. 14A and 14B may be formed to cover the entire metal cover layer 15. In this case, as the material for the metal cover layer 18, the metal having the magnetism lower than the magnetism of nickel is used.

(13) While the metal cover layer 17 is formed to extend from the both ends of the wiring portion 61b of each of the plurality of conductor traces 61 in the fourth embodiment, the present invention is not limited to the above-mentioned example. If the ratio of the length of the metal cover layer 17 covering the wiring portion 61b to the total length of the wiring portion 61b is 40% or less, part of the metal cover layer 17 may be formed separately from portions of the metal cover layer 17 positioned at the both ends of the wiring portion 61b. For example, part of the metal cover layer 17 may be formed at the center of the wiring portion 61b.

(14) While the suspension board according to each of the above-mentioned first to fifth embodiments basically has the configuration in which the base insulating layer 41, the conductor trace 61 and the cover insulating layer 43 are laminated on the metallic support substrate 10 in this order, the present invention is not limited to this. The suspension board may further include another insulating layer and another conductor trace provided between the support substrate 10 and the base insulating layer 41 in addition to the above-mentioned configuration (see the examples of the first to sixth configurations of FIGS. 32A to 37B.) The suspension board basically has the configuration in which the other insulating layer, the other conductor trace, the base insulating layer 41, the conductor trace 61 and the cover insulating layer 43 are laminated on the metallic support substrate 10 in this order. In this case, similarly to the above-mentioned embodiment, any of the metal cover layers 15, 17, 18 may also be formed to cover at least part of a wiring portion and a terminal portion of the other conductor trace. Further, the base insulating layer 41 may be formed on the other insulating layer such that the wiring portion of the other conductor trace is covered. Thus, the effects similar to the above-mentioned embodiment can be also acquired for the other conductor trace.

[7] Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the base insulating layer 41 and the insulating layers 41A, 41B are examples of a first insulating layer, the conductor traces 61, 61A, 61B are examples of a conductor trace, the terminal portion 61a is an example of a terminal portion, the wiring portion 61b is an example of a wiring portion, the metal cover layers 15, 17, 18 and the barrier layer 70 made of the same material as the metal cover layer 17 are examples of a first metal cover layer, the cover insulating layer 43 and the insulating layer 41B are examples of a second insulating layer, the metal cover layer 16 is an example of a second metal cover layer, the metal cover layer 17 is an example of a first metal layer, the metal cover layer 18 is an example of a second metal layer, and the suspension board 1 is an example of a printed circuit board.

Further, the barrier layer 70 is an example of a terminal barrier layer, the gold layer 71 is an example of a terminal surface layer, the conductor trace 61B is an example of an upper conductor trace, the terminal portion 61a of the conductor trace 61B is an example of an upper terminal portion, the wiring portion 61b of the conductor trace 61B is an example of an upper wiring portion, the metal cover layers 15, 17 and the barrier layer 70 made of the same material as the metal cover layer 17 are examples of an upper metal cover layer, the cover insulating layer 43 is an example of a third insulating layer, the insulating layer 41A is an example of a lower insulating layer, and the conductor trace 61A is an example of a lower conductor trace.

As each of constituent elements recited in the claims, various other elements having configurations or functions described in the claims can be also used.

[8] Inventive Examples and Comparative Examples

The inventors of the present application produced a suspension board having the same configuration as the suspension board 1 according to the first embodiment (see FIGS. 1 and 5A to 5B) as an inventive example 1, and produced suspension boards having the same configuration as the suspension board according to the second embodiment (see FIGS. 10A and 10B) as inventive examples 2, 3, 4, 5. In the inventive examples 2, 3, 4, 5, the distances L1 of FIG. 10B were respectively set to 3 µm, 5 µm, 10 µm and 50 µm.

Further, the inventors of the present application produced a suspension board having the same configuration as the suspension board according to the third embodiment (see FIGS. 11A and 11B) as an inventive example 6. In the inventive example 6, the distance L1 of FIG. 11B was set to 5 µm.

Further, the inventors of the present application produced suspension boards having the same configuration as the suspension board according to the fifth embodiment (see FIGS. 14A and 14B) as inventive examples 7, 8, 9, 10, 11, 12. In the inventive examples 7, 8, 9, 10, 11, 12, the distances L2 of FIG. 14B were respectively set to 5 µm, 10 µm, 50 µm, 950 µm, 3800 µm, and 7600 µm.

Further, in the inventive examples 7 to 12, the total length of each of the four wiring portions 61b that constitute each of the write wiring traces W1, W2, the read wiring traces R1, R2 was set to 38 mm. A ratio of the length of a portion covered by the metal cover layer 17 to the total length of the wiring portion 61b is referred to as a ferromagnetism cover layer occupation ratio. In this case, as for the write wiring traces W1, W2 and the read wiring traces R1, R2, the ferromagnetism cover layer occupation ratios of the inventive examples 7, 8, 9, 10, 11, 12 are respectively 0.03%, 0.05%, 0.26%, 5%, 20% and 40%. On the one hand, the ferromagnetism cover layer occupation ratios for the inventive examples 1 to 6 are all 0%.

Further, the inventors of the present application produced a suspension board basically having the same configuration as the suspension board according to the second embodiment except for the setting value of the distance L1 of FIG. 10B as a comparative example 1. In the suspension board of the comparative example 1, the distance L1 of FIG. 10B was set to 1 µm.

Figure 38A:
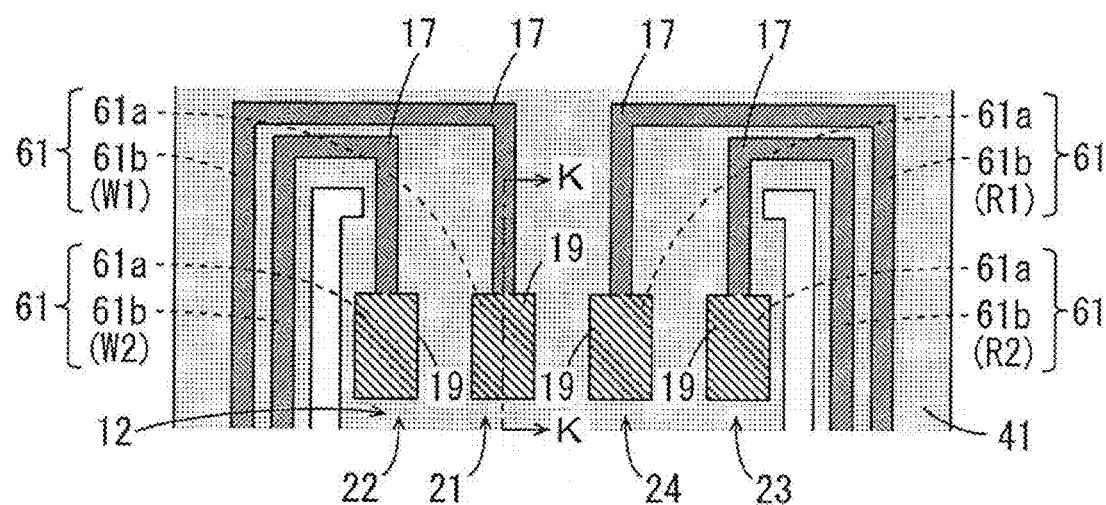
FIGS. 38A and 38B are a plan view and a cross sectional view showing part of a suspension board of a comparative example 2.
Figure 38B:
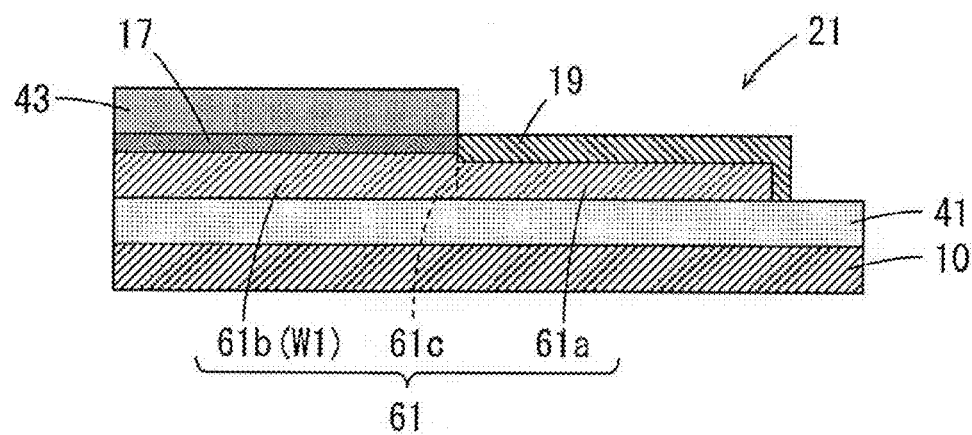

Further, the inventors of the present application produced a suspension board having the following configuration as a comparative example 2. FIGS. 38A and 38B are a plan view and a cross sectional view showing part of the suspension board of the comparative example 2. In FIGS. 38A and 38B, a plan view and a cross sectional view are respectively shown. The plan view of the FIG. 38A corresponds to the plan view of FIG. 3A of the first embodiment. The cross sectional view of FIG. 38B shows an enlarged cross sectional view taken along the line K-K of FIG. 38A, and corresponds to the cross sectional view of FIG. 5A of the first embodiment.

Also in the suspension board of the comparative example 2, similarly to the first embodiment, the base insulating layer 41 is formed on the support substrate 10, and the plurality of conductor traces 61 are formed on the base insulating layer 41. The cover insulating layer 43 is formed on the base insulating layer 41 to cover the wiring portions 61b of the plurality of conductor traces 61 (see FIG. 4A). In FIG. 38A, the cover insulating layer 43 is not shown.

As shown in each of FIGS. 38A and 38B, the metal cover layer 17 is formed to cover the entire wiring portion 61b and not to cover the terminal portion 61a of each conductor trace 61. The metal cover layer 19 is formed to cover the terminal portion 61a. In this manner, in the suspension board of the comparative example 2, each of the metal cover layers 17, 19 is not formed to continuously extend from the surface of the terminal portion 61a to the surface of the wiring portion 61*b*. A boundary between the metal cover layer 17 and the metal cover layer 19 is positioned to overlap with the boundary 61*c* between the terminal portion 61*a* and the wiring portion 61*b* of the conductor trace 61. In the comparative example 2, because the metal cover layer 17 covers the entire wiring portion 61*b*, the ferromagnetism cover layer occupation ratio is 100%.

In the suspension boards of the above-mentioned inventive examples 1 to 12 and the comparative examples 1, 2, a stainless steel was used as the material for the support substrate 10, polyimide was used as the material for the base insulating layer 41 and the cover insulating layer 43, and copper was used as the material for the conductor traces 61. Further, gold was used as the material for the metal cover layers 15 of the inventive examples 1 to 6 and the comparative example 1, the metal cover layer 16 of the inventive example 6, and the metal cover layers 18 of the inventive examples 7 to 12. Further, nickel was used as the material for the metal cover layers 17 of the inventive examples 7 to 12 and the comparative example 2, and gold was used as the material for the metal cover layer 19 of the comparative example 2.

The inventors of the present invention measured a parameter SDD21 indicating transmission characteristics when an electrical signal is transmitted by the write wiring traces W1, W2 in order to perform evaluation of the electrical characteristics for the inventive examples 1 to 12 and the comparative examples 1, 2. The parameter SDD21 indicates an amount of attenuation in a differential mode input and a differential mode output.

Figure 39:
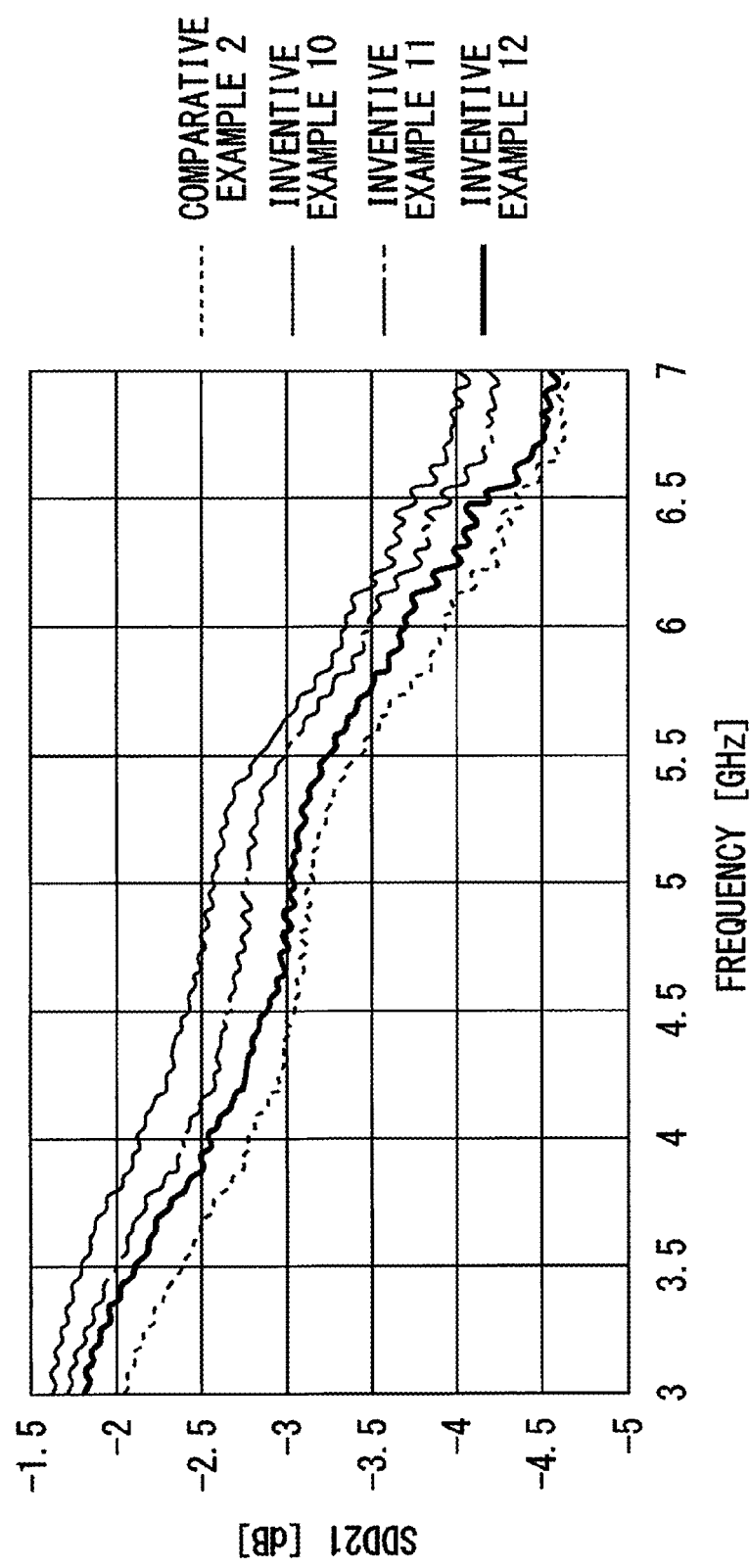
FIG. 39 is a diagram showing results of measurement of a parameter SDD21 for inventive examples 10, 11, 12 and a comparative example 2.

FIG. 39 is a diagram showing results of measurement of the parameter SDD21 for the inventive examples 10, 11, 12 and the comparative example 2. In FIG. 39, the ordinate indicates the parameter SDD21 [dB], and the abscissa indicates a frequency [GHz] of an electrical signal. Further, in FIG. 39, results of measurement for the inventive examples 10, 11, 12 are respectively indicated by a solid line, a one-dot and dash line, and a thick solid line, and a result of measurement for the comparative example 2 is indicated by a dotted line.

According to the results of measurement of FIG. 39, even in the case where a signal having a frequency of 4.5 GHz or more is transmitted, the parameter SDD21 (an amount of attenuation) is kept at −3 dB or more (50%) in the suspension boards of the inventive examples 10, 11, 12. That is, it is found that an amount of attenuation in a high frequency band is small. On the one hand, in the case where a signal having a frequency of 4.5 GHz or more was transmitted, the parameter SDD21 (an amount of attenuation) was lower than −3 dB (50%) in the suspension board of the comparative example 2. That is, it is found that an amount of attenuation in a high frequency band is large.

As a result of the above-mentioned measurement for the inventive examples 1 to 12 and the comparative example 1, in the case where a signal having a frequency of 4.5 GHz or more was transmitted in any suspension board, it was found that the parameter SDD21 was kept at −3 dB or more. That is, it was found that a transmission loss of an electrical signal in a high frequency band was reduced. On the one hand, as for the comparative example 2, in the case where a signal having a frequency of 4.5 GHz or more was transmitted, it was found that the parameter SDD21 was lower than −3 dB. That is, it was found that a transmission loss of an electrical signal in a high frequency band was increased.

In each of the suspension boards of the inventive examples 1 to 12 and the comparative example 1, the ferromagnetism cover layer occupation ratio is 40% or less.

Therefore, it was found that a transmission loss of an electrical signal was reduced by absence of nickel between the wiring portion 61*b* and the cover insulating layer 43 in a range of the length of at least 60% or more of the total length of the wiring portion 61*b*.

Further, as a result of the above-mentioned measurement, as for each of the inventive examples 1 to 11 and the comparative example 1, in the case where a signal having a frequency of 5 GHz or more was transmitted in any suspension board, it was found that the parameter SDD21 was kept at −3 dB or more. That is, it was found that a transmission loss of an electrical signal in a high frequency band was reduced more sufficiently. Therefore, the ferromagnetism cover layer occupation ratio is preferably set to 20% or less.

As for each of the inventive examples 1 to 12 and the comparative examples 1, 2, the inventors of the present application performed evaluation of the adhesion between the cover insulating layer 43 and the wiring portion 61*b* of the conductor trace 61. Specifically, the inventors of the present application confirmed whether a large void was generated between the end of the cover insulating layer 43 and the conductor trace 61 in the vicinity of the boundary 61*c* between the terminal portion 61*a* and the wiring portion 61*b* of the conductor trace 61.

As a result, as for each of the inventive examples 1 to 12 and the comparative example 2, a large void was not generated between the end of the cover insulating layer 43 and the wiring portion 61*b*. On the one hand, as for the comparative example 1, a large void was generated between the end of the cover insulating layer 43 and the conductor trace 61. As a result, it was found that adhesion between the cover insulating layer 43 and the wiring portion 61*b* was improved by formation of any one of the metal cover layers 15, 17, 18 extending to a position at a distance of 3 μm or more from the position over the boundary 61*c* of the conductor trace 61 on the wiring portion 61*b*.

As for each of the inventive examples 1 to 12 and the comparative examples 1, 2, the inventors of the present invention confirmed presence and absence of corrosion at the boundary 61*c* between the terminal portion 61*a* and the wiring portion 61*b* of each conductor trace 61, and its vicinity.

As a result, as for each of the inventive examples 1 to 12, corrosion did not occur at the conductor trace 61. On the one hand, as for each of the comparative examples 1, 2, corrosion occurred at the conductor trace 61. In the suspension board of the comparative example 1, it is considered that fluid such as air, water or a chemical liquid has entered the inside of the cover insulating layer 43 through the void formed between the cover insulating layer 43 and the conductor trace 61. On the one hand, in the suspension board of the comparative example 2, it is considered that fluid such as air, water or a chemical liquid has entered the inside of the metal cover layers 17, 19 through the boundary between the metal cover layers 17, 19.

As a result, it was found that an occurrence of corrosion at the conductor trace 61 could be prevented by formation of any of the metal cover layers 15, 17, 18 covering the wiring portion 61*b* extending to a distance of 3 μm or more from the position over the boundary 61*c* and formation of any of metal cover layer 15, 17, 18 continuously extending from the surface of the terminal portion 61*a* to the surface of the wiring portion 61*b*.

In the following Table 1, results of evaluation of the electrical characteristics, results of evaluation of adhesion and results of confirmation of absence and presence of corrosion are shown. In Table 1, the length of each of the metal cover layers 15, 17, 18 covering one end portion of the wiring portion 61b (the distances from the boundary 61c) is shown together with each result of evaluation. Further, it is shown whether each of the metal cover layers 15, 17, 18 that comes into contact with the cover insulating layer 43 continuously extends from the surface of the terminal portion 61a to the surface of the wiring portion 61b. Further, in Table 1, the ferromagnetism cover layer occupation ratios are shown.

In the results of evaluation of the electrical characteristics of Table 1, each suspension board in which a frequency was 5.0 GHz or more in the case where the parameter SDD21 indicated −3 dB (50%) was indicated by "⊚". Further, the suspension board in which a frequency was not more than 4.5 GHz and less than 5.0 GHz in the case where the parameter SDD21 indicated −3 dB (50%) was indicated by "○", and the suspension board in which a frequency was less than 4.5 GHz in the case where the parameter SDD21 indicated −3 dB (50%) was indicated by "X".

In the results of evaluation of adhesion of the cover insulating layer 43 of Table 1, each suspension board in which a large void was not generated between the cover insulating layer 43 and the conductor trace 61 was indicated by "○", and the suspension board in which a large void was generated was indicated by "X".

In the result of evaluation of credibility of the conductor traces 61 of Table 1, each suspension board in which corrosion did not occur at the conductor trace 61 was indicated by "○", and each suspension board in which corrosion occurred was indicated by "X".

INDUSTRIAL APPLICABILITY

The present invention can be effectively utilized for various types of printed circuit boards.

We claim:
1. A printed circuit board comprising:
   a first insulating layer;
   a conductor trace that is formed on the first insulating layer and has a terminal portion and a wiring portion extending from the terminal portion;
   a first metal cover layer provided to cover the terminal portion and part of the wiring portion and continuously extend from a surface of the terminal portion to a surface of the wiring portion; and
   a second insulating layer provided on the first insulating layer to cover a portion of the first metal cover layer covering the part of the wiring portion and another portion of the wiring portion not covered by the first metal cover layer, and not to cover a portion of the first metal cover layer covering the terminal portion, wherein
   the first metal cover layer comes into contact with the part of the wiring portion and extends on the surface of the wiring portion to a position at a distance of 3 μm or more from a position over a boundary between the terminal portion and the wiring portion,
   the second insulating layer comes into contact with the portion of the first metal cover layer covering the wiring portion, and comes into contact with the other portion of the wiring portion,

TABLE 1

|  | Length of Metal Cover Layer (Distance from Boundary) [μm] | Continuity | Ferromagnetism Cover Layer Occupation Ratio [%] | Electrical Characteristics | Adhesion Characteristics | Presence/Absence of Corrosion |
|---|---|---|---|---|---|---|
| Inventive Example 1 | (Entire Length) | Continuous | 0 | ⊚ | ○ | ○ |
| Inventive Example 2 | 3 | Continuous | 0 | ⊚ | ○ | ○ |
| Inventive Example 3 | 5 | Continuous | 0 | ⊚ | ○ | ○ |
| Inventive Example 4 | 10 | Continuous | 0 | ⊚ | ○ | ○ |
| Inventive Example 5 | 50 | Continuous | 0 | ⊚ | ○ | ○ |
| Inventive Example 6 | 5 | Continuous | 0 | ⊚ | ○ | ○ |
| Inventive Example 7 | 5 | Continuous | 0.03 | ⊚ | ○ | ○ |
| Inventive Example 8 | 10 | Continuous | 0.05 | ⊚ | ○ | ○ |
| Inventive Example 9 | 50 | Continuous | 0.26 | ⊚ | ○ | ○ |
| Inventive Example 10 | 950 | Continuous | 5 | ⊚ | ○ | ○ |
| Inventive Example 11 | 3800 | Continuous | 20 | ⊚ | ○ | ○ |
| Inventive Example 12 | 7600 | Continuous | 40 | ○ | ○ | ○ |
| Comparative Example 1 | 1 | Continuous | 0 | ⊚ | X | X |
| Comparative Example 2 | (Entire Length) | Discontinuous | 100 | X | ○ | X | a ratio of a length of the first metal cover layer covering the part of the wiring portion to a total length of the wiring portion is 40% or less, and the first metal cover layer is made of a metal having a magnetism that is as high as or higher than the magnetism of nickel.

2. The printed circuit board according to claim 1, wherein the first metal cover layer extends on the surface of the wiring portion to a position at a distance of 5 μm or more from the position over the boundary between the terminal portion and the wiring portion.

3. The printed circuit board according to claim 1, wherein the first metal cover layer includes nickel.

4. The printed circuit board according to claim 1, further comprising a second metal cover layer covering the portion of the first metal cover layer covering the terminal portion.

5. The printed circuit board according to claim 1, wherein at least part of the first metal cover layer is constituted by first and second metal layers laminated on each other.

6. The printed circuit board according to claim 1, further comprising:
   a terminal barrier layer that covers the portion of the first metal cover layer covering the terminal portion; and
   a terminal surface layer that covers the terminal barrier layer, wherein
   the conductor trace includes copper,
   the terminal surface layer includes gold, and
   the terminal barrier layer includes nickel or palladium.

7. The printed circuit board according to claim 1, further comprising a terminal surface layer formed to cover the portion of the first metal cover layer covering the terminal portion and not to come into contact with the conductor trace, wherein
   the conductor trace includes copper,
   the terminal surface layer includes gold, and
   the first metal cover layer includes nickel.

8. The printed circuit board according to claim 1, further comprising an upper conductor trace formed on the second insulating layer, wherein
   at least part of the upper conductor trace overlaps with the conductor trace.

9. The printed circuit board according to claim 1, further comprising:
   an upper conductor trace that is formed on the second insulating layer and has an upper terminal portion and an upper wiring portion extending from the upper terminal portion;
   an upper metal cover layer provided to cover the upper terminal portion and part of the upper wiring portion, and continuously extend from a surface of the upper terminal portion to a surface of the upper wiring portion; and
   a third insulating layer provided on the second insulating layer to cover a portion of the upper metal cover layer covering the part of the upper wiring portion and another portion of the upper wiring portion not covered by the upper metal cover layer, and not to cover a portion of the upper metal cover layer covering the upper terminal portion, wherein
   at least part of the upper conductor trace overlaps with the conductor trace,
   the upper metal cover layer comes into contact with the part of the upper wiring portion, and extends on the surface of the upper wiring portion to a position at a distance of 3 μm or more from a position over a boundary between the upper terminal portion and the upper wiring portion,
   the third insulating layer comes into contact with the portion of the upper metal cover layer covering the upper wiring portion, and comes into contact with the other portion of the upper wiring portion, and
   a ratio of a length of the upper metal cover layer covering the part of the upper wiring portion to a total length of the upper wiring portion is 40% or less.

10. The printed circuit board according to claim 1, further comprising:
    a lower insulating layer: and
    a lower conductor trace formed on the lower insulating layer, wherein
    the first insulating layer is formed on the lower insulating layer to cover at least part of the lower conductor trace, and
    at least part of the conductor trace overlaps with the lower conductor trace.

11. A method of manufacturing a printed circuit board including the steps of:
    forming a conductor trace having a terminal portion and a wiring portion extending from the terminal portion on a first insulating layer;
    forming a metal cover layer to cover the terminal portion and part of the wiring portion, continuously extend from a surface of the terminal portion to a surface of the wiring portion, and come into contact with the part of the wiring portion;
    forming a second insulating layer on the first insulating layer to cover a portion of the metal cover layer covering the part of the wiring portion and another portion of the wiring portion not covered by the metal cover layer, not to cover a portion of the metal cover layer covering the terminal portion, to come into contact with the portion of the metal cover layer covering the wiring portion, and to come into contact with the other portion of the wiring portion, wherein
    the metal cover layer is formed on the surface of the wiring portion to extend to a position at a distance of 3 μm or more from a position over a boundary between the terminal portion and the wiring portion in the step of forming the metal cover layer,
    a ratio of a length of the metal cover layer covering the part of the wiring portion to a total length of the wiring portion is set to 40% or less, and
    the first metal cover layer is made of metal having a magnetism that is as high as or higher than the magnetism of nickel.

* * * * *